United States Patent
Igarashi et al.

(10) Patent No.: US 8,337,999 B2
(45) Date of Patent: Dec. 25, 2012

(54) ORGANIC ELECTROLUMINESCENT DEVICE INCLUDING AT LEAST ONE LAYER CONTAINING AN INDOLE DERIVATIVE

(75) Inventors: Tatsuya Igarashi, Ashigarakami-gun (JP); Kazunari Yagi, Ashigarakami-gun (JP)

(73) Assignee: UDC Ireland Limited, Dublin (IE)

(*) Notice: Subject to any disclaimer, the term of this patent is extended or adjusted under 35 U.S.C. 154(b) by 390 days.

(21) Appl. No.: 12/516,259

(22) PCT Filed: Nov. 27, 2007

(86) PCT No.: PCT/JP2007/073274
§ 371 (c)(1),
(2), (4) Date: May 26, 2009

(87) PCT Pub. No.: WO2008/066192
PCT Pub. Date: Jun. 5, 2008

(65) Prior Publication Data
US 2010/0026174 A1    Feb. 4, 2010

(30) Foreign Application Priority Data
Nov. 27, 2006 (JP) .................................. 2006-318771

(51) Int. Cl.
*H01L 51/54* (2006.01)
*C09K 11/06* (2006.01)

(52) U.S. Cl. ......................... 428/690; 428/917; 313/504

(58) Field of Classification Search ........................ None
See application file for complete search history.

(56) References Cited

U.S. PATENT DOCUMENTS

| | | | |
|---|---|---|---|
| 2002/0117662 A1* | 8/2002 | Nii .................................. | 257/40 |
| 2003/0180573 A1 | 9/2003 | Conley | |
| 2004/0013903 A1 | 1/2004 | Lin | |
| 2004/0209116 A1* | 10/2004 | Ren et al. ....................... | 428/690 |
| 2005/0175859 A1 | 8/2005 | Lin | |
| 2006/0099451 A1* | 5/2006 | Igarashi ......................... | 428/690 |
| 2006/0105202 A1 | 5/2006 | Kitamura | |
| 2006/0145145 A1* | 7/2006 | Nishio ............................. | 257/40 |
| 2006/0182992 A1 | 8/2006 | Nii et al. | |
| 2009/0128008 A1 | 5/2009 | Ise et al. | |
| 2009/0174324 A1 | 7/2009 | Nii et al. | |
| 2011/0234090 A1 | 9/2011 | Ise et al. | |

FOREIGN PATENT DOCUMENTS

| | | |
|---|---|---|
| JP | 2001-247859 A | 9/2001 |
| JP | 2002-305084 A | 10/2002 |
| JP | 2003282271 A | 10/2003 |
| JP | 200447443 A | 2/2004 |
| JP | 2004-281296 A | 10/2004 |
| JP | 2004-311404 A | 11/2004 |
| JP | 2005-082701 A | 3/2005 |
| JP | 200554077 A | 3/2005 |
| JP | 200582644 A | 3/2005 |
| JP | 200589543 A | 4/2005 |
| JP | 2005113072 A | 4/2005 |
| JP | 2005310733 A | 11/2005 |
| JP | 2006256999 A | 9/2006 |
| WO | 2004-108857 A1 | 12/2004 |

OTHER PUBLICATIONS

Machine translation of JP2005-082701. Date of publication: Mar. 31, 2005.*
International Search Report for PCT/JP2007/073274, dated Feb. 13, 2008.

* cited by examiner

*Primary Examiner* — Lynda Salvatore
*Assistant Examiner* — Andrew K Bohaty
(74) *Attorney, Agent, or Firm* — Sughrue Mion, PLLC

(57) ABSTRACT

An organic electroluminescent device is provided and includes: a pair of electrodes; and at least one organic layer between the pair of electrodes, the at least one organic layer including a light-emitting layer. The at least one organic layer includes at least one layer containing an indole derivative represented by formula (1), and the light-emitting layer includes a platinum complex phosphorescent material having a tetradentate ligand.

Formula (1):

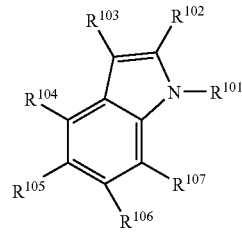

$R^{101}$, $R^{102}$, $R^{103}$, $R^{104}$, $R^{105}$, $R^{106}$ and $R^{107}$ each independently represents a hydrogen atom or a substituent, provided that $R^{102}$ and $R^{103}$ are not bonded to each other to form an aromatic condensed ring.

11 Claims, No Drawings

ORGANIC ELECTROLUMINESCENT DEVICE INCLUDING AT LEAST ONE LAYER CONTAINING AN INDOLE DERIVATIVE

TECHNICAL FIELD

The present invention relates to a light-emitting device capable of emitting light by converting electric energy into light, in particular, the invention relates to an organic electroluminescent device (a light-emitting device, or an EL device).

BACKGROUND ART

Organic electroluminescent devices are attracting public attention as promising display devices for capable of emitting light of high luminance with low voltage. An important characteristic of organic electroluminescent devices is consumed electric power. Consumed electric power is represented by: (Consumed electric power=Voltage×electric current), so that the lower the value of voltage that is necessary to obtain desired brightness and the smaller the value of electric current, the lower is the consumed electric power of the device.

As one trial to lower the value of electric current that flows to a device, a light-emitting device utilizing light from ortho-metalated iridium complex ($Ir(ppy)_3$: Tris-Ortho-Metalated Complex of Iridium(III) with 2-Phenylpyridine) is reported (e.g., refer to JP-A-2001-247859). The phosphorescent devices described therein are greatly improved in external quantum efficiency as compared with conventional singlet luminescent devices, and have succeeded in making the value of electric current smaller.

For the purpose of improving the efficiency and durability of a phosphorescent device, a device containing an indole derivative (JP-A-2002-305084) and a device containing a platinum complex (WO 04/108857) are reported. However, in view of durability and efficiency, an improvement is required of these techniques. In addition, a further betterment in tint variation by aging is desired.

DISCLOSURE OF THE INVENTION

An object of the invention is to provide a device showing good durability and efficiency, and little in tint variation by aging.

The above object has been achieved by the following means.

(1) An organic electroluminescent device comprising:
   a pair of electrodes; and
   at least one organic layer between the pair of electrodes, the at least one organic layer including a light-emitting layer,
   wherein the at least one organic layer includes at least one layer containing an indole derivative represented by formula (11), and the light-emitting layer includes a platinum complex phosphorescent material having a tetradentate ligand:

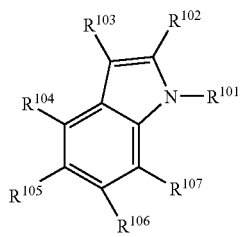

wherein $R^{101}$, $R^{102}$, $R^{103}$, $R^{104}$, $R^{105}$, $R^{106}$ and $R^{107}$ each independently represents a hydrogen atom or a substituent, provided that $R^{102}$ and $R^{103}$ are not bonded to each other to form an aromatic condensed ring.

(2) The organic electroluminescent device according to (1), wherein the indole derivative is a compound represented by formula (12):

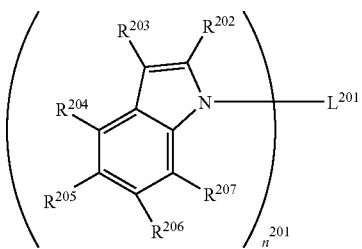

wherein $R^{202}$, $R^{203}$, $R^{204}$, $R^{205}$, $R^{206}$ and $R^{207}$ each independently represents a hydrogen atom or a substituent, provided that $R^{202}$ and $R^{203}$ are not bonded to each other to form an aromatic condensed ring; $L^{201}$ represents a linking group; and $n^{201}$ represents an integer of from 2 to 10.

(3) The organic electroluminescent device according to (2), wherein $L^{201}$ represents a linking group containing an aryl linking group; and $n^{201}$ represents an integer of from 2 to 10.

(4) The organic electroluminescent device according to (2) or (3), wherein $L^{201}$ represents an aryl linking group or a linking group including an aryl linking group and an alkyl linking group; and $n^{201}$ represents an integer of from 2 to 10.

(5) The organic electroluminescent device according to any one of (2) to (4), wherein $L^{201}$ represents an aryl linking group; and $n^{201}$ represents an integer of from 2 to 10.

(6) The organic electroluminescent device according to any one of (2) to (5), wherein $L^{201}$ represents a phenyl linking group; and $n^{201}$ represents an integer of from 2 to 10.

(7) The organic electroluminescent device according to any one of (1) to (6), wherein the platinum complex phosphorescent material is a compound represented by formula (2):

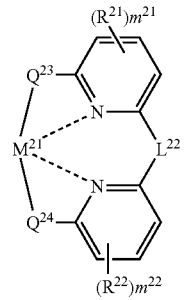

wherein $M^{21}$ represents a platinum ion; $Q^{23}$ and $Q^{24}$ each independently represents an atomic group to coordinate to $M^{21}$; $L^{22}$ represents a single bond or a linking group; $R^{21}$ and $R^{22}$ each independently represents a substituent; and $m^{21}$ and $m^{22}$ each independently represents an integer of from 0 to 3.

(8) The organic electroluminescent according to any one of (1) to (7), wherein the platinum complex phosphorescent material has a maximum emission wavelength of 500 nm or less.

(9) The organic electroluminescent device according to any one of (1) to (8), wherein the indole derivative represented by formula (11) or (12) is included the light-emitting layer.

(10) The organic electroluminescent device according to any one of (1) to (9), wherein the indole derivative represented by formula (11) or (12) is included in a layer contiguous to the light-emitting layer.

(11) The organic electroluminescent device according to any one of (1) to (10), wherein a layer contiguous to the light-emitting layer includes a carbazole derivative.

(12) The organic electroluminescent device according to any one of (1) to (11), wherein a layer contiguous to the light-emitting layer includes a metal complex.

A light-emitting device according to an aspect of the invention is capable of light emission of high efficiency, excellent in durability, and little in hue variation by aging.

BEST MODE FOR CARRYING OUT THE INVENTION

An aspect of the invention relates to an organic electroluminescent device comprising a pair of electrodes and at least an organic layer including a light-emitting layer, between the pair of electrodes. The at least one layer of the organic layers contains (a) an indole derivative represented by formula (11), and the light-emitting layer contains (b) a platinum complex phosphorescent material having a tetradentate ligand. By the intermolecular interaction of the platinum complex having a tetradentate ligand and the indole derivative represented by formula (11) in the same layer or at the interface of layers, a device capable of high efficiency luminescence, having excellent durability, and little in hue variation by aging can be obtained.

The compound represented by formula (11) will be explained below.

$R^{101}$ to $R^{107}$ each represents a hydrogen atom or a substituent, provided that $R^{102}$ and $R^{103}$ are not bonded to each other to form an aromatic condensed ring. (For example, $R^{102}$ and $R^{103}$ are not bonded to form a benzo condensed structure to form a carbazole ring.)

The examples of the substituents include an alkyl group (preferably having from 1 to 30 carbon atoms, more preferably from 1 to 20 carbon atoms, and especially preferably from 1 to 10 carbon atoms, e.g., methyl, ethyl, isopropyl, n-octyl, n-decyl, n-hexadecyl, cyclopropyl, cyclopentyl, cyclohexyl, etc., are exemplified), an alkenyl group (preferably having from 2 to 30 carbon atoms, more preferably from 2 to 20 carbon atoms, and especially preferably from 2 to 10 carbon atoms, e.g., vinyl, allyl, 2-butenyl, 3-pentenyl, etc., are exemplified), an alkynyl group (preferably having from 2 to 30 carbon atoms, more preferably from 2 to 20 carbon atoms, and especially preferably from 2 to 10 carbon atoms, e.g., propargyl, 3-pentynyl, etc., are exemplified), an aryl group (preferably having from 6 to 30 carbon atoms, more preferably from 6 to 20 carbon atoms, and especially preferably from 6 to 12 carbon atoms, e.g., phenyl, p-methylphenyl, naphthyl, anthranyl, etc., are exemplified), an amino group (preferably having from 0 to 30 carbon atoms, more preferably from 0 to 20 carbon atoms, and especially preferably from 0 to 10 carbon atoms, e.g., amino, methylamino, dimethylamino, diethylamino, dibenzylamino, diphenylamino, ditolylamino, etc., are exemplified), an alkoxyl group (preferably having from 1 to 30 carbon atoms, more preferably from 1 to 20 carbon atoms, and especially preferably from 1 to 10 carbon atoms, e.g., methoxy, ethoxy, butoxy, 2-ethylhexyloxy, etc., are exemplified), an aryloxy group (preferably having from 6 to 30 carbon atoms, more preferably from 6 to 20 carbon atoms, and especially preferably from 6 to 12 carbon atoms, e.g., phenyloxy, 1-naphthyloxy, 2-naphthyloxy, etc., are exemplified), a heterocyclic oxy group (preferably having from 1 to 30 carbon atoms, more preferably from 1 to 20 carbon atoms, and especially preferably from 1 to 12 carbon atoms, e.g., pyridyloxy, pyrazyloxy, pyrimidyloxy, quinolyloxy, etc., are exemplified), an acyl group (preferably having from 1 to 30 carbon atoms, more preferably from 1 to 20 carbon atoms, and especially preferably from 1 to 12 carbon atoms, e.g., acetyl, benzoyl, formyl, pivaloyl, etc., are exemplified), an alkoxy-carbonyl group (preferably having from 2 to 30 carbon atoms, more preferably from 2 to 20 carbon atoms, and especially preferably from 2 to 12 carbon atoms, e.g., methoxycarbonyl, ethoxycarbonyl, etc., are exemplified), an aryloxycarbonyl group (preferably having from 7 to 30 carbon atoms, more preferably from 7 to 20 carbon atoms, and especially preferably from 7 to 12 carbon atoms, e.g., phenyloxycarbonyl, etc., are exemplified), an acyloxy group (preferably having from 2 to 30 carbon atoms, more preferably from 2 to 20 carbon atoms, and especially preferably from 2 to 10 carbon atoms, e.g., acetoxy, benzoyloxy, etc., are exemplified), an acylamino group (preferably having from 2 to 30 carbon atoms, more preferably from 2 to 20 carbon atoms, and especially preferably from 2 to 10 carbon atoms, e.g., acetylamino, benzoylamino, etc., are exemplified), an alkoxycarbonylamino group (preferably having from 2 to 30 carbon atoms, more preferably from 2 to 20 carbon atoms, and especially preferably from 2 to 12 carbon atoms, e.g., methoxycarbonylamino, etc., are exemplified), an aryloxycarbonylamino group (preferably having from 7 to 30 carbon atoms, more preferably from 7 to 20 carbon atoms, and especially preferably from 7 to 12 carbon atoms, e.g., phenyloxycarbonylamino, etc., are exemplified), a sulfonylamino group (preferably having from 1 to 30 carbon atoms, more preferably from 1 to 20 carbon atoms, and especially preferably from 1 to 12 carbon atoms, e.g., methanesulfonyl-amino, benzenesulfonylamino, etc., are exemplified), a sulfamoyl group (preferably having from 0 to 30 carbon atoms, more preferably from 0 to 20 carbon atoms, and especially preferably from 0 to 12 carbon atoms, e.g., sulfamoyl, methyl-sulfamoyl, dimethylsulfamoyl, phenylsulfamoyl, etc., are exemplified), a carbamoyl group (preferably having from 1 to 30 carbon atoms, more preferably from 1 to 20 carbon atoms, and especially preferably from 1 to 12 carbon atoms, e.g., carbamoyl, methylcarbamoyl, diethylcarbamoyl, phenyl-carbamoyl, etc., are exemplified), an alkylthio group (preferably having from 1 to 30 carbon atoms, more preferably from 1 to 20 carbon atoms, and especially preferably from 1 to 12 carbon atoms, e.g., methylthio, ethylthio, etc., are exemplified), an arylthio group (preferably having from 6 to 30 carbon atoms, more preferably from 6 to 20 carbon atoms, and especially preferably from 6 to 12 carbon atoms, e.g., phenylthio, etc., are exemplified), a heterocyclic thio group (preferably having from 1 to 30 carbon atoms, more preferably from 1 to 20 carbon atoms, and especially preferably from 1 to 12 carbon atoms, e.g., pyridylthio, 2-benzimizolylthio, 2-benzoxazolylthio, 2-benzothiazolylthio, etc., are exemplified), a sulfonyl group (preferably having from 1 to 30 carbon atoms, more preferably from 1 to 20 carbon atoms, and especially preferably from 1 to 12 carbon atoms, e.g., mesyl, tosyl, etc., are exemplified), a sulfinyl group (preferably having from 1 to 30 carbon atoms, more preferably from 1 to 20 carbon atoms, and especially preferably from 1 to 12 carbon atoms, e.g., methanesulfinyl, benzenesulfinyl, etc., are exemplified), a ureido group (preferably having from 1 to 30 carbon atoms, more preferably from 1 to 20 carbon atoms, and especially preferably from 1 to 12 carbon atoms, e.g., ureido, methylureido, phenylureido, etc., are exemplified), a phosphoric amido group (preferably having from 1 to 30 carbon atoms, more preferably from 1 to 20 carbon atoms, and especially preferably from 1 to 12 carbon atoms, e.g., diethylphosphoric amido, phenylphosphoric amido, etc., are exemplified), a hydroxyl group, a mercapto group, a halogen atom (e.g., a fluorine atom, a chlorine atom, a bromine atom, an iodine atom), a cyano group, a sulfo group, a carboxyl group, a nitro group, a hydroxamic acid group, a sulfino group, a hydrazino group, an imino group, a heterocyclic group (preferably having from 1 to 30 carbon atoms, and more preferably from 1 to 20 carbon atoms, and as the hetero atoms, e.g., a nitrogen atom, an oxygen atom, a sulfur atom are exemplified, specifically, e.g., imidazolyl, pyridyl quinolyl, furyl, thienyl, piperidyl, morpholino, benzoxazolyl, benzimidazolyl, benzothiazolyl, carbazolyl, azepinyl, etc., are exemplified), a silyl group (preferably having from 3 to 40 carbon atoms, more preferably from 3 to 30 carbon atoms, and especially preferably from 3 to 24 carbon atoms, e.g., trimethylsilyl, triphenylsilyl, etc., are exemplified), and a silyloxy group (preferably having from 3 to 40 carbon atoms, more preferably from 3 to 30 carbon atoms, and especially preferably from 3 to 24 carbon atoms, e.g., trimethylsilyloxy, triphenylsilyloxy, etc., are exemplified). These substituents may further be substituted.

$R^{101}$ preferably represents an alkyl group, an aryl group, or a hetero aryl group, more preferably an alkyl group or an aryl group, and still more preferably an aryl group.

$R^{102}$ and $R^{103}$ each preferably represents a hydrogen atom, an alkyl group, an aryl group, or a hetero aryl group, more preferably a hydrogen atom, an alkyl group, or an aryl group, and still more preferably a hydrogen atom or an alkyl group.

$R^{104}$ to $R^{107}$ each preferably represents a hydrogen atom, an alkyl group, an aryl group, or a hetero aryl group, more preferably a hydrogen atom, an alkyl group, or an aryl group, still more preferably a hydrogen atom or an alkyl group, and especially preferably a hydrogen atom.

The compound represented by formula (11) is preferably the compound represented by formula (12).

The compound represented by formula (12) will be explained below. $R^{202}$ to $R^{207}$ have the same meanings as that of $R^{102}$ to $R^{107}$, and the preferred ranges are also the same.

$L^{201}$ represents a linking group. A As the linking groups, linking groups containing an atom selected from a carbon atom, a nitrogen atom, an oxygen atom, a sulfur atom, a silicon atom, and a phosphorus atom are preferred, an alkyl linking group (a linking group mainly including an alkyl group), an aryl linking group (a linking group mainly including aryl group), and a hetero aryl linking group (a linking group mainly including an hetero aryl group) are more preferred, an aryl linking group and a hetero aryl linking group are still more preferred, and an aryl linking group is especially preferred.

The linking group represented by $L^{201}$ may have a substituent. As the substituents, those exemplified as the substituents represented by $R^{101}$ to $R^{107}$ are applicable.

Specific examples of the linking group represented by $L^{201}$ are shown below. In the examples below, * indicates a portion to which the indole ring binds.

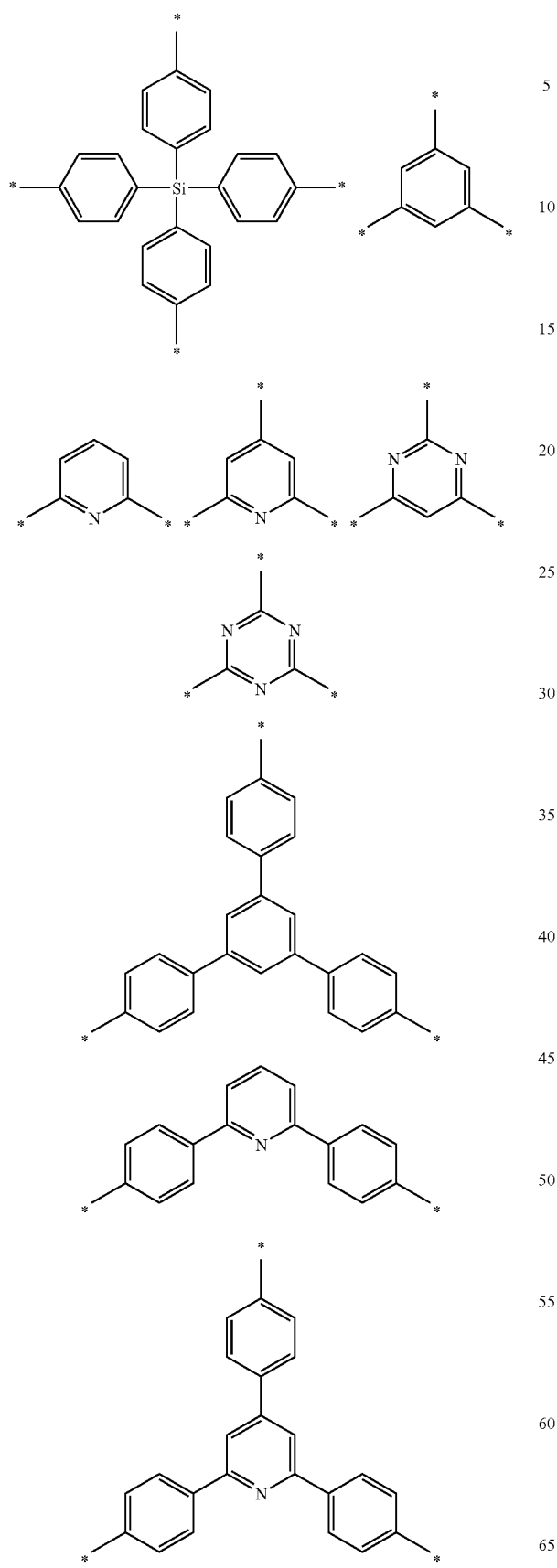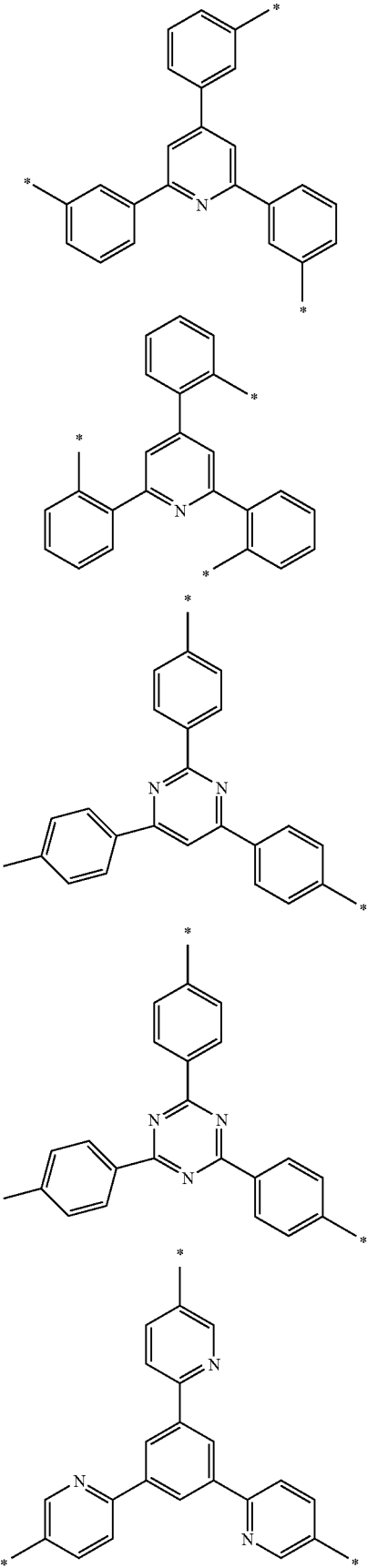

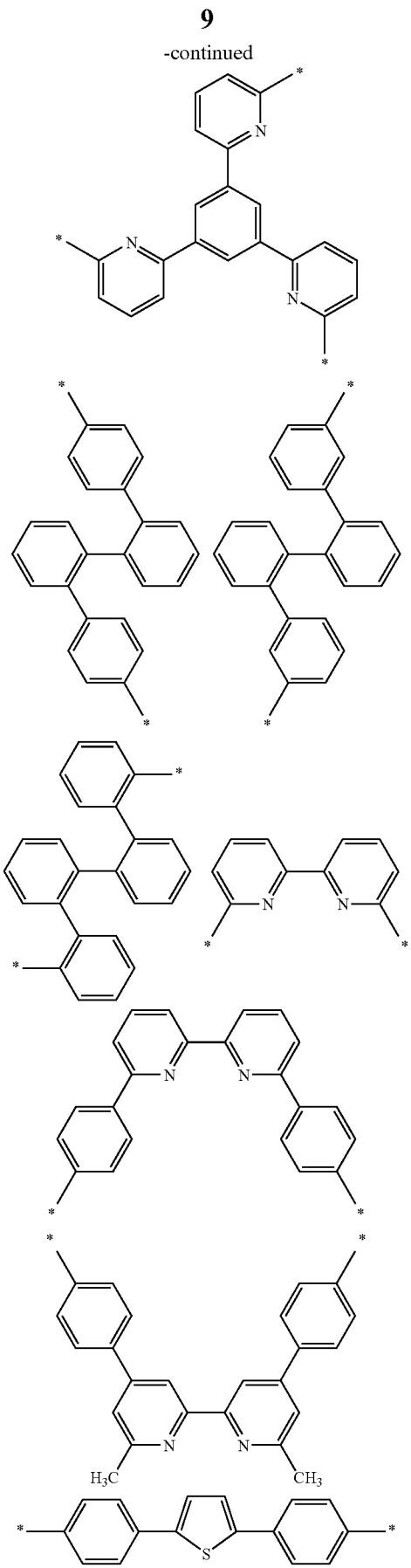
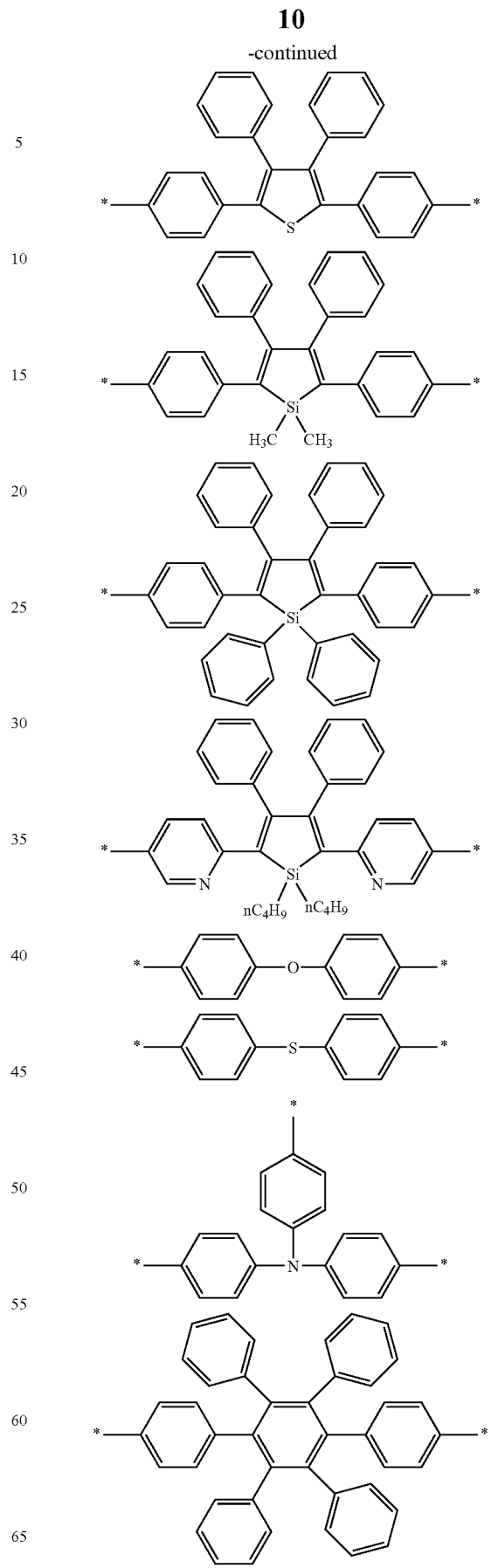

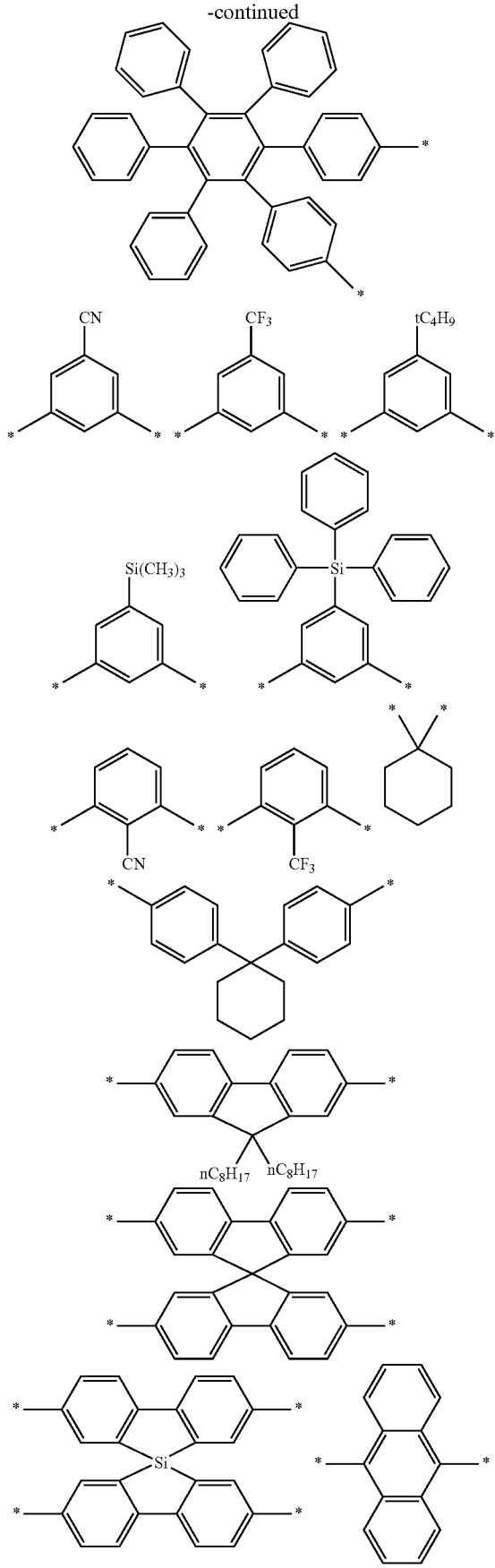
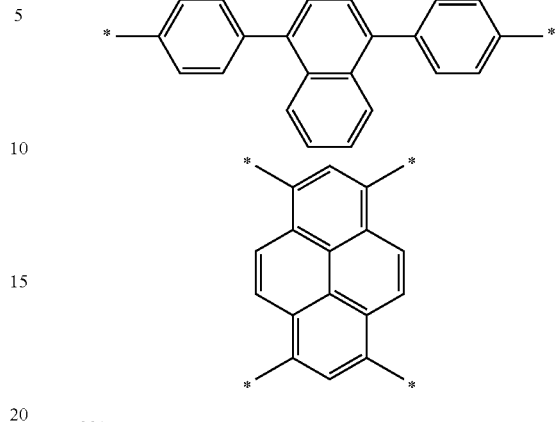

$n^{201}$ represents an integer of from 2 to 10, preferably from 2 to 6, more preferably from 2 to 4, still more preferably 2 or 3, and especially preferably 2. Indolyl groups of number of $n^{201}$ may be the same or different.

The compounds represented by formula (11) and formula (12) can be synthesized according to the description in JP-A-2002-305084.

A platinum complex phosphorescent material having a tetradentate ligand is not especially restricted, but a compound represented by the following formula (1) is preferred, and a compound represented by the following formula (2) is more preferred.

Formula (1):

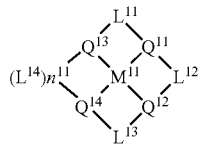

In formula (1), $M^{11}$ represents a platinum ion; $Q^{11}$, $Q^{12}$, $Q^{13}$ and $Q^{14}$ each represents an atomic group to coordinate to $M^{11}$; $L^{11}$, $L^{12}$, $L^{13}$ and $L^{14}$ each represents a single bond or a linking group; $n^{11}$ represents 0 or 1, and when $n^{11}$ is 0, $Q^{13}$ and $Q^{14}$ are not bonded to each other via $L^{14}$; a bond between $M^{11}$ and $Q^{11}$, a bond between $M^{11}$ and $Q^{12}$, a bond between $M^{11}$ and $Q^{13}$, and a bond between $M^{11}$ and $Q^{14}$ may each be a covalent bond, may be a coordinate bond, or may be an ionic bond.

Formula (2):

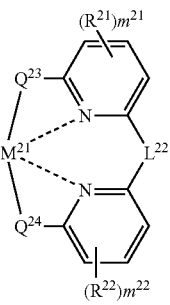

In formula (2), $M^{21}$ represents a platinum ion; $Q^{23}$ and $Q^{24}$ each represents an atomic group to coordinate to $M^{21}$; $L^{22}$ represents a single bond or a linking group; $R^{21}$ and $R^{22}$ each represents a substituent; $m^{21}$ and $m^{22}$ each represents an integer of from 0 to 3; a bond between $M^{21}$ and N (dotted lines) represents a coordinate bond, a bond between $M^{21}$ and $Q^{23}$, and a bond between $M^{21}$ and $Q^{24}$ may each be a covalent bond, may be a coordinate bond, or may be an ionic bond.

The compound represented by formula (1) will be described below.

$M^{11}$ represents a platinum ion, and the valence of the platinum ion is not especially restricted but divalent is preferred.

$Q^{11}$, $Q^{12}$, $Q^{13}$ and $Q^{14}$ each represents an atomic group to coordinate to $M^{11}$ (as a bond formed by coordination, there are, e.g., a coordinate bond, a covalent bond an ionic bond). $Q^{11}$, $Q^{12}$, $Q^{13}$ and $Q^{14}$ are not especially restricted so long as they are each an atomic group to coordinate to $M^{11}$, and an atomic group to coordinate via a carbon atom, an atomic group to coordinate via a nitrogen atom, an atomic group to coordinate via an oxygen atom, an atomic group to coordinate via a sulfur atom, and an atomic group to coordinate via a phosphorus atom are preferred.

As the atomic group to coordinate via a carbon atom, e.g., an imino group, an aromatic hydrocarbocyclic group (benzene, naphthalene, etc.), a heterocyclic group (thiophene, pyridine, pyrazine, pyrimidine, pyridazine, triazine, thiazole, oxazole, pyrrole, imidazole, pyrazole, triazole, etc.), and condensed rings containing any of these groups, and tautomers of these groups are exemplified. These groups may further have a substituent. As the examples of the substituents, the groups described in $R^{21}$ later are exemplified.

As the atomic group to coordinate via a nitrogen atom, e.g., a nitrogen-containing heterocyclic group (pyridine, pyrazine, pyrimidine, pyridazine, triazine, thiazole, oxazole, pyrrole, imidazole, pyrazole, triazole, etc.), an amino group (an alkylamino group (preferably having from 2 to 30 carbon atoms, more preferably from 2 to 20 carbon atoms, and especially preferably from 2 to 10 carbon atoms, e.g., methylamino), an arylamino group (e.g., phenylamino), etc.), an acylamino group (preferably having from 2 to 30 carbon atoms, more preferably from 2 to 20 carbon atoms, and especially preferably from 2 to 10 carbon atoms, e.g., acetylamino, benzoylamino, etc.), an alkoxycarbonylamino group (preferably having from 2 to 30 carbon atoms, more preferably from 2 to 20 carbon atoms, and especially preferably from 2 to 12 carbon atoms, e.g., methoxycarbonylamino, etc.), an aryloxycarbonylamino group (preferably having from 7 to 30 carbon atoms, more preferably from 7 to 20 carbon atoms, and especially preferably from 7 to 12 carbon atoms, e.g., phenyloxycarbonylamino, etc.), a sulfonylamino group (preferably having from 1 to 30 carbon atoms, more preferably from 1 to 20 carbon atoms, and especially preferably from 1 to 12 carbon atoms, e.g., methanesulfonyl-amino, benzenesulfonylamino, etc.), and an imino group, etc., are exemplified. These groups may further be substituted. As the examples of the substituents, the groups described in $R^{21}$ later are exemplified.

As the atomic group to coordinate via an oxygen atom, e.g., an alkoxyl group (preferably having from 1 to 30 carbon atoms, more preferably from 1 to 20 carbon atoms, and especially preferably from 1 to 10 carbon atoms, e.g., methoxy, ethoxy, butoxy, 2-ethylhexyloxy, etc.), an aryloxy group (preferably having from 6 to 30 carbon atoms, more preferably from 6 to 20 carbon atoms, and especially preferably from 6 to 12 carbon atoms, e.g., phenyloxy, 1-naphthyloxy, 2-naphthyloxy, etc.), a heterocyclic oxy group (preferably having from 1 to 30 carbon atoms, more preferably from 1 to 20 carbon atoms, and especially preferably from 1 to 12 carbon atoms, e.g., pyridyloxy, pyrazyloxy, pyrimidyloxy, quinolyloxy, etc.), an acyloxy group (preferably having from 2 to 30 carbon atoms, more preferably from 2 to 20 carbon atoms, and especially preferably from 2 to 10 carbon atoms, e.g., acetoxy, benzoyloxy, etc.), a silyloxy group (preferably having from 3 to 40 carbon atoms, more preferably from 3 to 30 carbon atoms, and especially preferably from 3 to 24 carbon atoms, e.g., trimethylsilyloxy, triphenylsilyloxy, etc.), a carbonyl group (e.g., a ketone group, an ester group, an amido group, etc.), an ether group (e.g., a dialkyl ether group, a diaryl ether group, a furyl group, etc.), etc., are exemplified. These groups may further be substituted. As the examples of the substituents, the groups described in $R^{21}$ later are exemplified.

As the atomic group to coordinate via a sulfur atom, e.g., an alkylthio group (preferably having from 1 to 30 carbon atoms, more preferably from 1 to 20 carbon atoms, and especially preferably from 1 to 12 carbon atoms, e.g., methylthio, ethylthio, etc.), an arylthio group (preferably having from 6 to 30 carbon atoms, more preferably from 6 to 20 carbon atoms, and especially preferably from 6 to 12 carbon atoms, e.g., phenylthio, etc.), a heterocyclic thio group (preferably having from 1 to 30 carbon atoms, more preferably from 1 to 20 carbon atoms, and especially preferably from 1 to 12 carbon atoms, e.g., pyridylthio, 2-benzimidazolylthio, 2-benz-oxazolylthio, 2-benzothiazolylthio, etc.), a thiocarbonyl group (e.g., a thioketone group, a thioester group, etc.), a thioether group (a dialkyl thioether group, a diaryl thioether group, a thiofuryl group, etc.), etc., are exemplified. These groups may further be substituted. As the examples of the substituents, the groups described in $R^{21}$ later are exemplified.

As the atomic group to coordinate via a phosphorus atom, e.g., a dialkylphosphino group, a diarylphosphino group, a trialkylphosphine group, a triarylphosphine group, a phosphinine group, etc., are exemplified. These groups may further be substituted. As the examples of the substituents, the groups described in $R^{21}$ later are exemplified.

$Q^{11}$ and $Q^{12}$ each preferably represents an atomic group to coordinate via a nitrogen atom, an atomic group to coordinate via an oxygen atom, or an atomic group to coordinate via a phosphorus atom, more preferably an atomic group to coordinate via a nitrogen atom, still more preferably a nitrogen-containing heterocyclic group to coordinate via a nitrogen atom, and especially preferably a monocyclic nitrogen-containing heterocyclic group to coordinate via a nitrogen atom.

$Q^{13}$ and $Q^{14}$ each preferably represents an atomic group to coordinate via a carbon atom, an atomic group to coordinate via a nitrogen atom, or an atomic group to coordinate via an oxygen atom, more preferably an aryl group to coordinate via a carbon atom, a hetero aryl group to coordinate via a carbon atom, a hetero aryl group to coordinate via a nitrogen atom, a carboxyl group to coordinate via an oxygen atom, an aryloxy group to coordinate via an oxygen atom, or a hetero aryloxy group to coordinate via an oxygen atom, still more preferably an aryl group to coordinate via a carbon atom, a hetero aryl group to coordinate via a carbon atom, a hetero aryl group to coordinate via a nitrogen atom, or a carboxyl group to coordinate via an oxygen atom, and especially preferably an aryl group to coordinate via a carbon atom, or a hetero aryl group to coordinate via a carbon atom.

$L^{11}$, $L^{12}$, $L^{13}$ and $L^{14}$ each represents a single bond or a linking group. The linking groups are not especially restricted, but, for example, an alkylene group (e.g., a methylene group, a dimethylmethylene group, a diisopropyl-methylene group, a diphenylmethylene group, an ethylene group, a tetramethylethylene group, etc.), an alkenylene group (e.g., a vinylene group, a dimethylvinylene group, etc.), an alkynylene group (e.g., an ethynylene group, etc.), an arylene group (e.g., a phenylene group, a naphthylene group, etc.), a hetero arylene group (e.g., a pyridylene group, a pyrazylene group, a quinolylene group, etc.), an oxygen linking group, a sulfur linking group, a nitrogen linking group (e.g., a methylamino linking group, a phenylamino linking group, a t-butylamino linking group, etc.), a silicon linking group, and linking groups obtained by combining any of these groups (e.g., an oxylenemethylene group, etc.) are exemplified.

$L^{11}$ and $L^{13}$ each preferably represents a single bond, an alkylene group, or an oxygen linking group, more preferably a single bond or an alkylene group, and still more preferably a single bond.

$L^{12}$ and $L^{14}$ each preferably represents a single bond, an alkylene group, an oxygen linking group, or a nitrogen linking group, more preferably an alkylene group or an oxygen linking group, and especially preferably an alkylene linking group.

The linking groups represented by $L^{11}$, $L^{12}$, $L^{13}$ and $L^{14}$ each may have a substituent. As the substituents, those exemplified as the substituents represented by $R^{101}$ to $R^{107}$ are applicable.

$n^{11}$ represents 0 or 1. When $n^{11}$ is 0, $Q^{13}$ and $Q^{14}$ are not bonded to each other via $L^{14}$.

A bond between $M^{11}$ and $Q^{11}$, a bond between $M^{11}$ and $Q^{12}$, a bond between $M^{11}$ and $Q^{13}$, and a bond between $M^{11}$ and $Q^{14}$ may each be a covalent bond, may be a coordinate bond, or may be an ionic bond.

A bond between $M^{11}$ and $Q^{11}$ and a bond between $M^{11}$ and $Q^{12}$ are preferably a coordinate bond (a bond shown by dotted lines), and a bond between $M^{11}$ and $Q^{13}$ and a bond between $M^{11}$ and $Q^{14}$ are preferably a covalent bond (a bond shown by solid lines), or an ionic bond (a bond shown by solid lines), and more preferably a covalent bond.

The compound represented by formula (2) will be described below.

$M^{21}$ has the same meaning as that of $M^{11}$, and the preferred range is also the same. $Q^{23}$ and $Q^{24}$ each represents an atomic group to coordinate to $M^{21}$.

$Q^{23}$ and $Q^{24}$ each preferably represents an atomic group to coordinate via a carbon atom, an atomic group to coordinate via a nitrogen atom, or an atomic group to coordinate via an oxygen atom, more preferably an aryl group to coordinate via a carbon atom, a hetero aryl group to coordinate via a carbon atom, a hetero aryl group to coordinate via a nitrogen atom, a carboxyl group to coordinate via an oxygen atom, an aryloxy group to coordinate via an oxygen atom, or a hetero aryloxy group to coordinate via an oxygen atom, still more preferably an aryl group to coordinate via a carbon atom, a hetero aryl group to coordinate via a carbon atom, a hetero aryl group to coordinate via a nitrogen atom, or a carboxyl group to coordinate via an oxygen atom, and especially preferably an aryl group to coordinate via a carbon atom, or a hetero aryl group to coordinate via a carbon atom. Of these groups, a 5-membered hetero aryl group to coordinate via a carbon atom is especially preferred.

It is preferred in the invention that either $Q^{23}$ or $Q^{24}$ represents an aryl group substituted with an electron attractive group (a fluorine atom, a cyano group, a fluorine-substituted alkyl group, a fluorine-substituted aryl group (preferably a phenyl group), etc.), or a 5-membered nitrogen-containing heterocyclic group (pyrrole, imidazole, pyrazole, triazole), and it is more preferred that either represents a 5-membered nitrogen-containing heterocyclic group.

$R^{21}$ and $R^{22}$ each represents a substituent. As the substituents, the groups described in $R^{102}$ above are exemplified.

$L^{22}$ has the same meaning as that of $L^{12}$, and the preferred range is also the same.

$R^{21}$ and $R^{22}$ each preferably represents an alkyl group, an alkoxyl group, or a substituted amino group, more preferably an alkyl group or a substituted amino group, and still more preferably an alkyl group.

$m^{21}$ and $m^{22}$ each represents an integer of from 0 to 3, preferably 0 or 1, and more preferably 0. When $m^{21}$ and $m^{22}$ each represents 2 or more, a plurality of $m^{21}$'s and $m^{22}$'s may be the same or different.

The compounds represented by formula (1) and formula (2) can be synthesized according to the method disclosed in WO 2004/108857A1 and by referring to the method.

The indole derivatives for use in the invention may be low molecular weight compounds, may be high molecular weight compounds in which the residue is directly bonded to the polymer main chain (preferably having a mass average molecular weight of from 1,000 to 5,000,000, more preferably from 5,000 to 2,000,000, and still more preferably from 10,000 to 1,000,000), or may be high molecular weight compounds having the indole derivative of the invention on the main chain (preferably having a mass average molecular weight of from 1,000 to 5,000,000, more preferably from 5,000 to 2,000,000, and still more preferably from 10,000 to 1,000,000). In the case where the indole derivatives are high molecular weight compounds, they may be homopolymers, or may be copolymers with other polymers. When the indole derivatives are copolymers, they may be random copolymers or block copolymers. Further, when they are copolymers, at least one of a compound having a luminescent function and a compound having a charge transporting function may be contained in the polymers.

The maximum emission wavelength f the platinum complex phosphorescent material having a tetradentate ligand is preferably 500 nm or less, more preferably 480 nm or less, still more preferably 470 nm or less, and especially preferably 460 nm or less. The maximum emission wavelength can be found by preparing a film of a light-emitting layer, exciting the light-emitting film with the light of wavelength where absorption of the light-emitting film exists, and measuring the spectrum of light emitted.

The external quantum efficiency of the light-emitting device of the invention is preferably 5% or more, more preferably 10% or more, and still more preferably 13% or more. As the numerical value of external quantum efficiency, the maximum value of the external quantum efficiency at the time of driving a device at 20° C., or the value of the external quantum efficiency near 100 to 300 cd/m² at the time of driving a device at 20° C. can be used.

The inner quantum efficiency of the light-emitting device of the invention is preferably 30% or more, more preferably 50% or more, and still more preferably 70% or more. The inner quantum efficiency of a device is computed by the expression: inner quantum efficiency=external quantum efficiency/coupling out efficiency of light. In ordinary organic EL device, coupling out efficiency of light is about 20%, but it is possible to make coupling out efficiency of light 20% or more by various contrivances such as the shape of a substrate, the shape of electrodes, the thickness of an organic layer, the thickness of an inorganic layer, the refractive index of an organic layer, and the refractive index of an inorganic layer.

The indole derivative represented by formula (11) or (12) of the invention is preferably contained in the light-emitting layer or a layer contiguous to the light-emitting layer, more preferably contained in the light-emitting layer or a layer contiguous to the light-emitting layer on the anode side, and still more preferably contained in the light-emitting layer.

When the indole derivative represented by formula (11) or (12) of the invention is contained as the host material of the light-emitting layer, the proportion of the indole derivative is preferably from 50 to 99 mass % (weight %) in the light-emitting layer, more preferably from 60 to 95 mass %, and still more preferably from 70 to 90 mass %. When the indole derivative is contained in the layer other than the light-emitting layer, the proportion is preferably from 20 to 100 mass % in the layer, more preferably from 60 to 100 mass %, and still more preferably from 90 to 100 mass %.

It is preferred for the light-emitting device to contain a carbazole derivative in a layer contiguous to the light-emitting layer (preferably a layer contiguous to the light-emitting layer on the anode side). By the introduction of a carbazole derivative into a layer contiguous to the light-emitting layer, increase in durability by the intermolecular interaction of the carbazole derivative with the platinum complex, and the effect of enhancement of efficiency by energy and electric charge blocking can be obtained.

It is preferred for the light-emitting device to contain a metal complex in a layer contiguous to the light-emitting layer (preferably a layer contiguous to the light-emitting layer on the cathode side). By the introduction of a metal complex into a layer contiguous to the light-emitting layer, the effect of enhancement of efficiency by energy and electric charge blocking can be obtained.

Metal ions constituting metal complexes are not especially restricted, but divalent or trivalent metal ions are preferred, a trivalent aluminum ion, a divalent zinc ion, a trivalent gallium ion, a divalent beryllium ion, and a divalent magnesium ion are more preferred, a trivalent aluminum ion, a trivalent gallium ion, and a divalent zinc ion are still more preferred, and a trivalent aluminum ion is especially preferred.

The light-emitting device of the invention is preferably a device having at least three layers of a hole transporting layer, a light-emitting layer and an electron transporting layer. It is more preferred to additionally provide a layer to accelerate hole injection to the light-emitting layer, a layer to block electrons, and a layer to block excitons between the hole transporting layer and the light-emitting layer.

The degree of charge transfer of the host material contained in the light-emitting layer is preferably $1 \times 10^{-6}$ cm$^2$/Vs or more and $1 \times 10^{-1}$ cm$^2$/Vs or less, more preferably $5 \times 10^{-6}$ cm$^2$/Vs or more and $1 \times 10^{-2}$ cm$^2$/Vs or less, still more preferably $1 \times 10^{-5}$ cm$^2$/Vs or more and $1 \times 10^{-2}$ cm$^2$/Vs or less, and especially preferably $5 \times 10^{-5}$ cm$^2$/Vs or more and $1 \times 10^{-2}$ cm$^2$/Vs or less.

The glass transition points of the host materials, and the materials of the electron transporting layer and hole transporting contained in the organic EL device of the invention are preferably 90° C. or more and 400° C. or less, more preferably 100° C. or more and 380° C. or less, still more preferably 120° C. or more and 370° C. or less, and especially preferably 140° C. or more and 360° C. or less.

The organic EL device of the invention may be a white luminescent device.

The $T_1$ level (the energy level in the state of minimum triplet excitation) of the platinum complex phosphorescent material contained in the light-emitting layer containing at least a platinum complex phosphorescent material having a tetradentate ligand of the invention is preferably 60 kcal/mol or more (251.4 kJ/mol or more) and 90 kcal/mol or less (377.1 kJ/mol or less), more preferably 62 kcal/mol or more (259.78 kJ/mol or more) and 85 kcal/mol or less (356.15 kJ/mol or less), and still more preferably 65 kcal/mol or more (272.35 kJ/mol or more) and 80 kcal/mol or less (335.2 kJ/mol or less).

The $T_1$ level (the energy level in the state of minimum triplet excitation) of the host material contained in the light-emitting layer containing at least a platinum complex phosphorescent material having a tetradentate ligand of the invention is preferably 60 kcal/mol or more (251.4 kJ/mol or more) and 90 kcal/mol or less (377.1 kJ/mol or less), more preferably 62 kcal/mol or more (259.78 kJ/mol or more) and 85 kcal/mol or less (356.15 kJ/mol or less), and still more preferably 65 kcal/mol or more (272.35 kJ/mol or more) and 80 kcal/mol or less (335.2 kJ/mol or less).

The $T_1$ level (the energy level in the state of minimum triplet excitation) of the layer contiguous to the light-emitting layer is preferably 60 kcal/mol or more (251.4 kJ/mol or more) and 90 kcal/mol or less (377.1 kJ/mol or less), more preferably 62 kcal/mol or more (259.78 kJ/mol or more) and 85 kcal/mol or less (356.15 kJ/mol or less), and still more preferably 65 kcal/mol or more (272.35 kJ/mol or more) and 80 kcal/mol or less (335.2 kJ/mol or less).

$T_1$ energy can be found by measuring the spectrum of emission of phosphorescence of a thin film of the material, and from the end of the short wavelength. For example, a film is formed with the material on a cleaned quartz glass substrate in a thickness of about 50 nm by vacuum deposition. The spectrum of emission of phosphorescence of the thin film is measured with a fluorescence spectrophotometer Model F-7000 (manufactured by Hitachi High Technologies) under a liquid nitrogen temperature. The $T_1$ energy can be found by converting the rising wavelength on the short wave side of the obtained emission spectrum into an energy unit.

Examples of the compounds according to the invention are shown below, but the invention is not restricted to these compounds.

<Indole Derivatives Represented by Formula (11)>

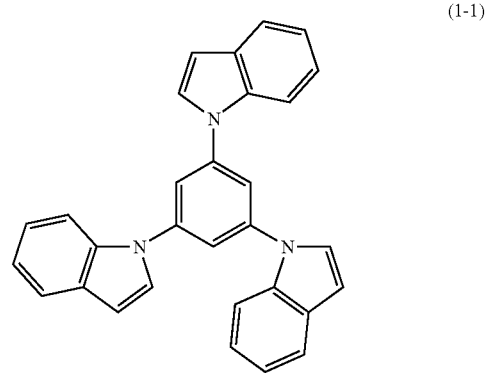

(1-1)

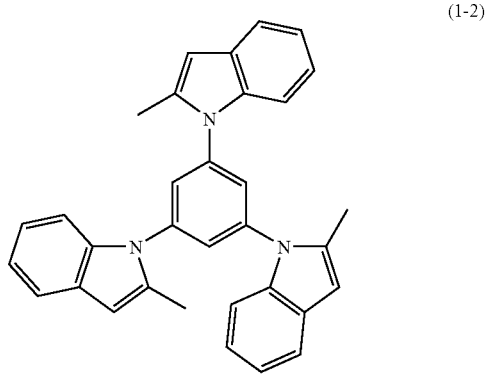

(1-2)

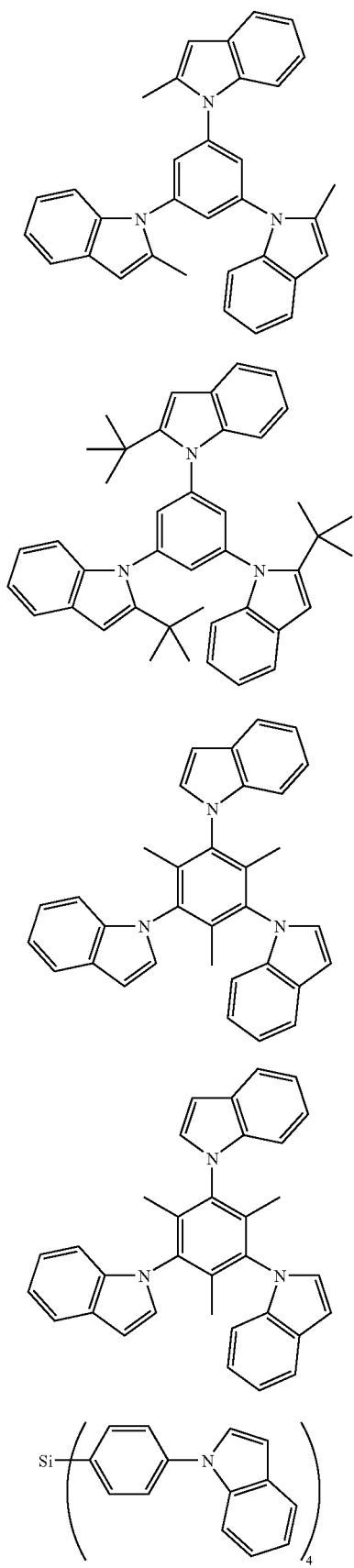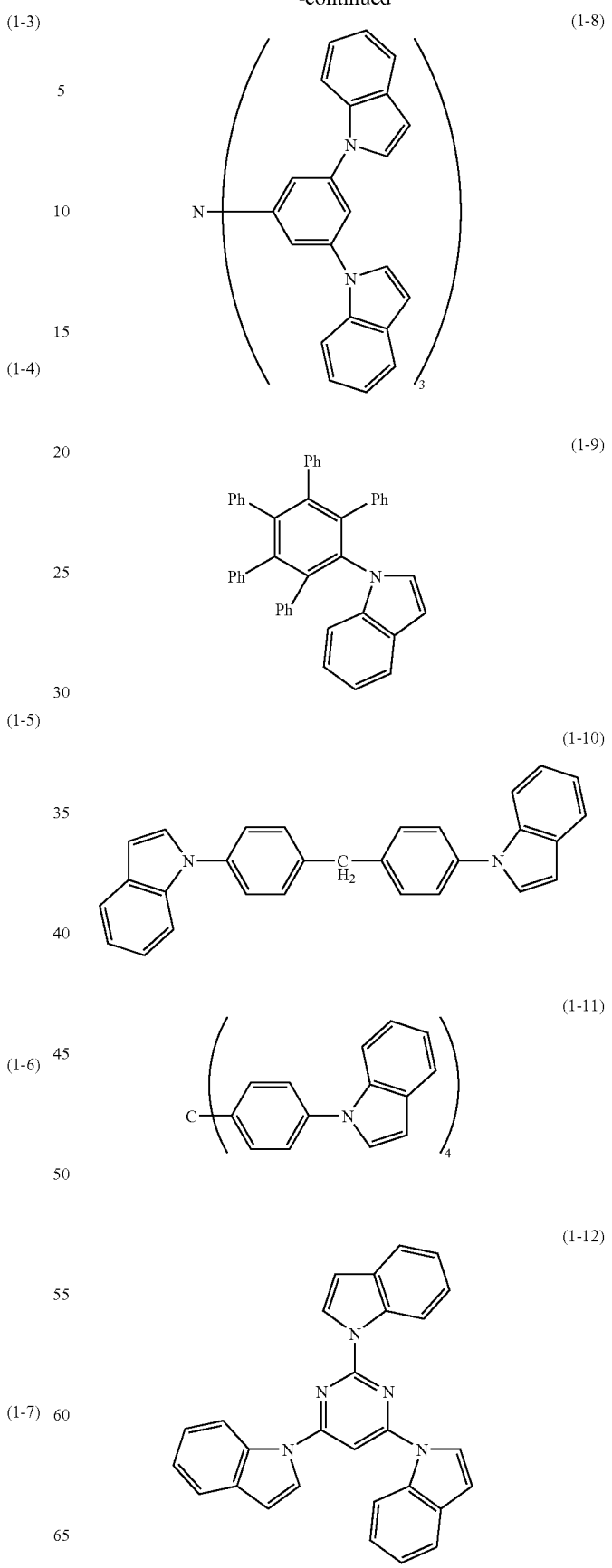

(1-13)
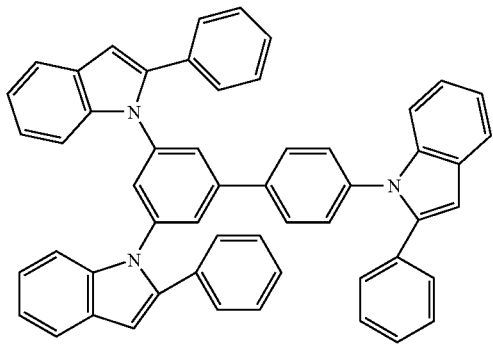
(1-14)
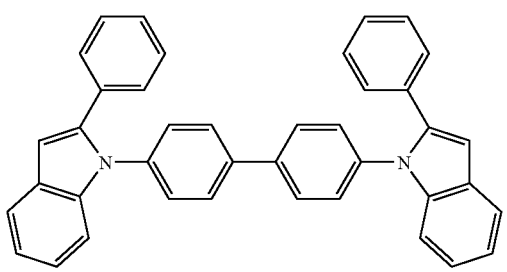
(1-15)
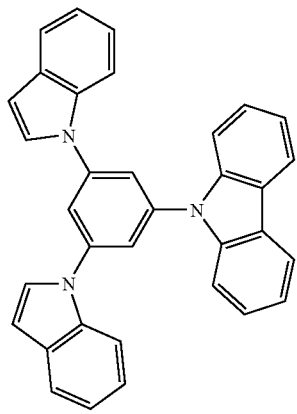
(1-16)
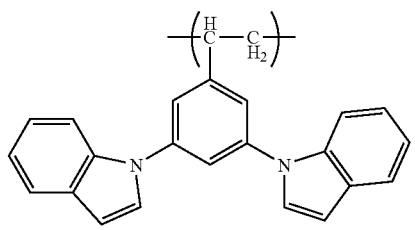
Mass-average molecular weight 18,000
(1-101)
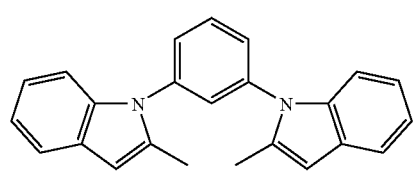
(1-102)
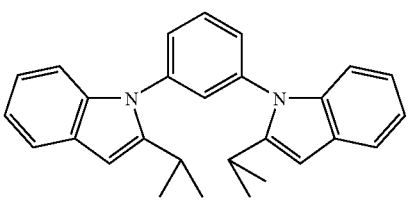
(1-103)
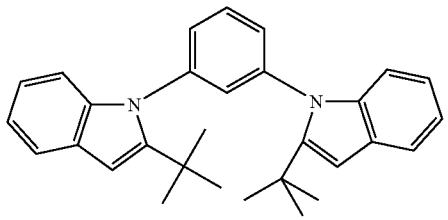
(1-104)
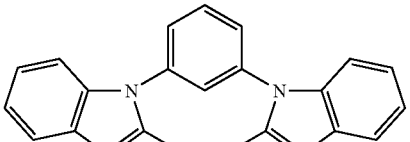
(1-105)
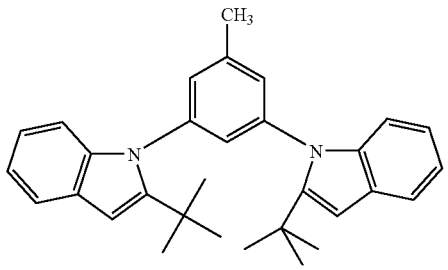
(1-106)
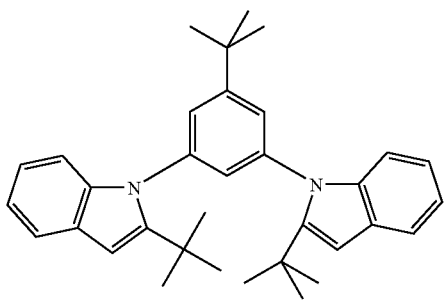
(1-107)
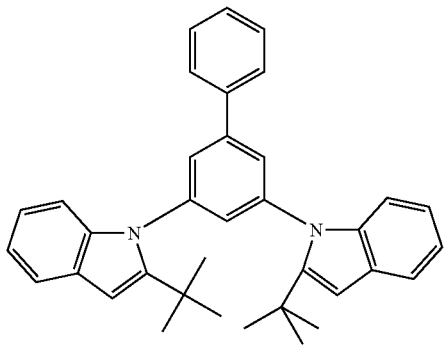

(1-108)
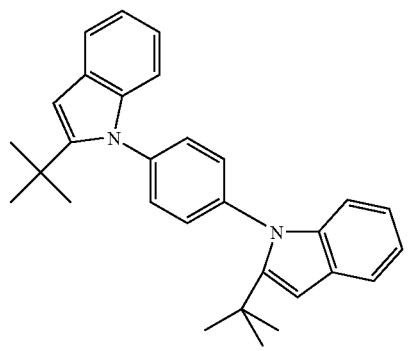
(1-109)
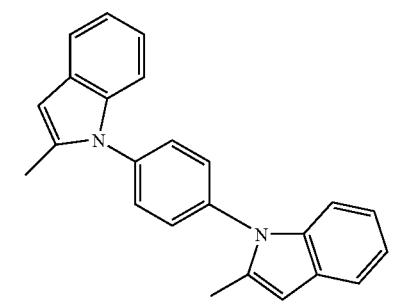
(1-110)
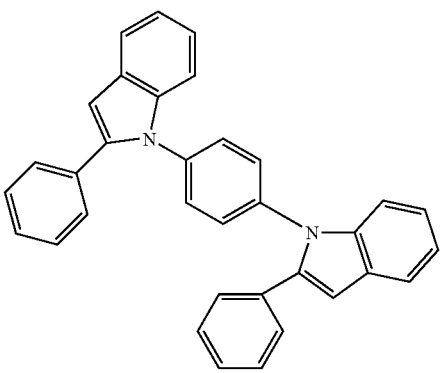
(1-111)
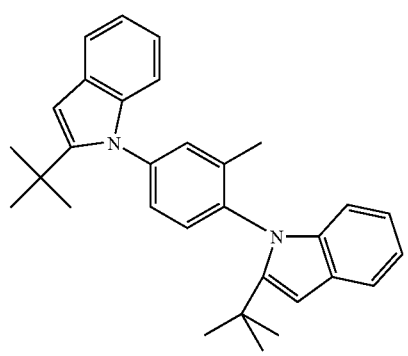
(1-112)
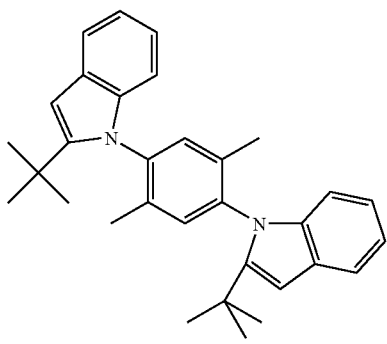
(1-113)
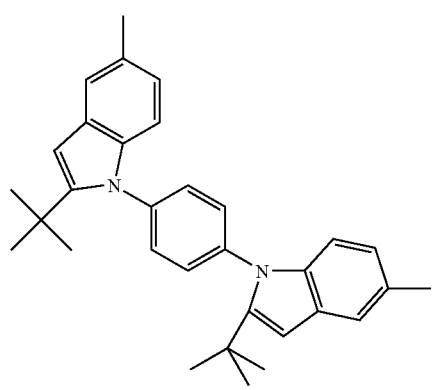
(1-114)
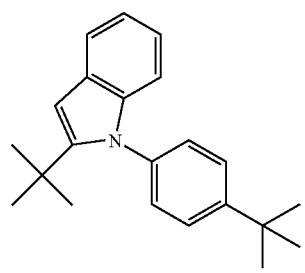
(1-115)
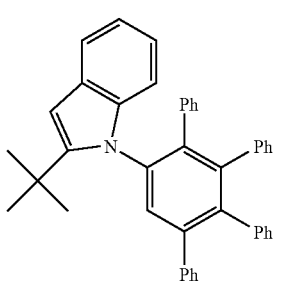
(1-116)
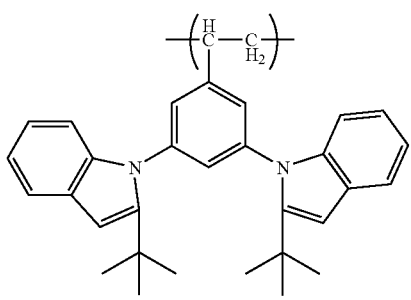
Mass-average molecular weight 22,0000

(1-201)
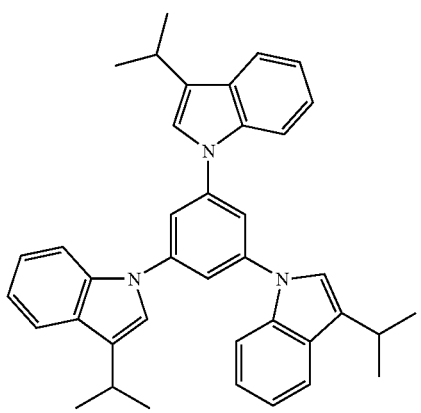
(1-202)
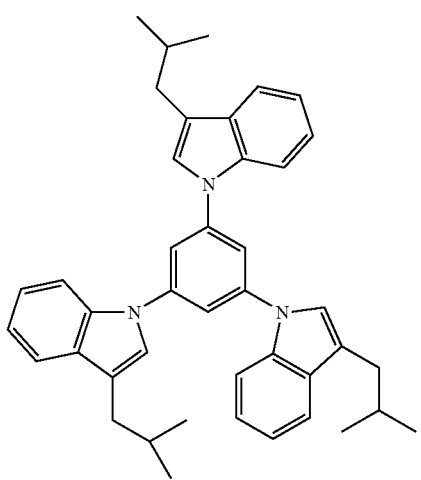
(1-203)
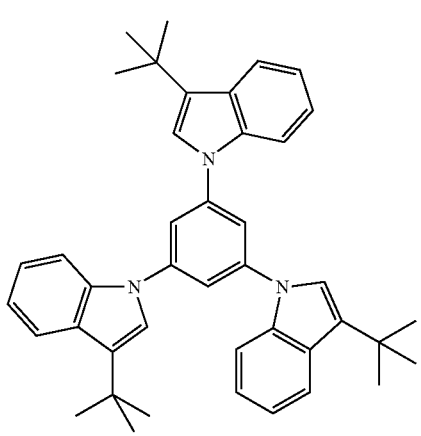
(1-204)
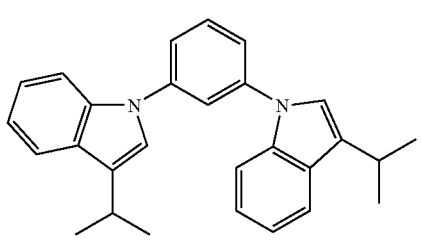
(1-205)
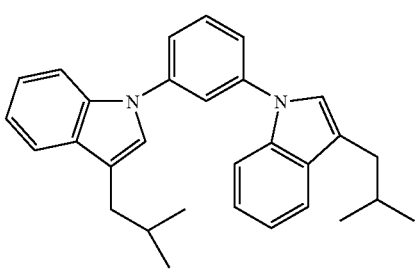
(1-206)
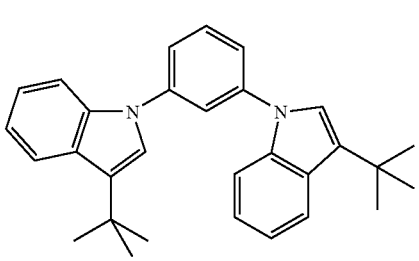
(1-207)
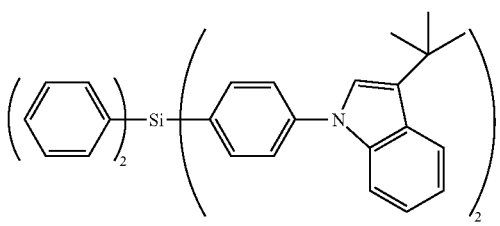
(1-208)
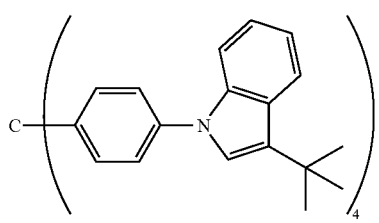
(1-209)
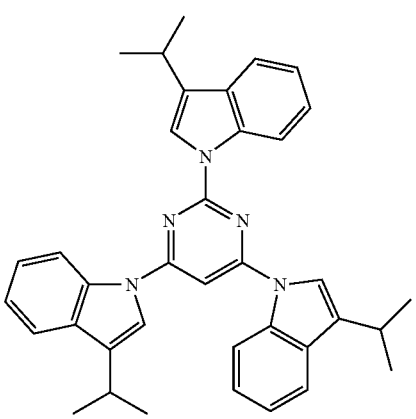

(1-210)
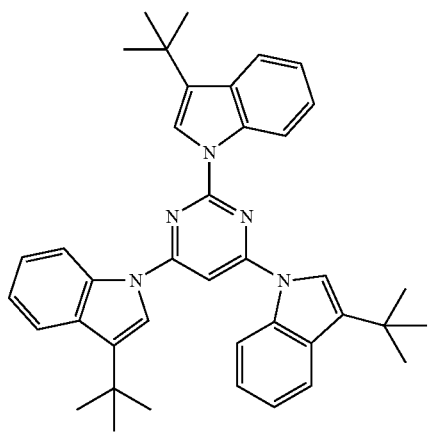
(1-214)
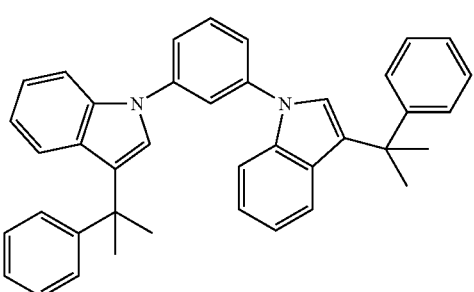
(1-211)
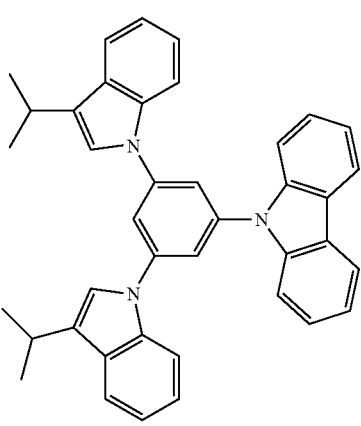
(1-215)
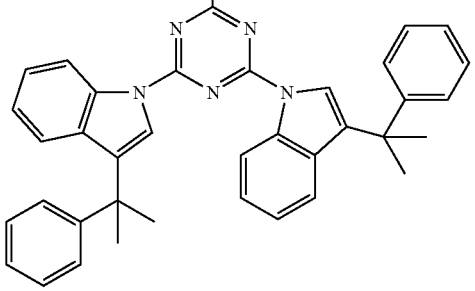
(1-212)
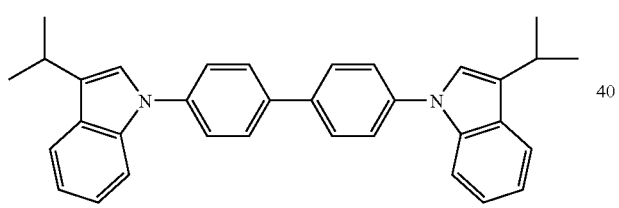
(1-216)
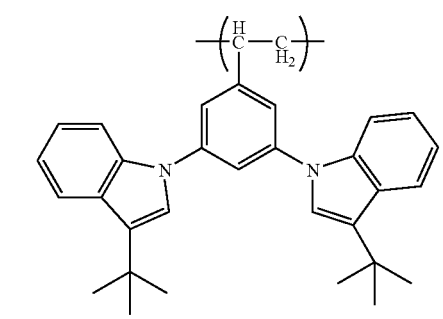
Mass-average molecular weight 18,000
(1-213)
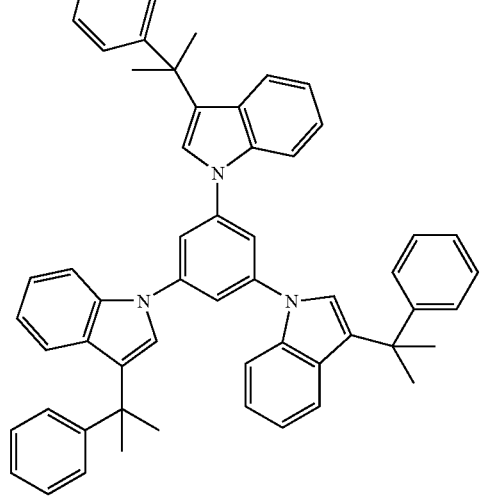
(1-217)
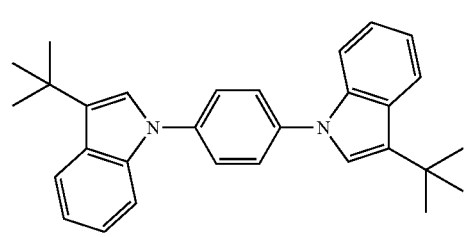

(1-218) 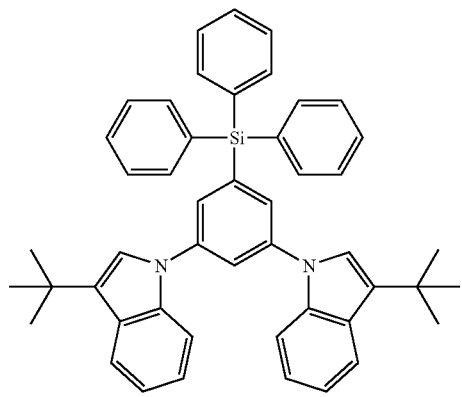
(1-222) 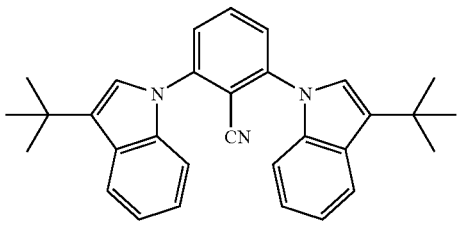
(1-223) 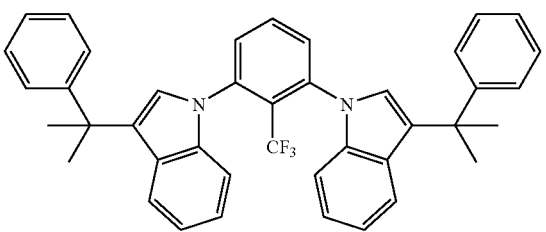
(1-219) 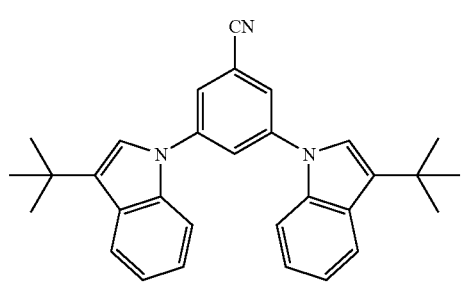
(1-224) 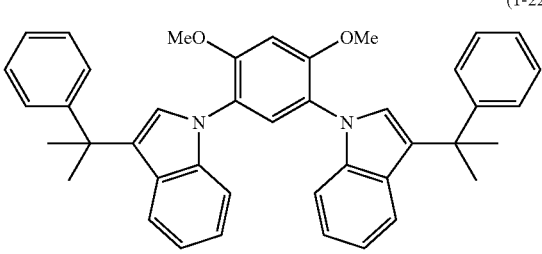
(1-220) 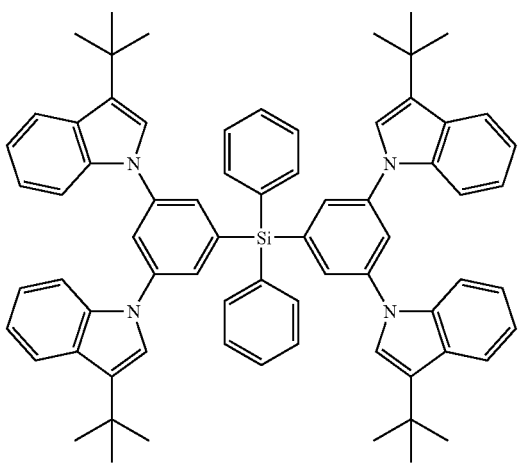
<Platinum Complex Phosphorescent Materials Having a Tetradentate Ligand>
(1) 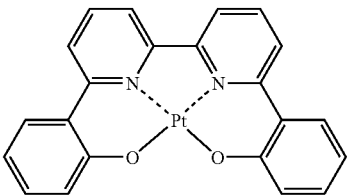
(2) 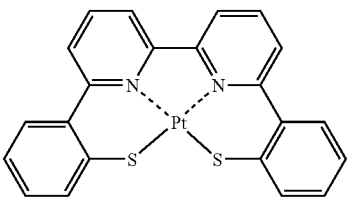
(1-221) 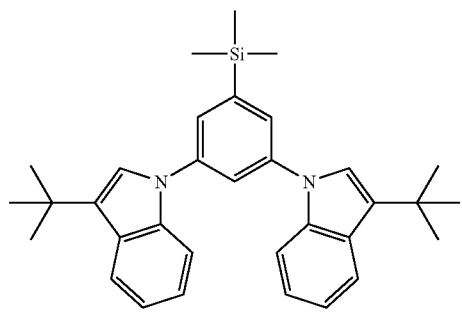
(3) 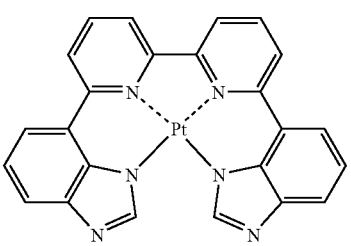

(4)
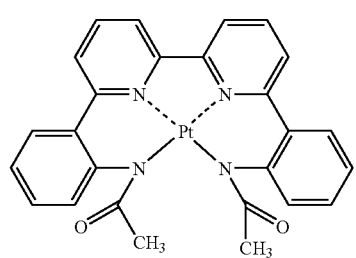
(5)
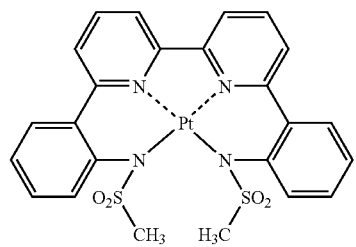
(6)
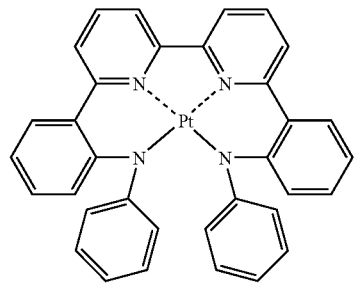
(12)
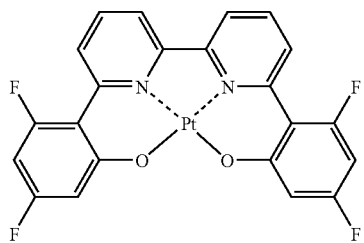
(13)
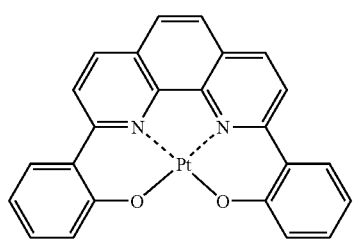
(14)
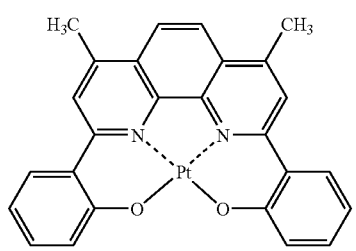
(15)
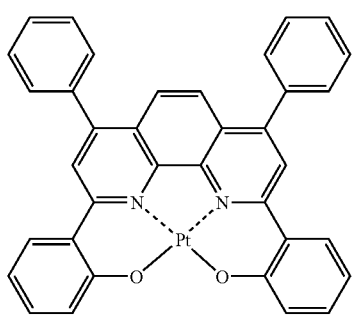
(16)
(17)
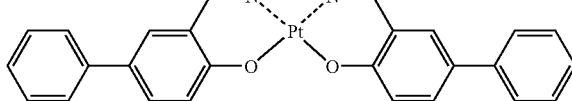
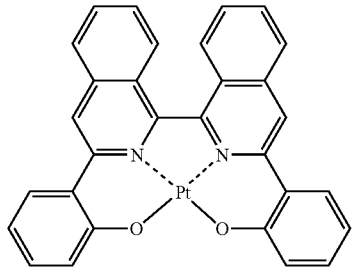
(18)
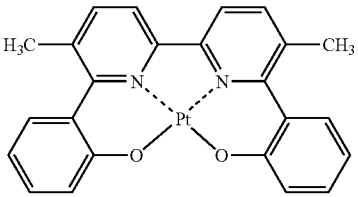
(19)
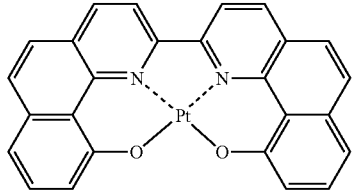
(20)
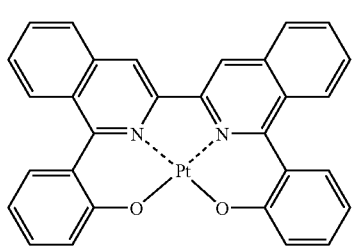

-continued
(21)
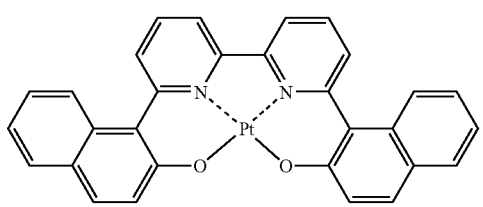
(22)
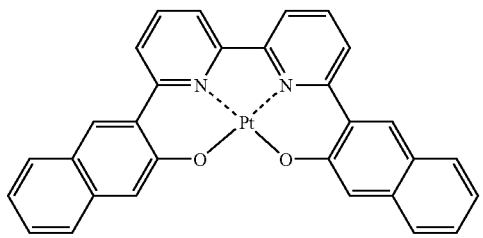
(23)
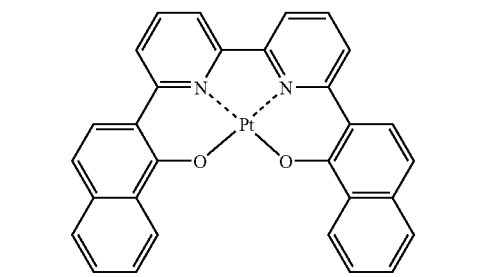
(24)
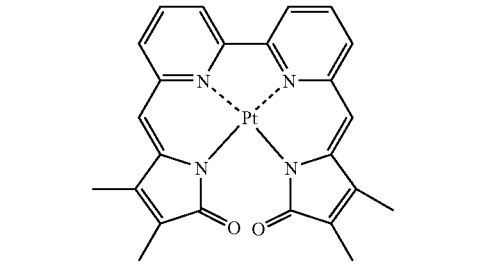
(25)
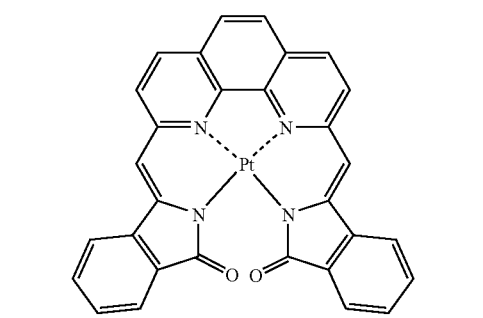
(26)
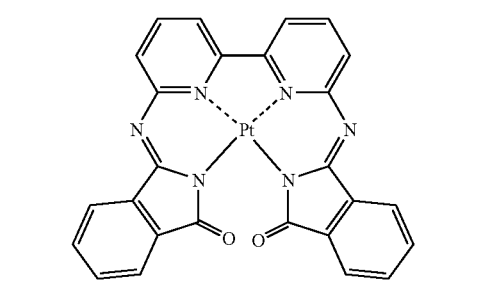
-continued
(27)
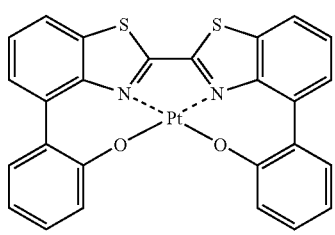
(28)
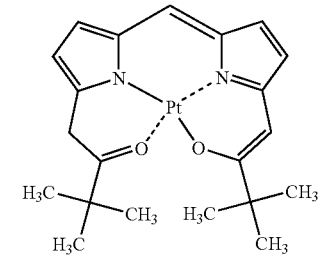
(29)
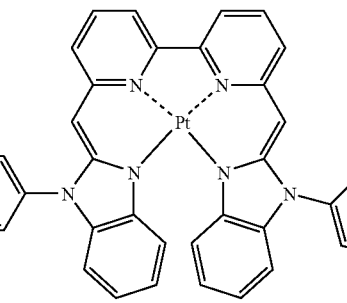
(30)
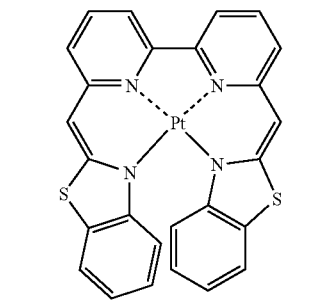
(31)
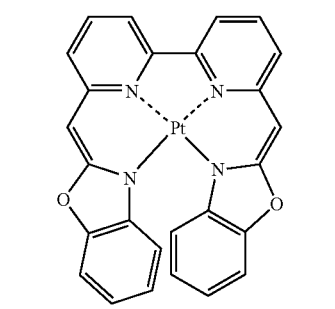
(32)
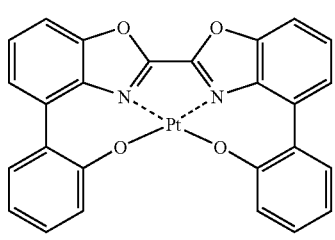

-continued
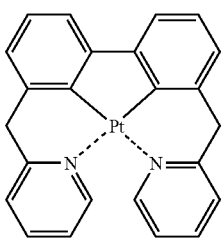
(33)
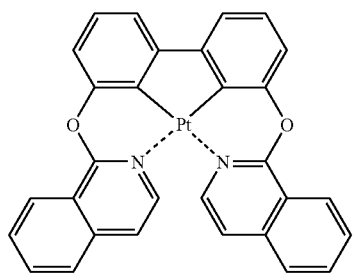
(34)
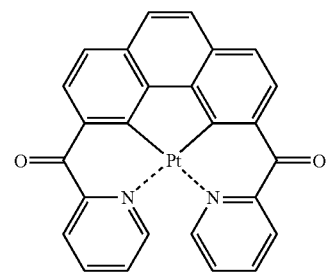
(35)
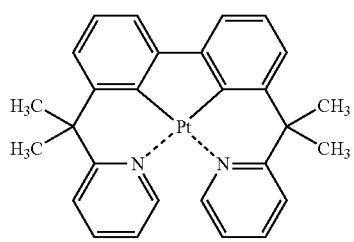
(36)
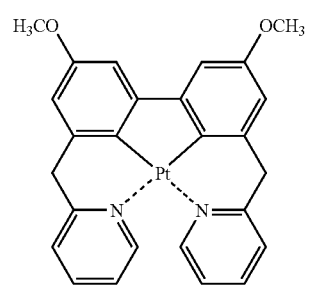
(37)
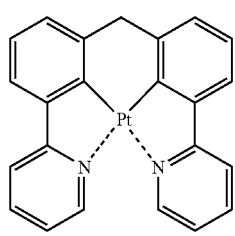
(38)
-continued
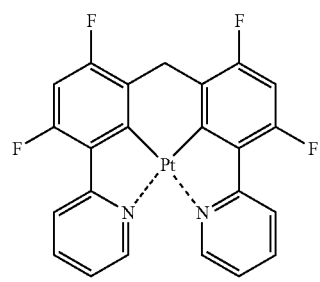
(39)
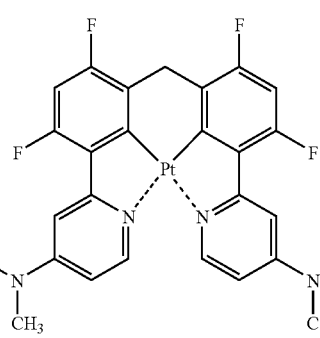
(40)
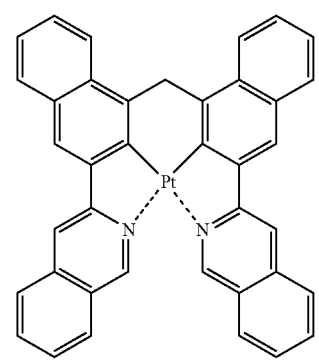
(41)
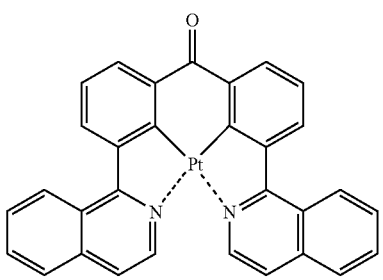
(42)
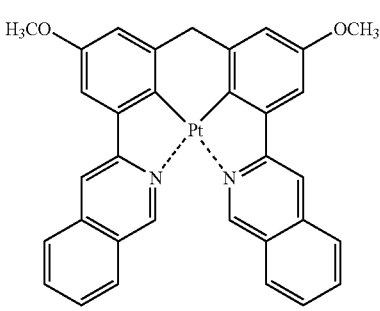
(43)

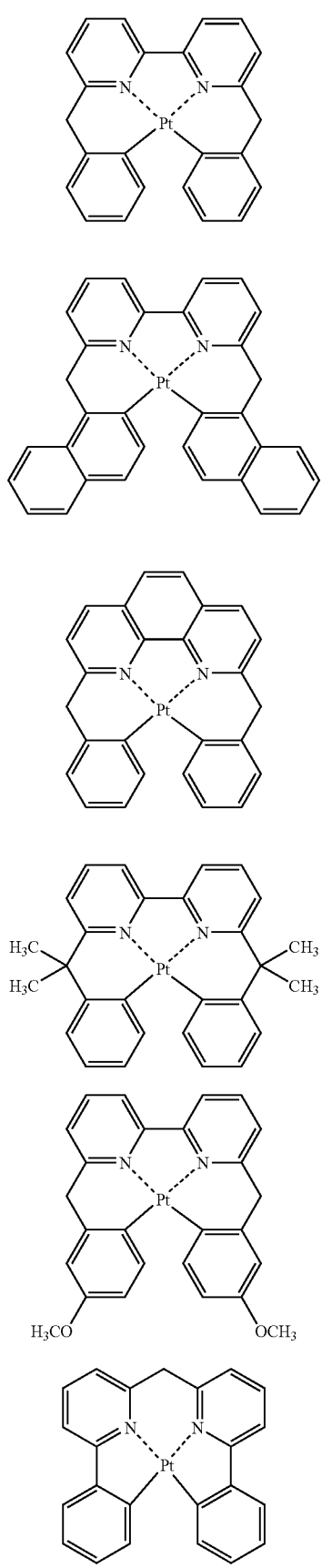
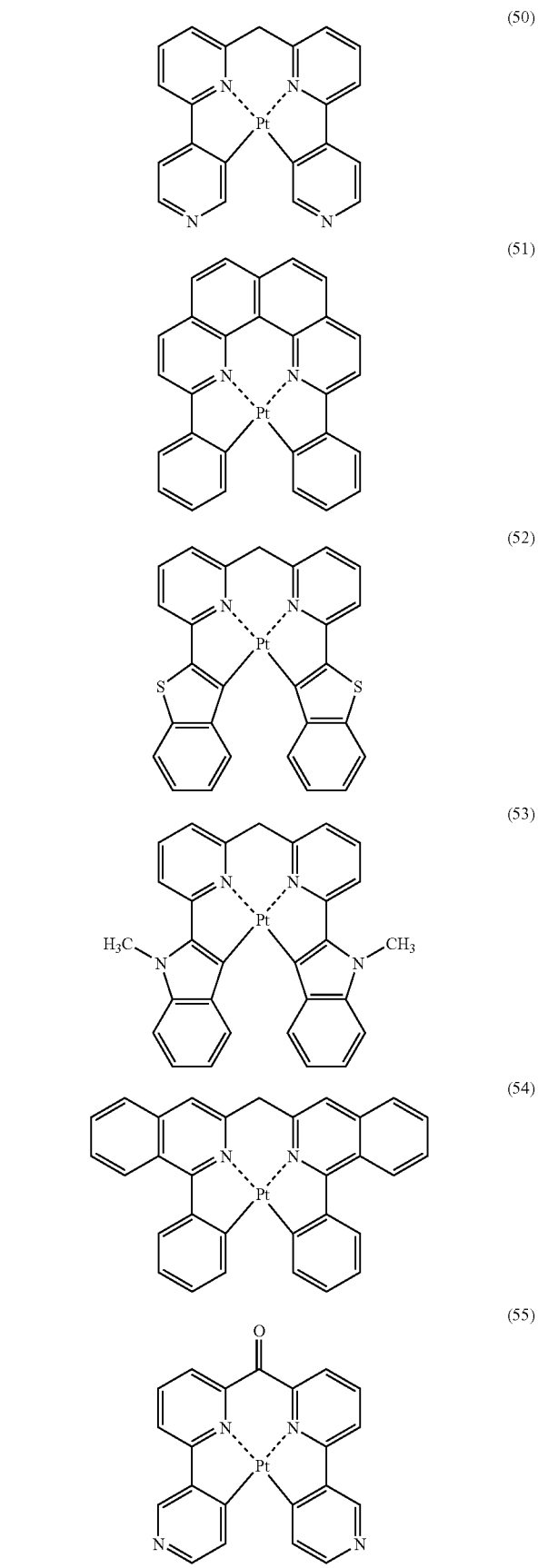

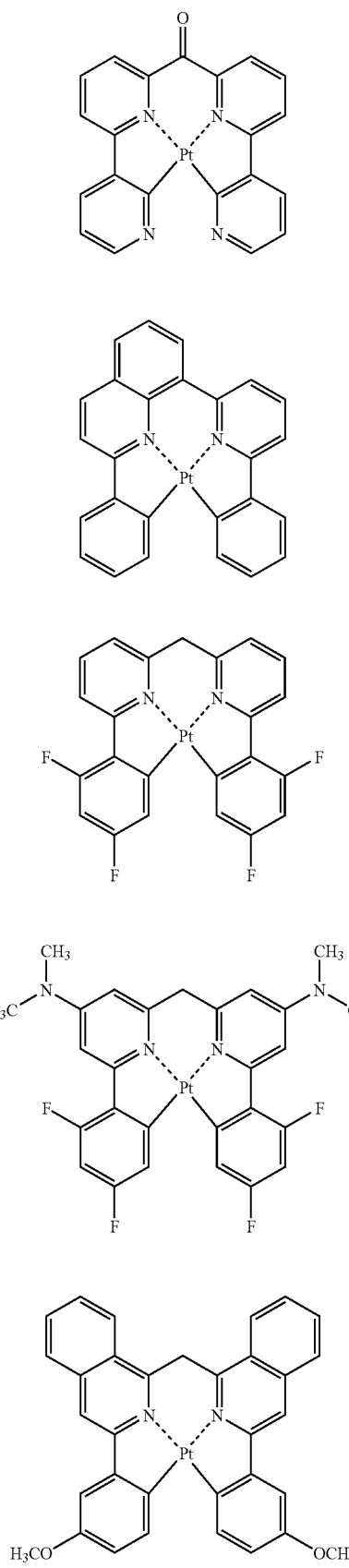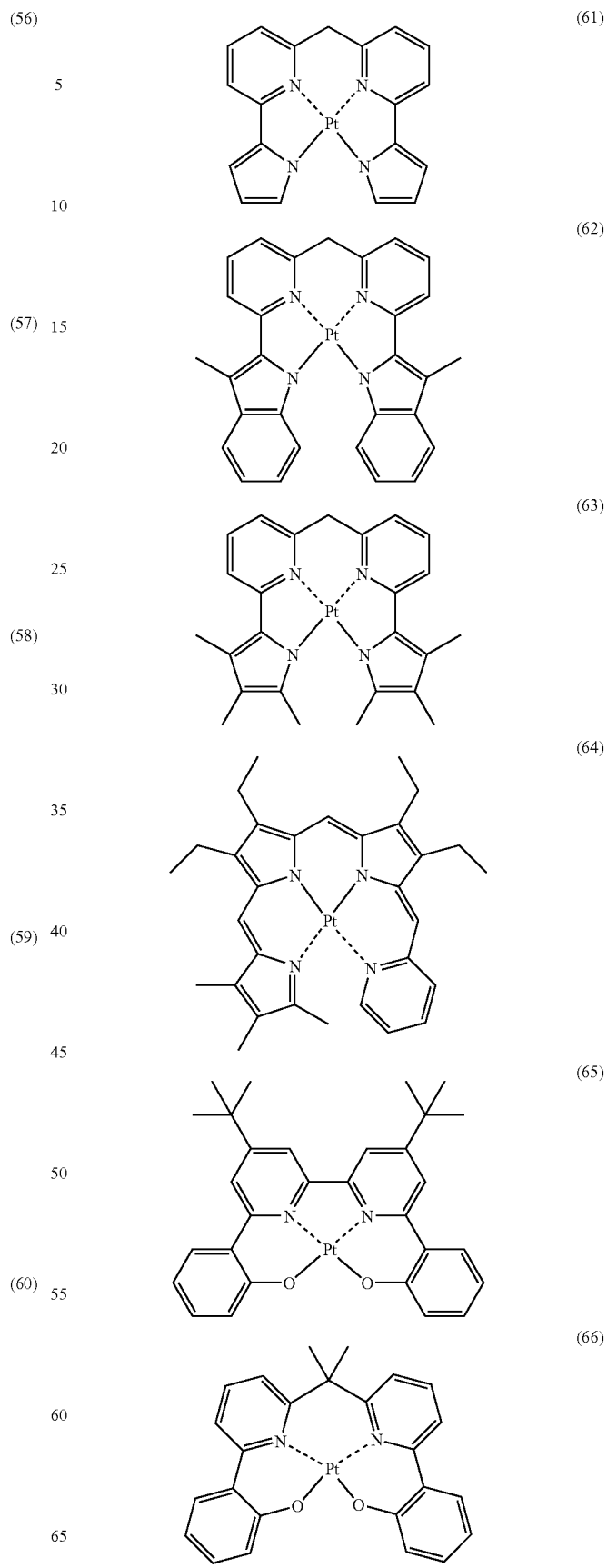

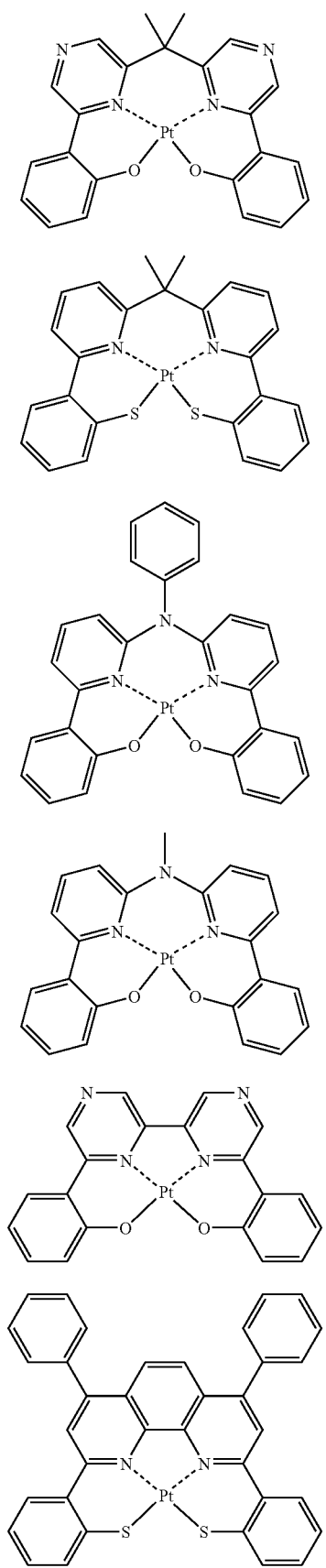
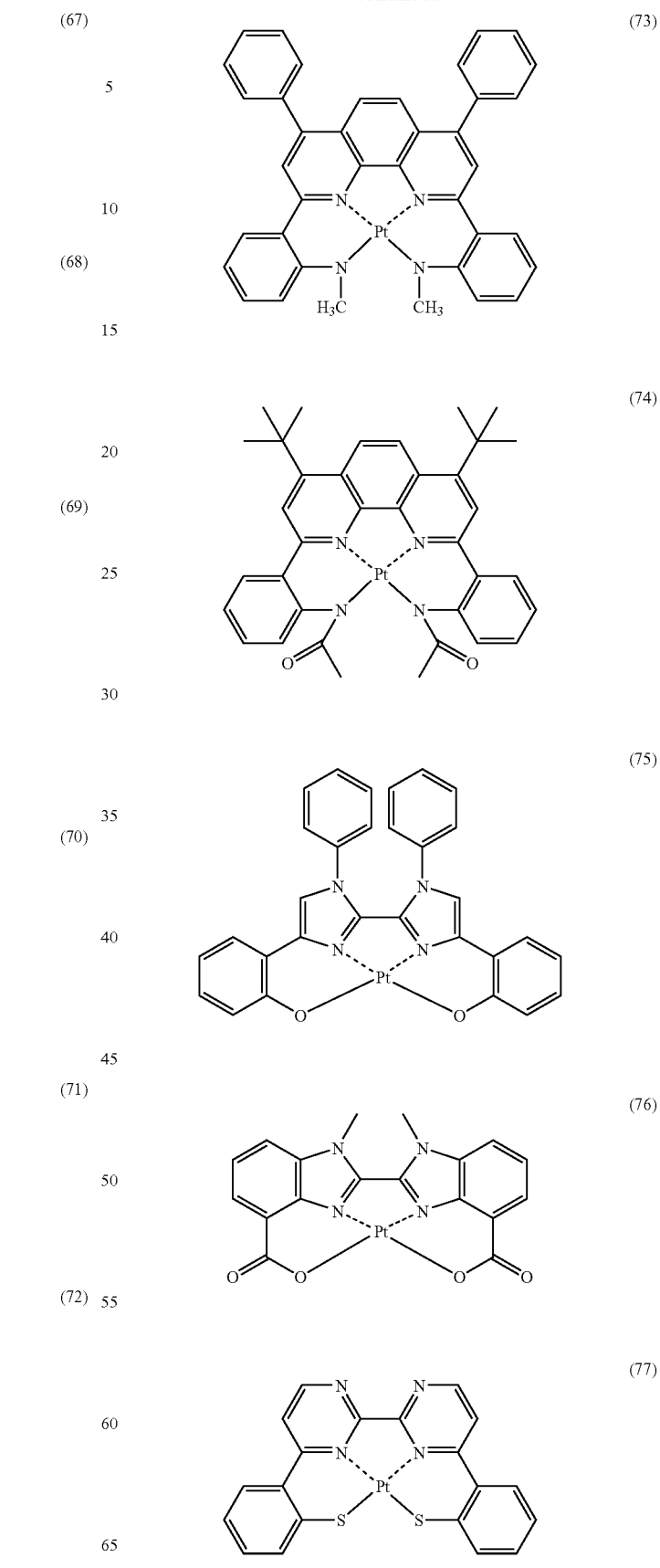

(78) 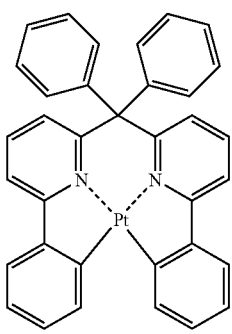
(79) 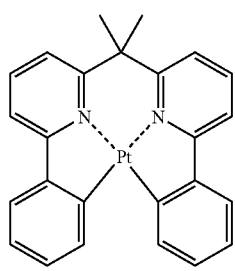
(80) 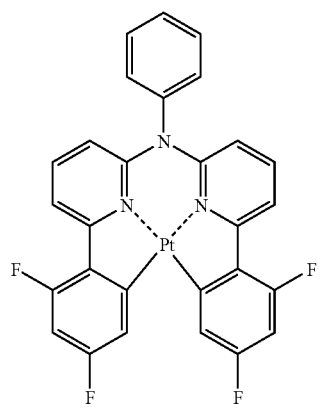
(81) 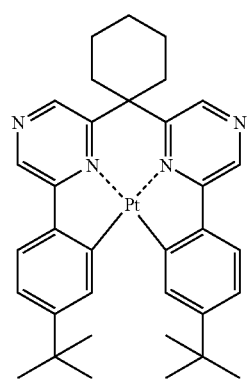
(82) 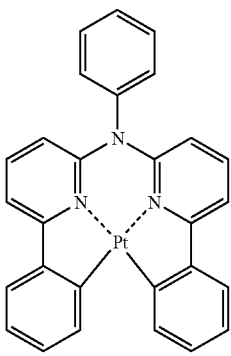
(83) 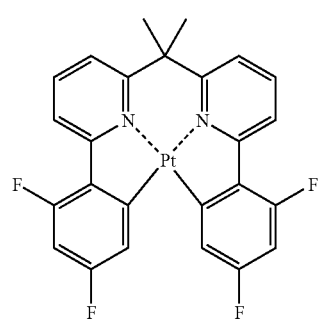
(84) 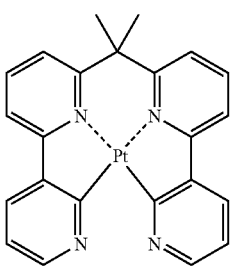
(85) 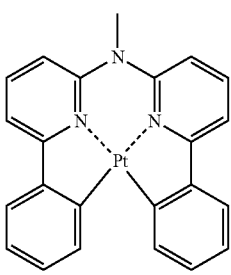
(86) 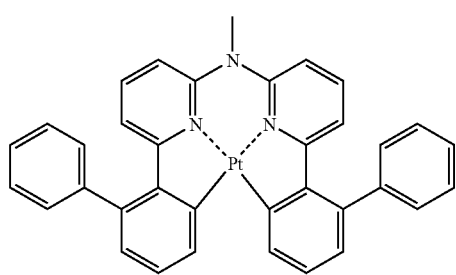

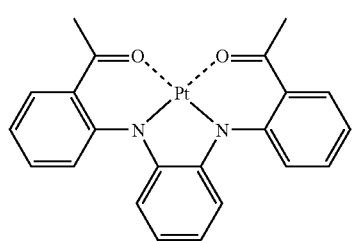(87)
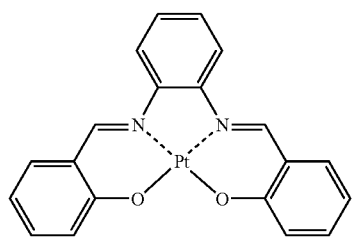(88)
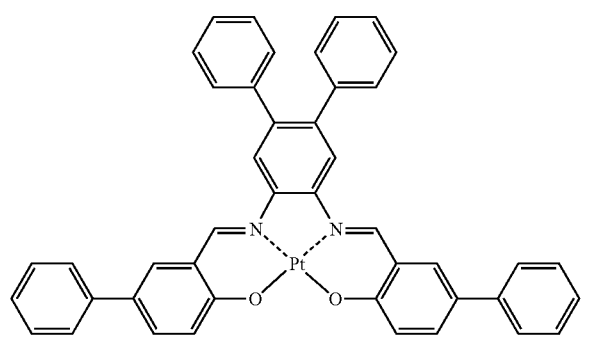(89)
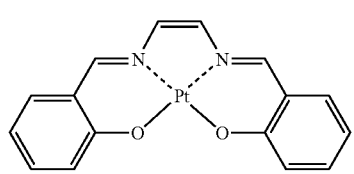(90)
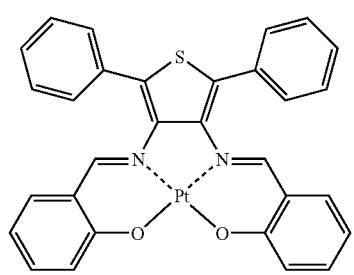(91)
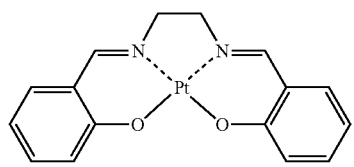(92)
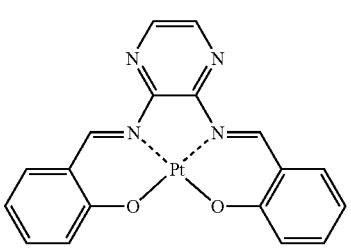(93)
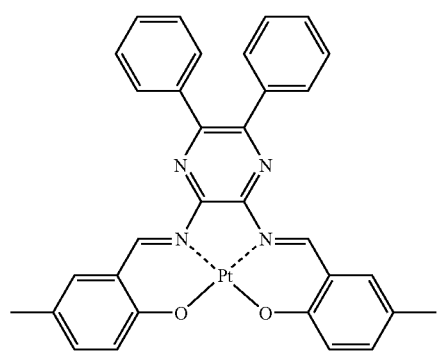(94)
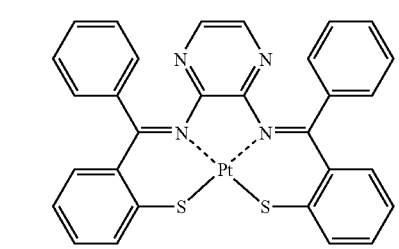(95)
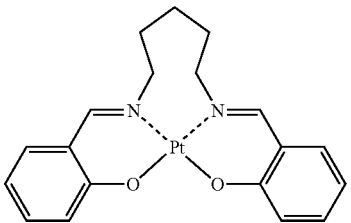(96)
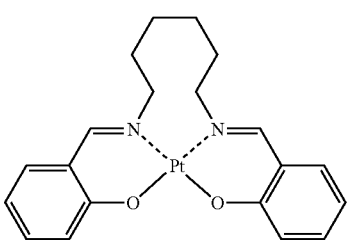(97)
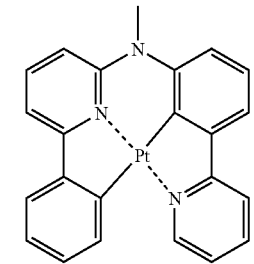(138)

(139) 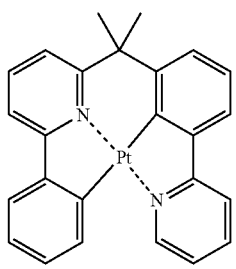
(140) 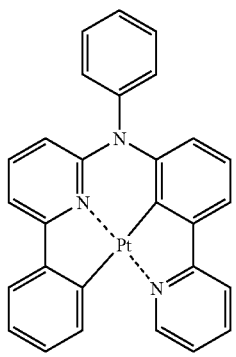
(150) 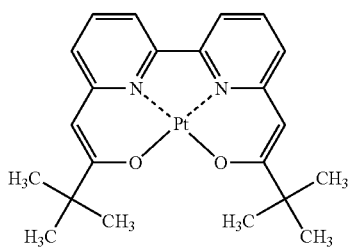
(151) 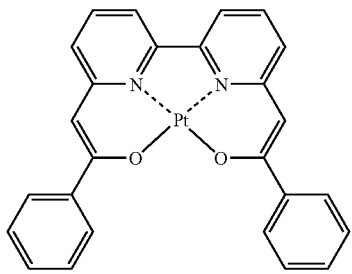
(152) 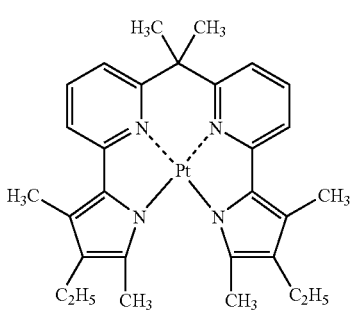
(153) 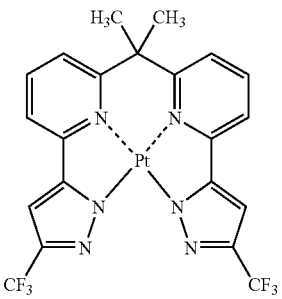
(178) 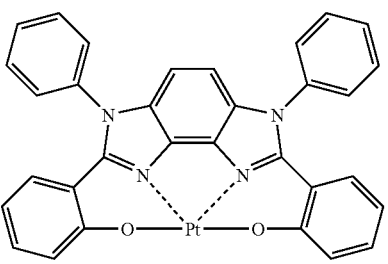
(179) 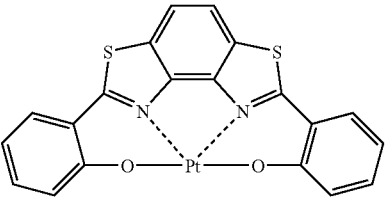
(180) 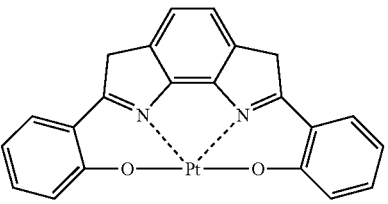
(181) 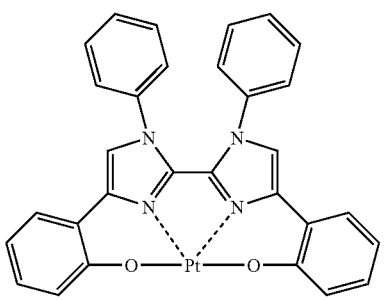
(182) 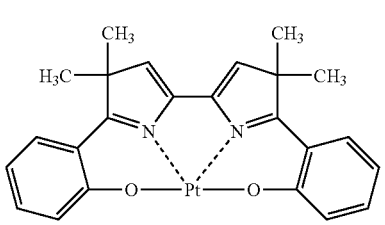

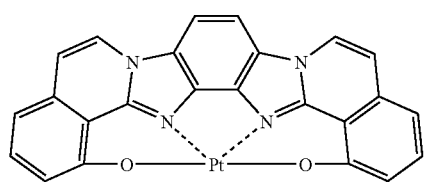 (183)
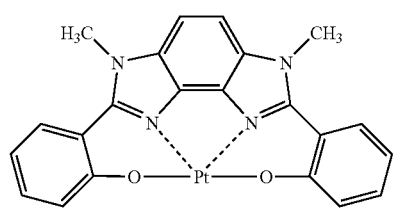 (184)
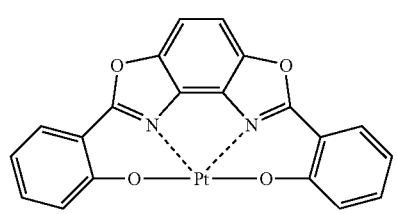 (185)
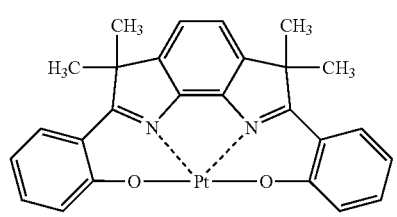 (186)
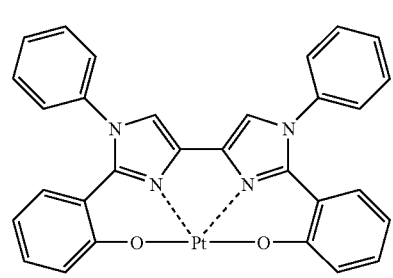 (187)
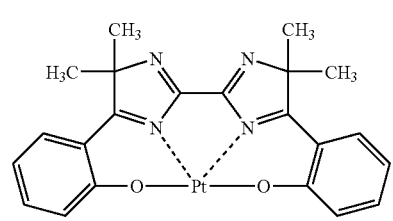 (188)
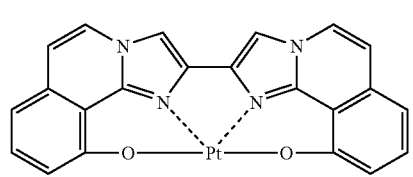 (189)
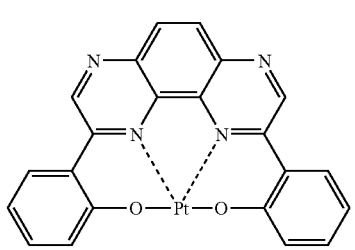 (190)
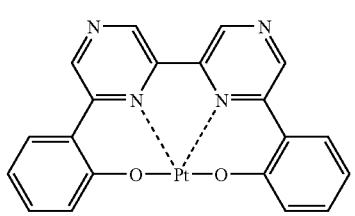 (191)
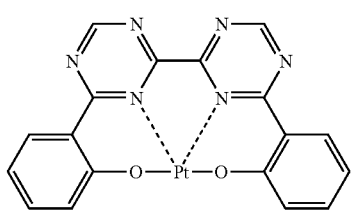 (192)
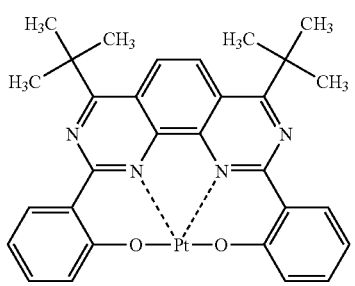 (193)
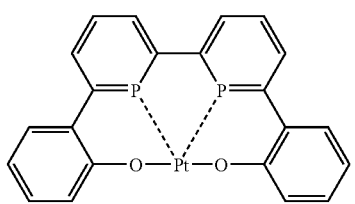 (194)
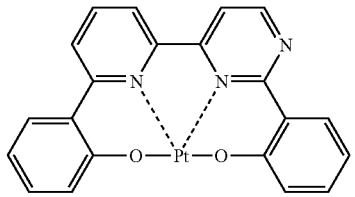 (195)
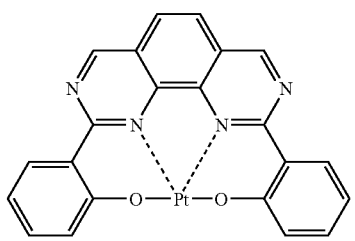 (196)

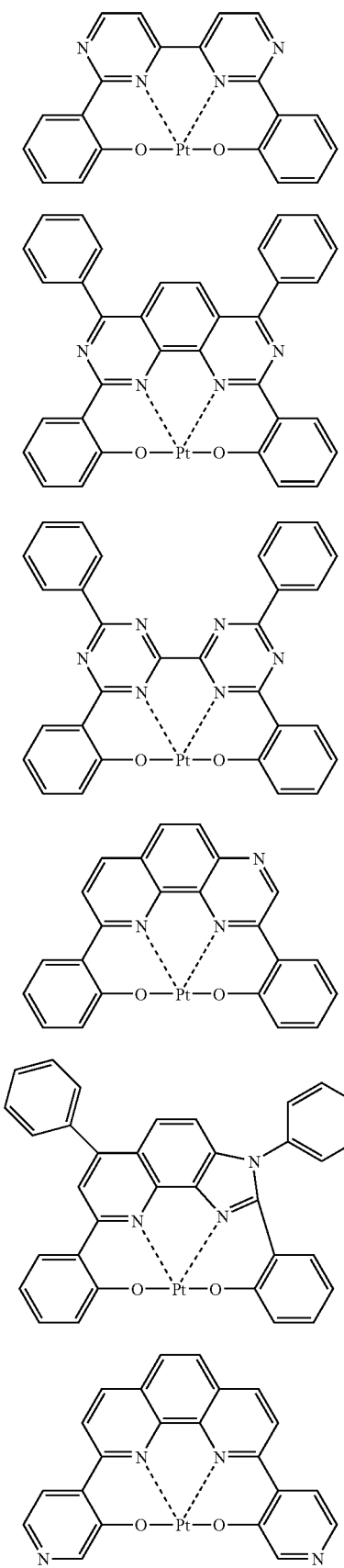
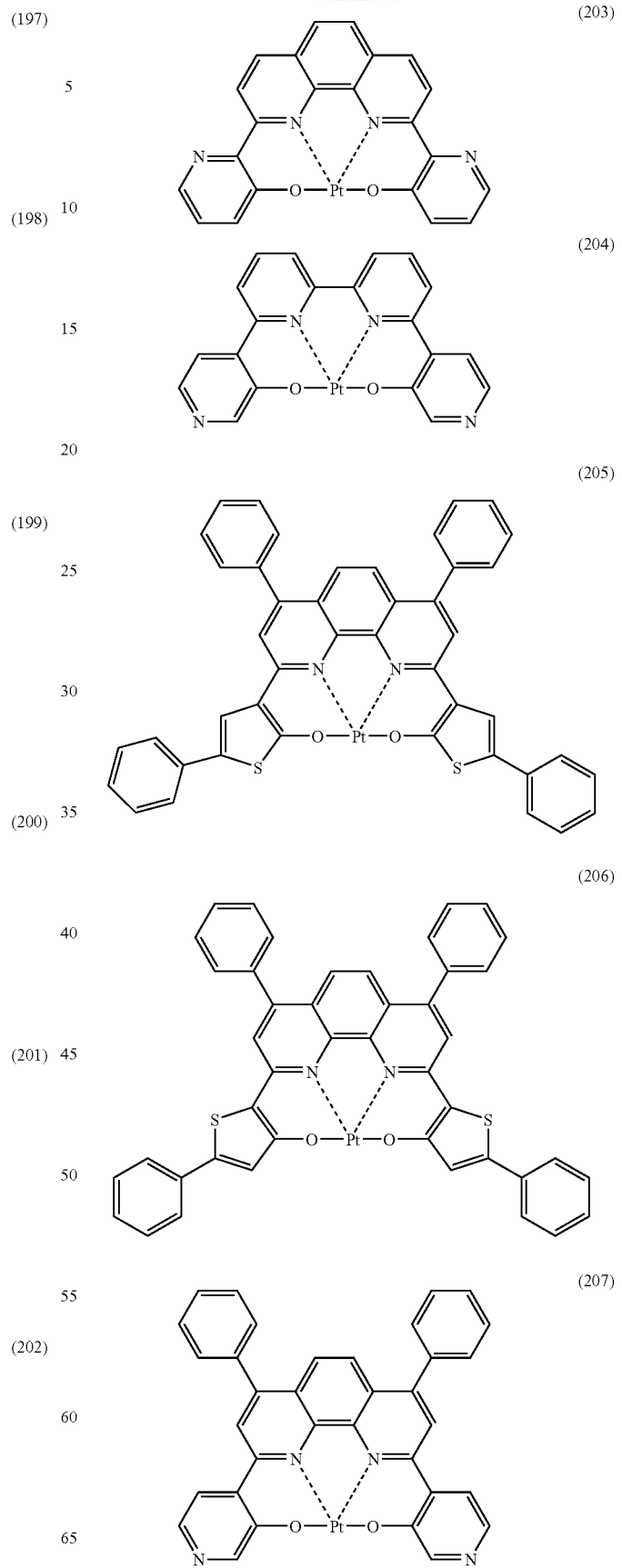

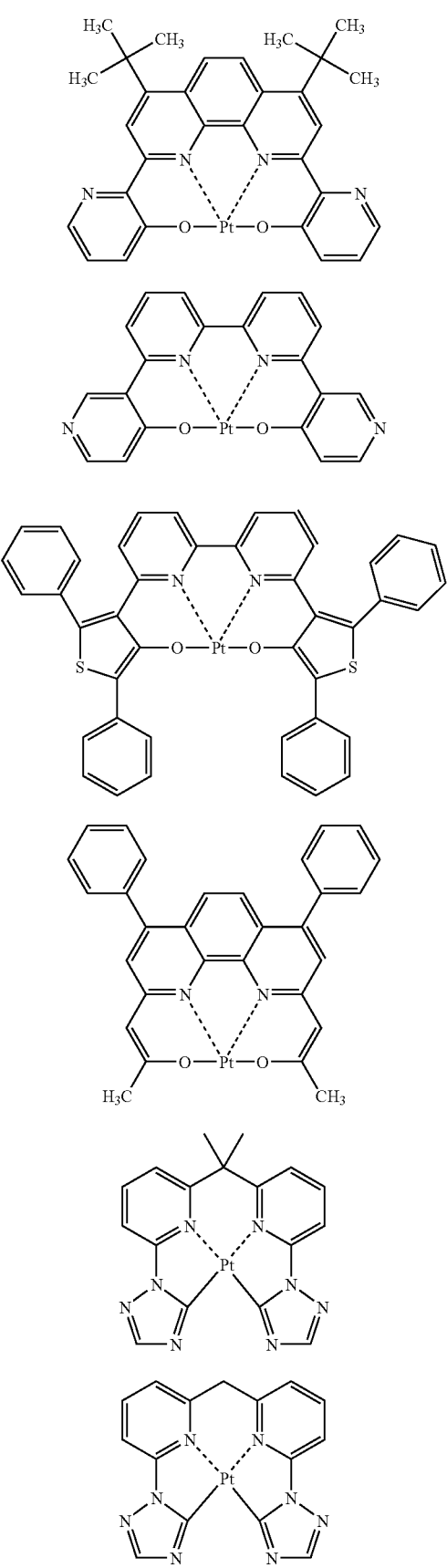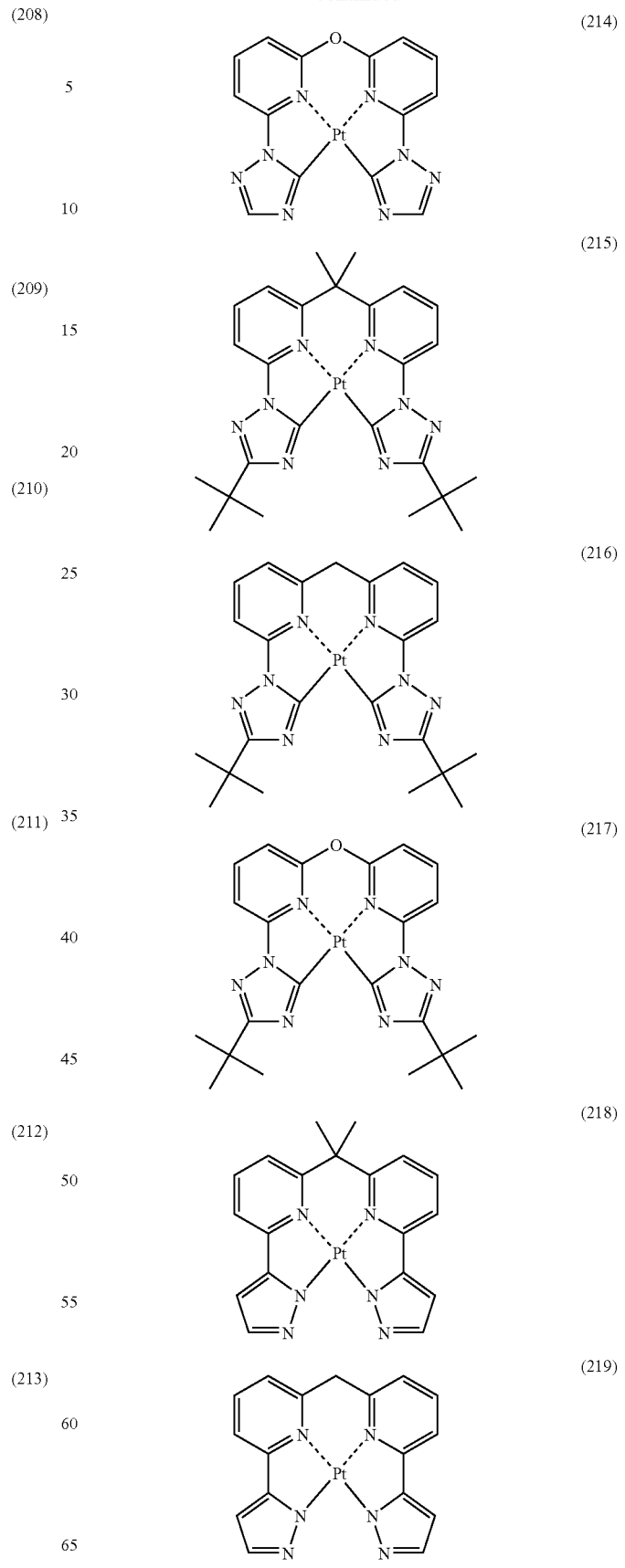

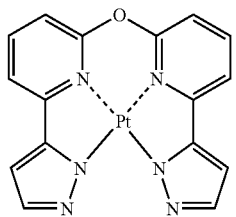
(220)
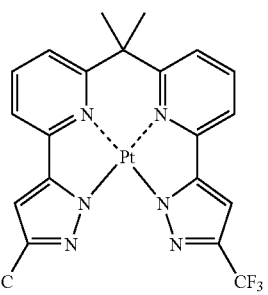
(221)
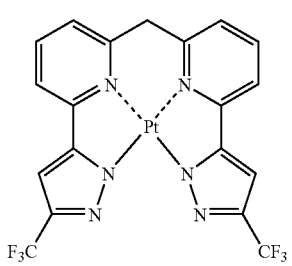
(222)
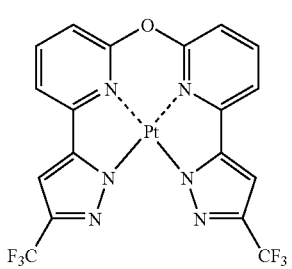
(223)
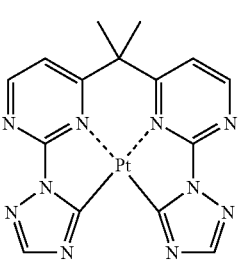
(224)
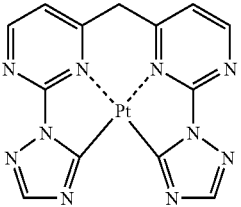
(225)
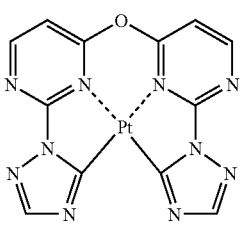
(226)
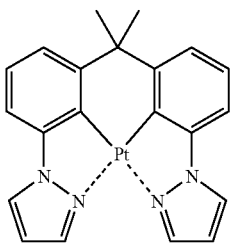
(227)
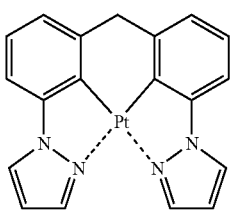
(228)
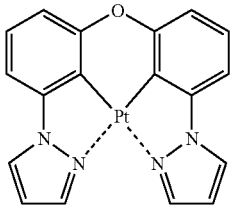
(229)
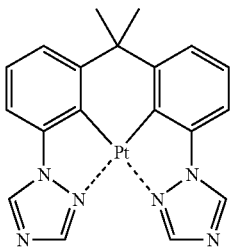
(230)
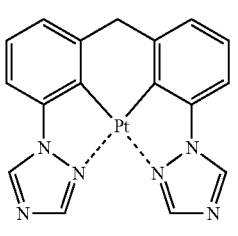
(231)
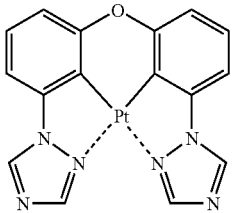
(232)

(233)
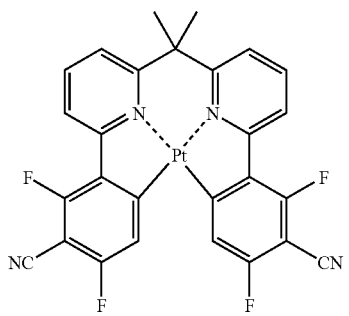
(234)
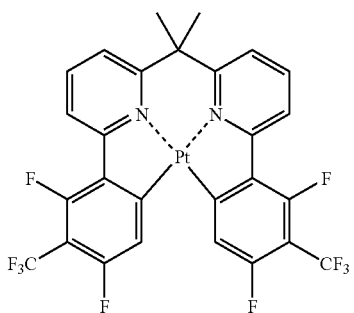
(235)
(236)
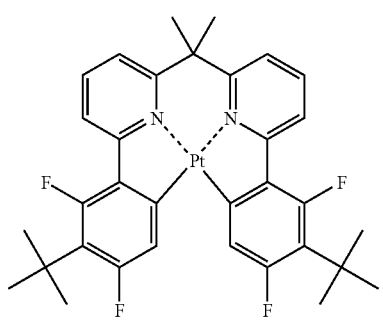
(237)
(238)
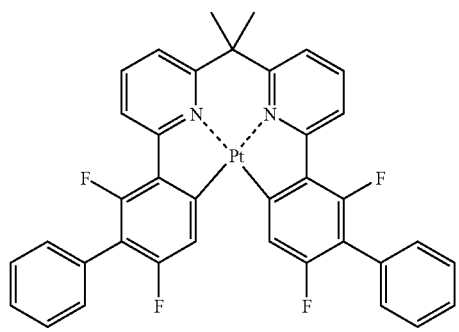
(239)
(240)
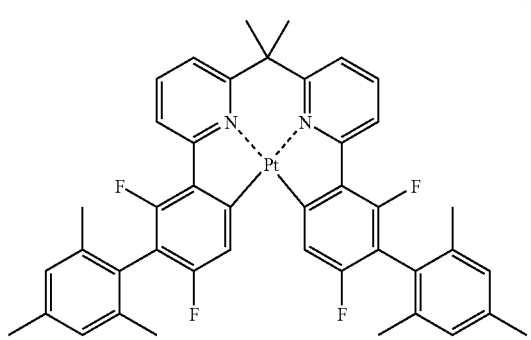
(241)

(242) 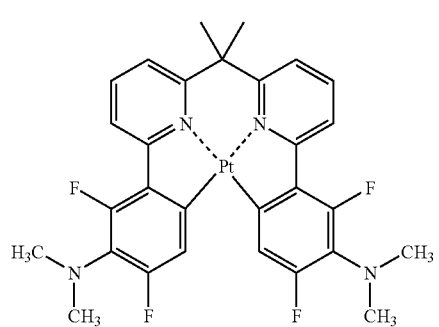
(243) 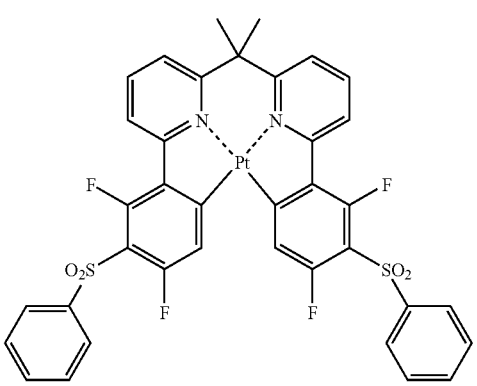
(244)
(245) 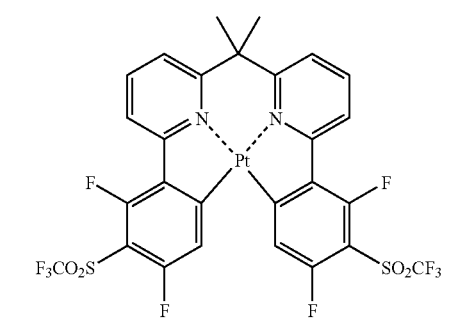
(246) 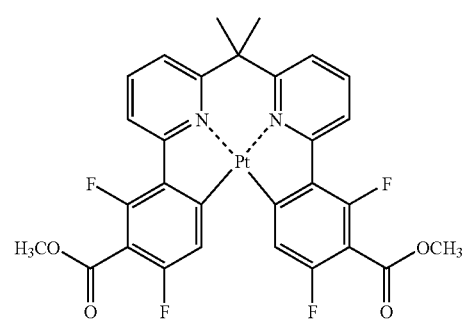
(247) 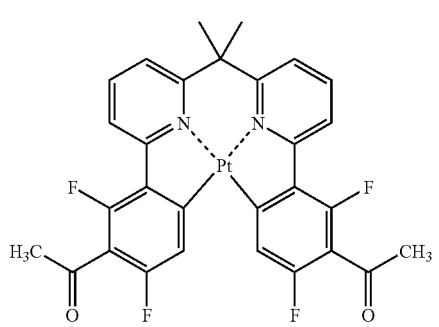
(248) 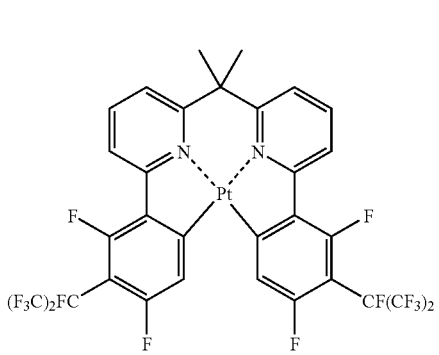
(249) 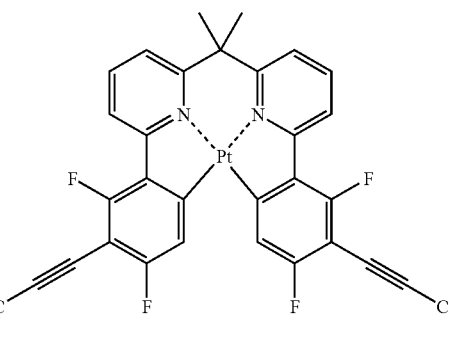
(250) 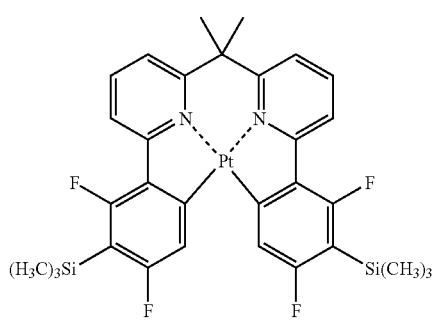
(251) 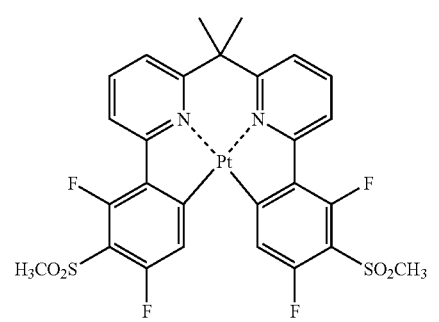

(252)
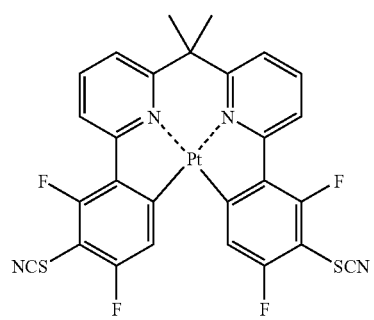
(253)
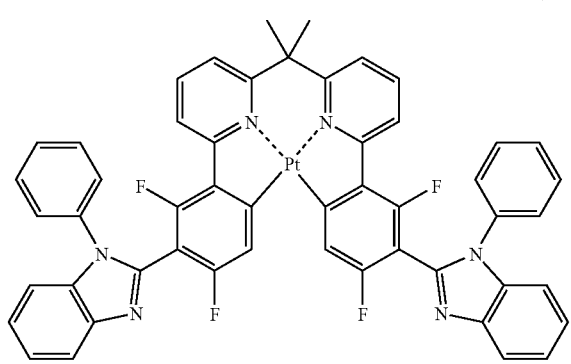
(254)
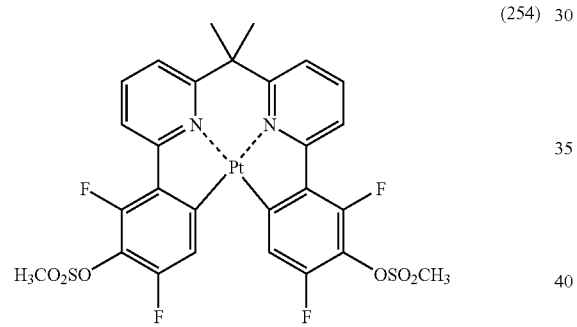
(255)
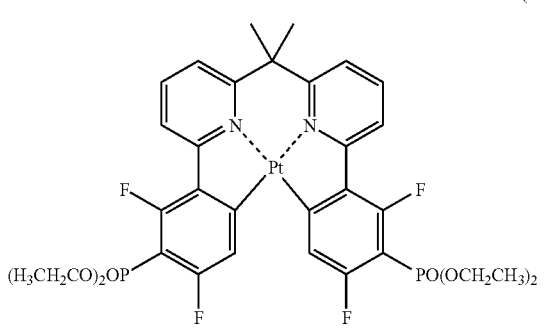
(256)
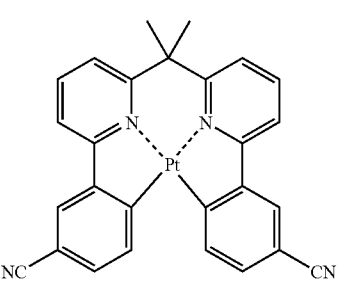
(257)
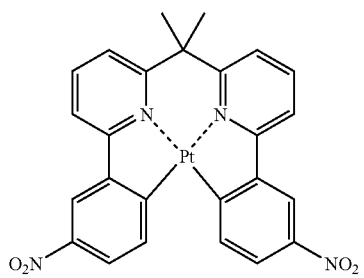
(258)
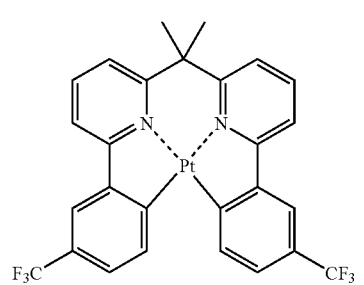
(259)
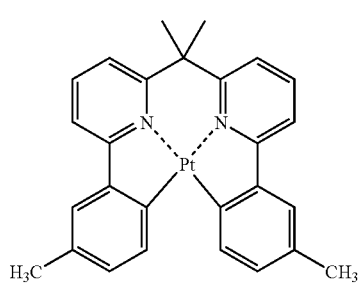
(260)
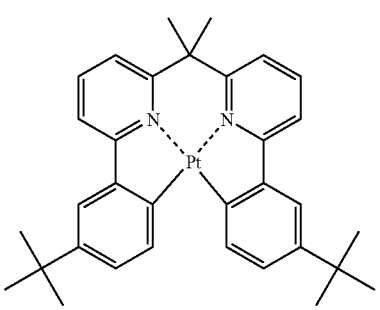
(261)
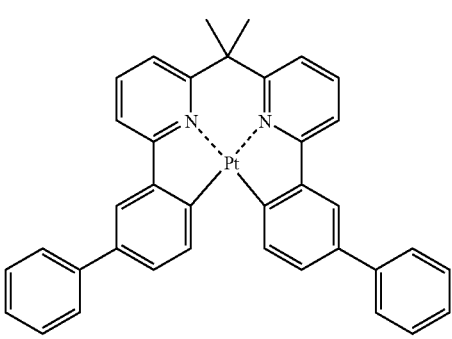

(262)
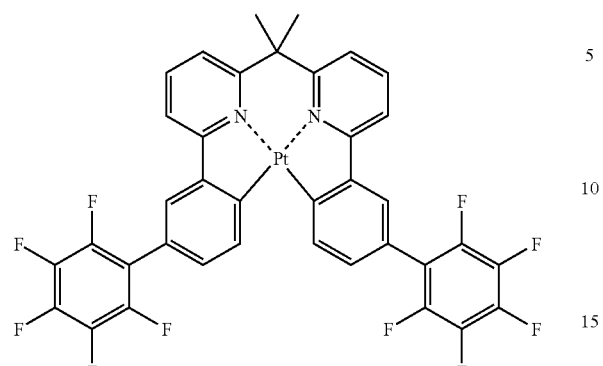
(263)
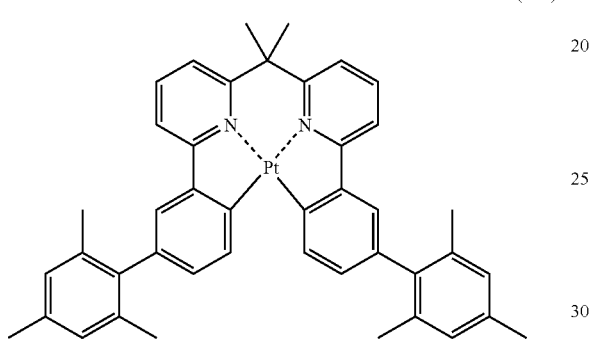
(264)
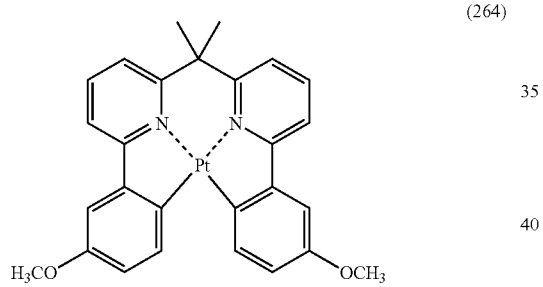
(265)
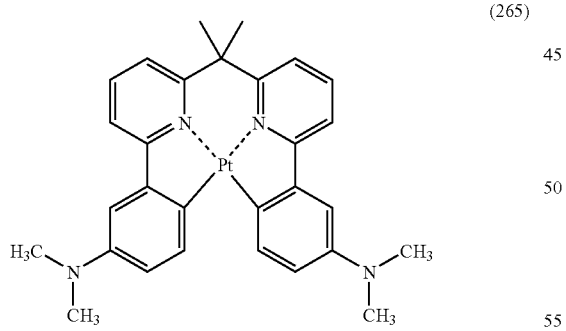
(266)
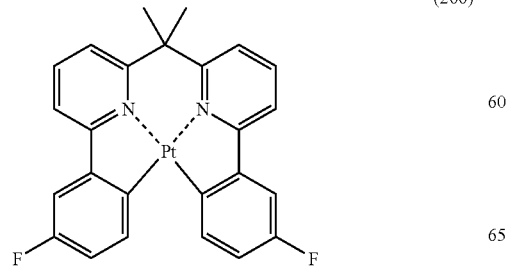
(267)
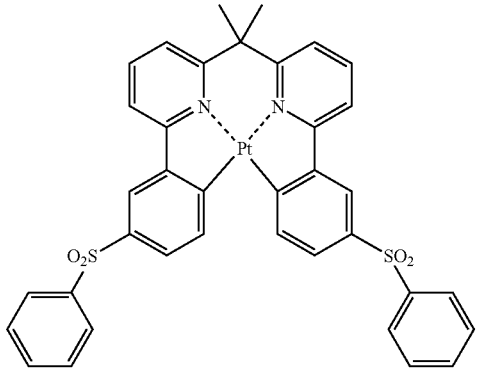
(268)
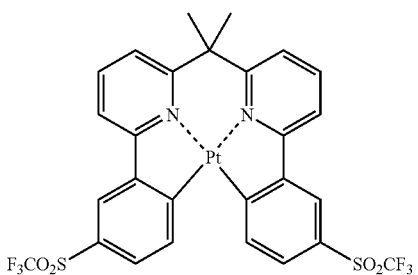
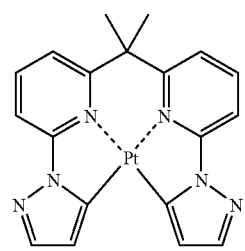
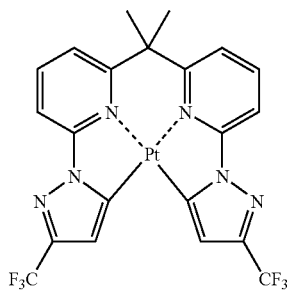
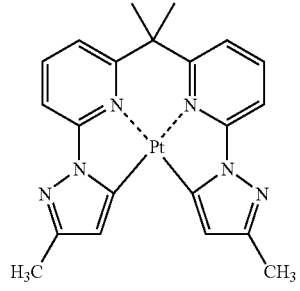

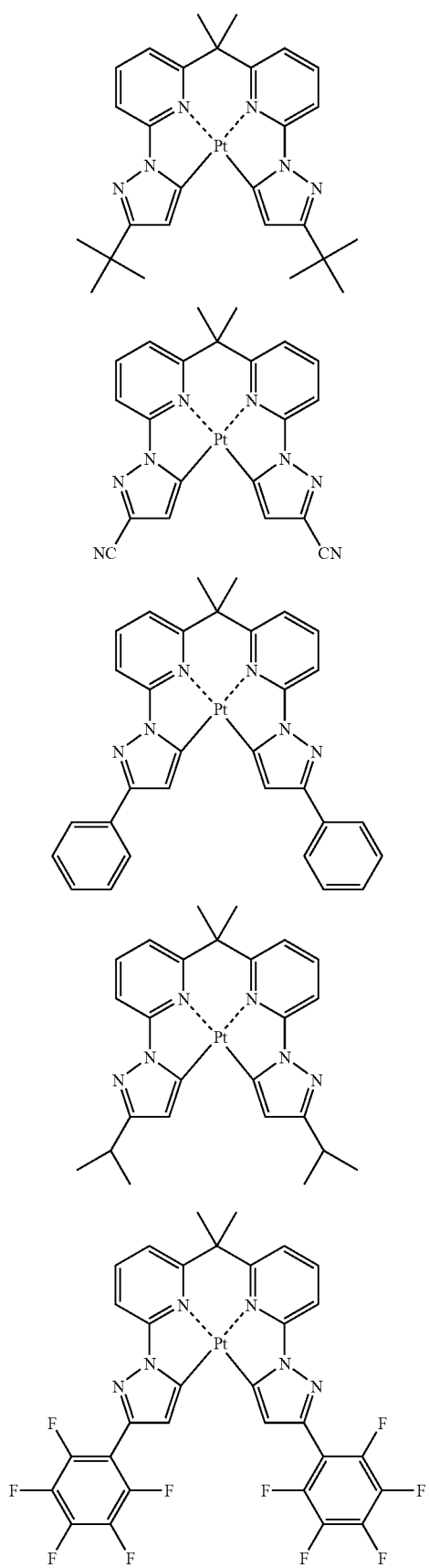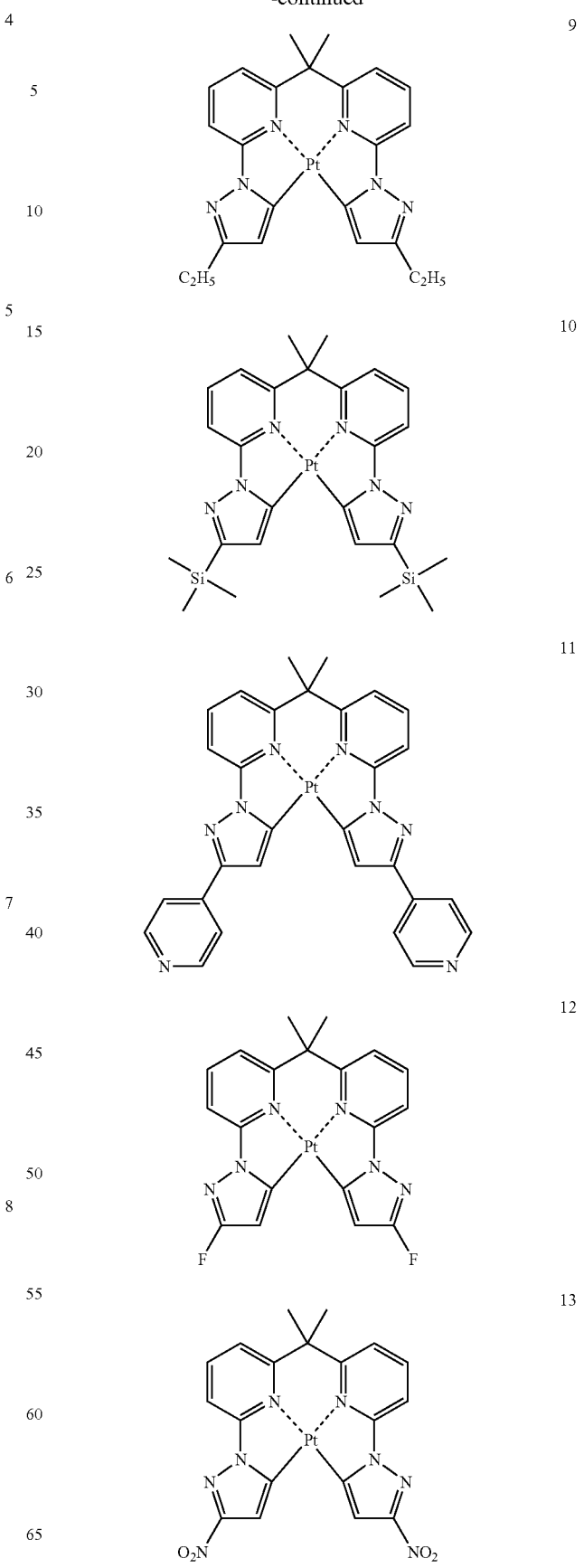

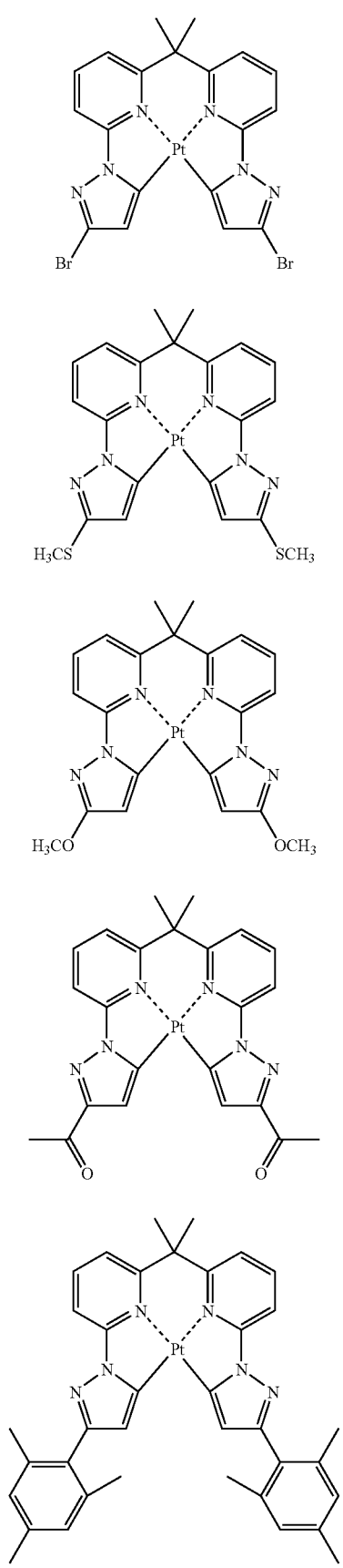
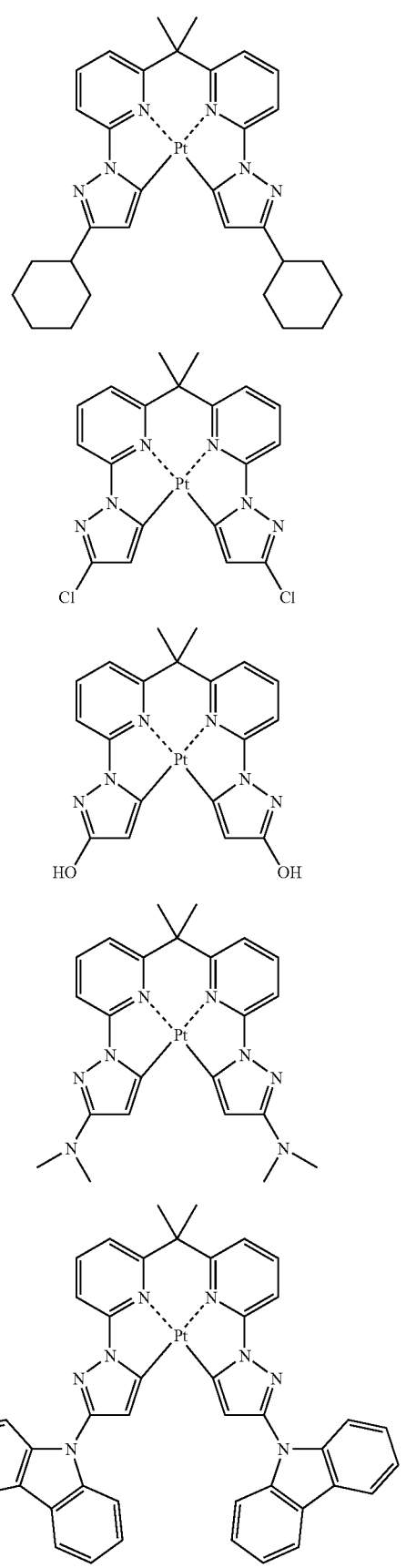

24
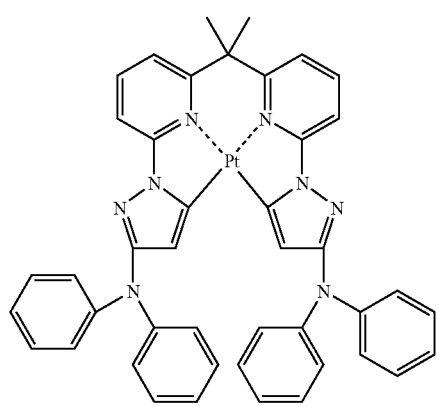
25
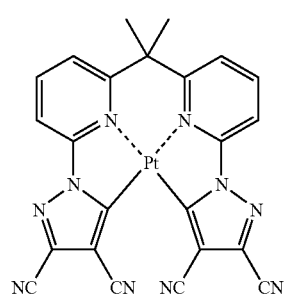
26
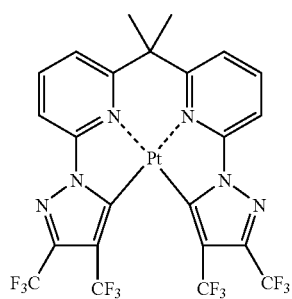
27
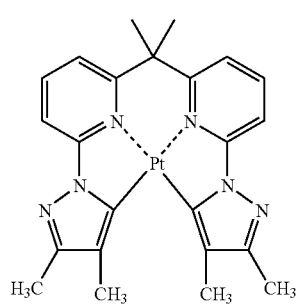
28
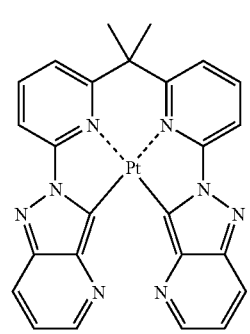
29
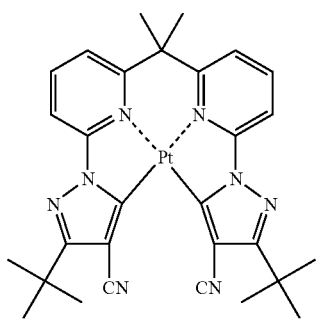
30
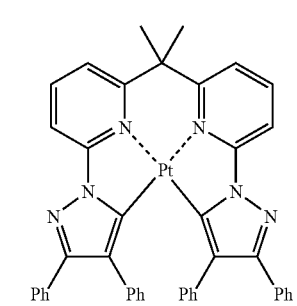
31
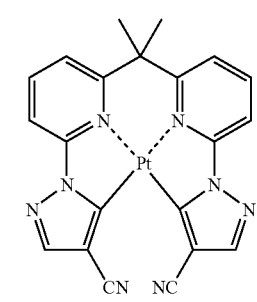
32
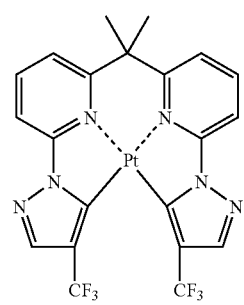
33
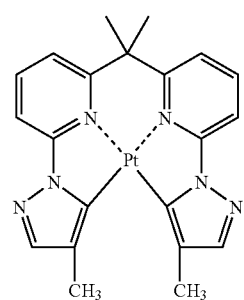

-continued
34
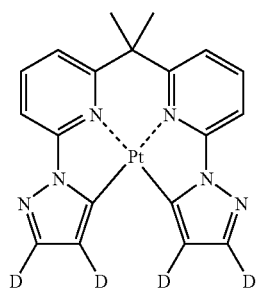
35
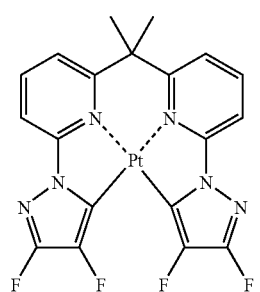
36
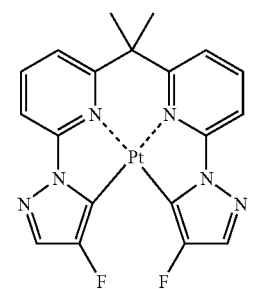
37
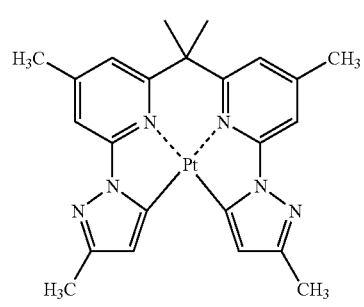
38
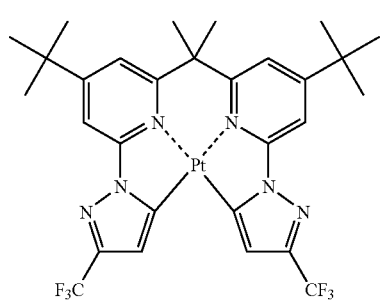
-continued
39
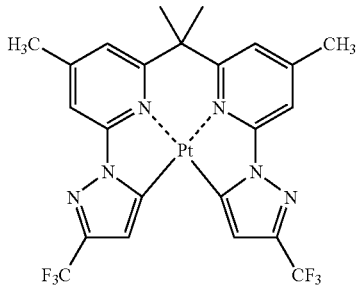
40
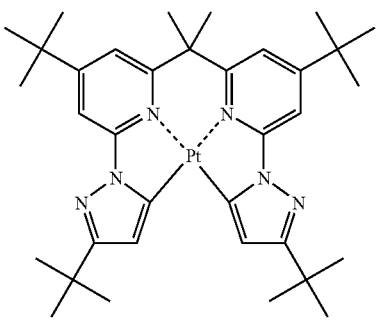
41
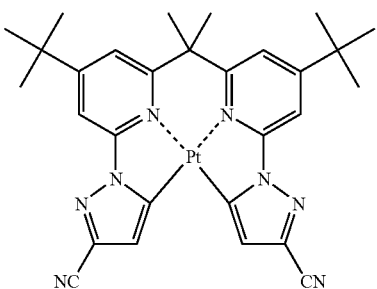
42
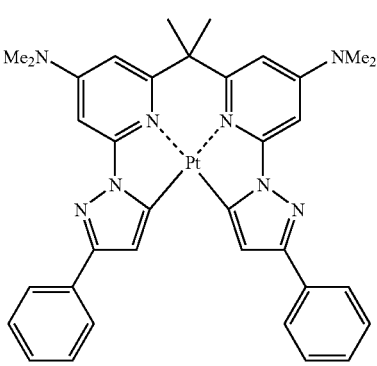
43

44
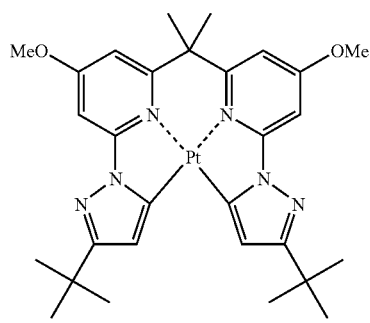
45
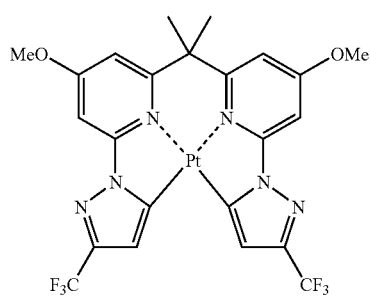
46
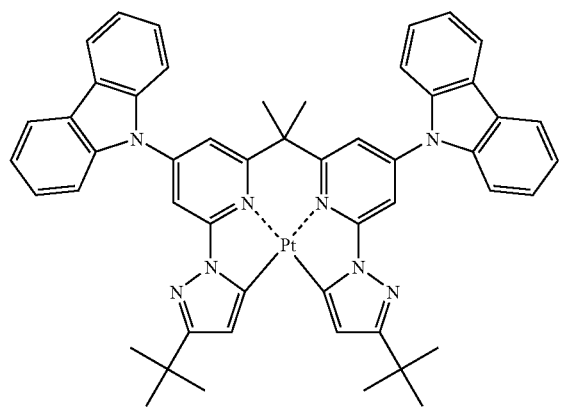
47
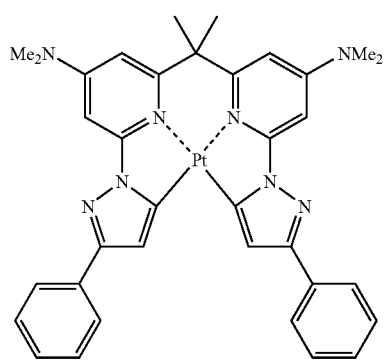
48
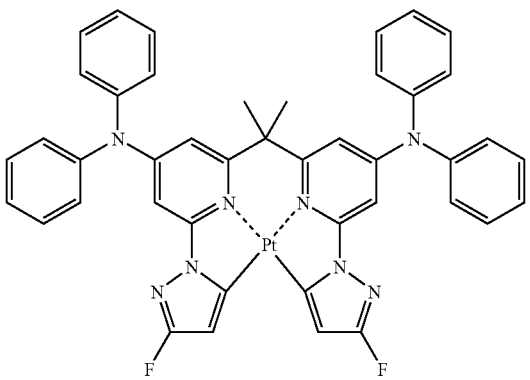
49
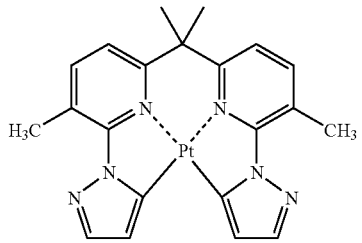
50
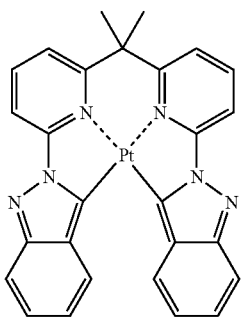
51
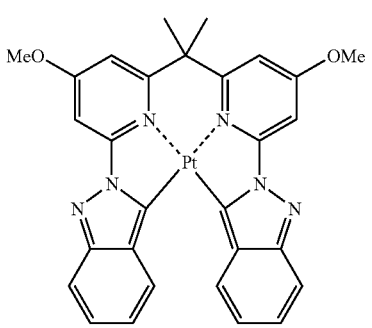
52
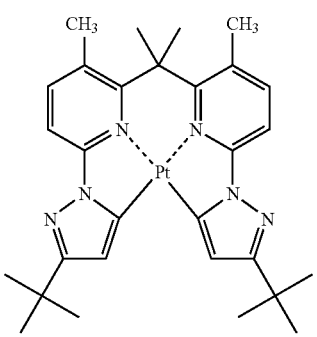

53
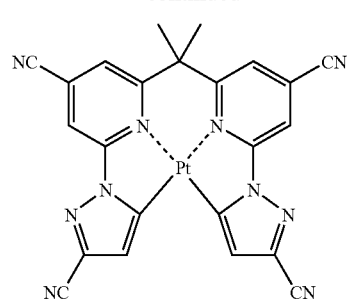
54
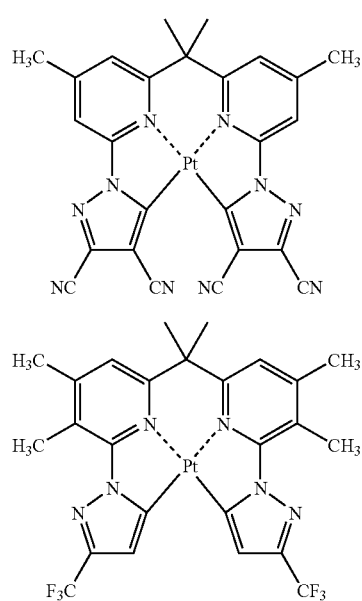
55
56
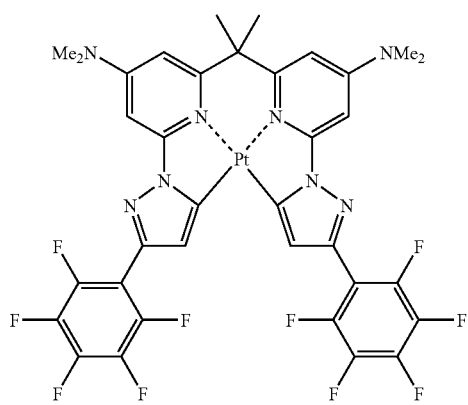
57
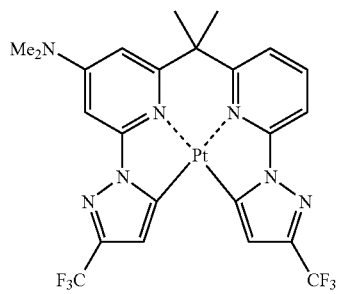
58
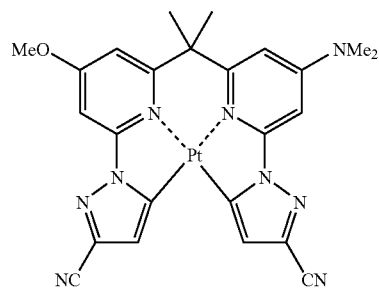
59
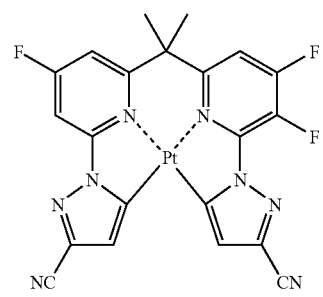
60
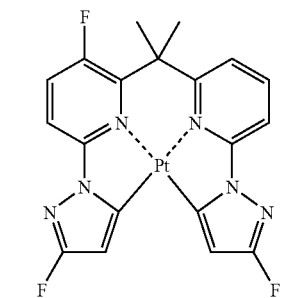
61
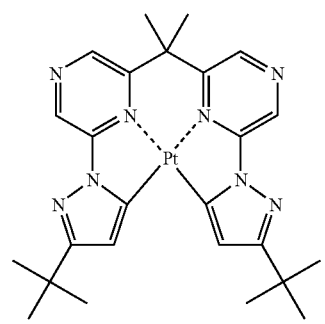
62
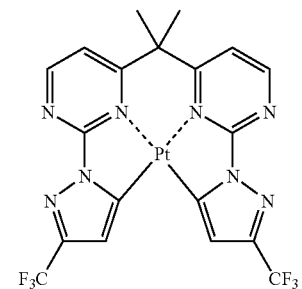

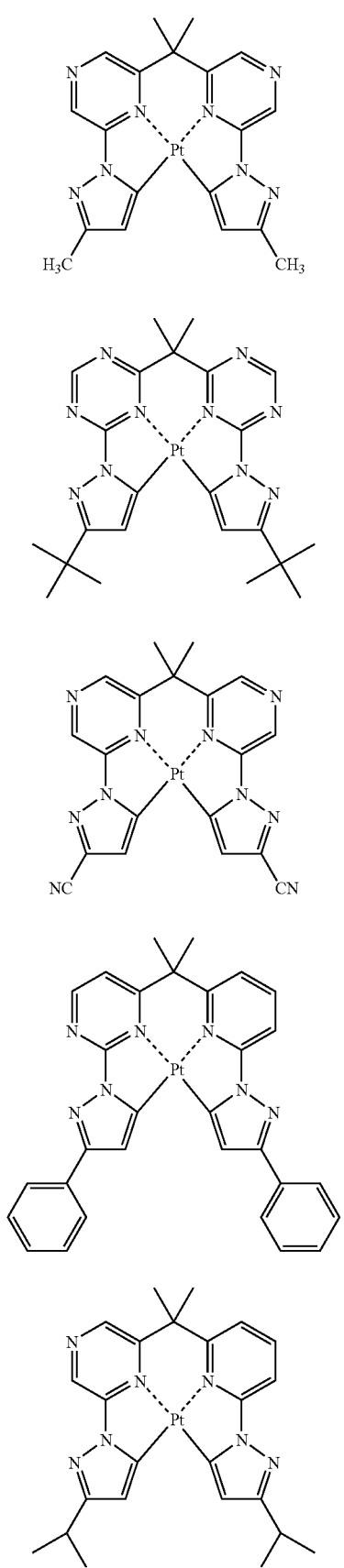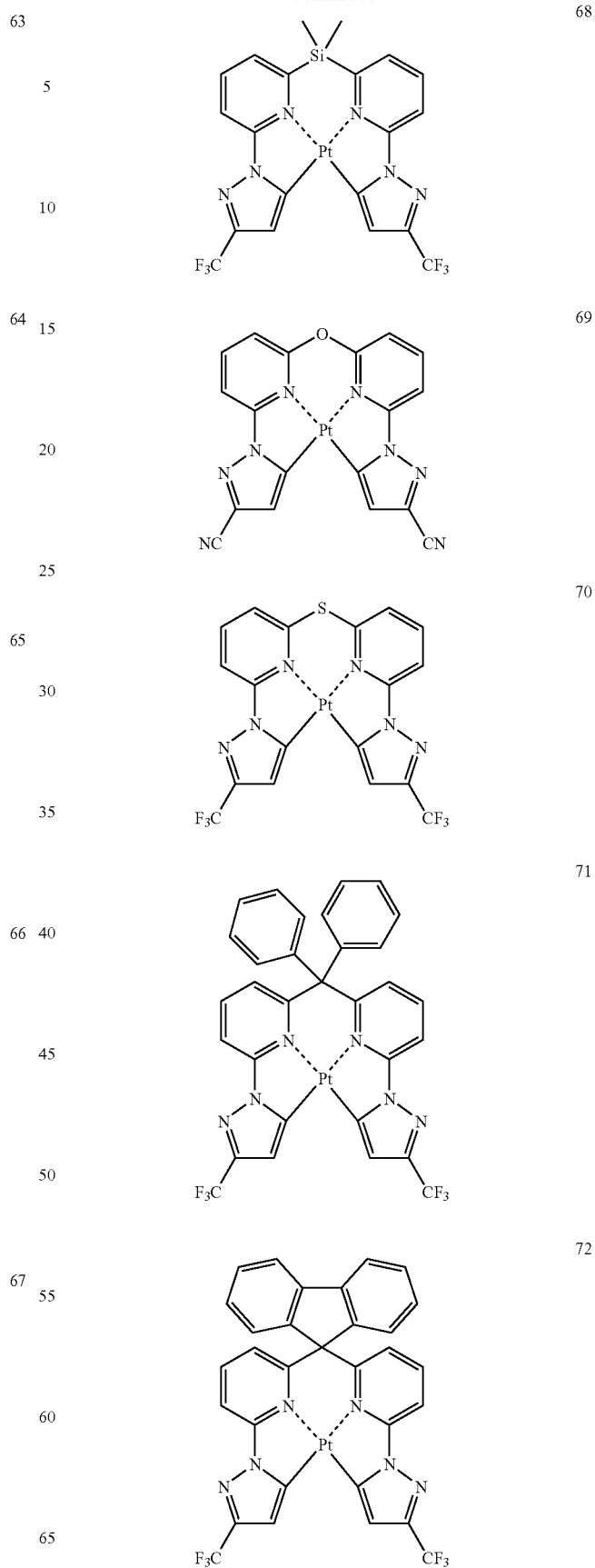

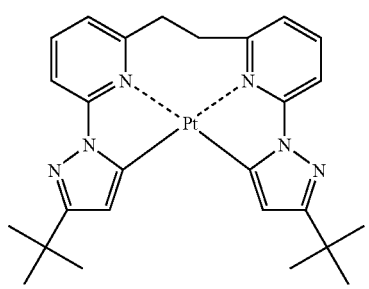
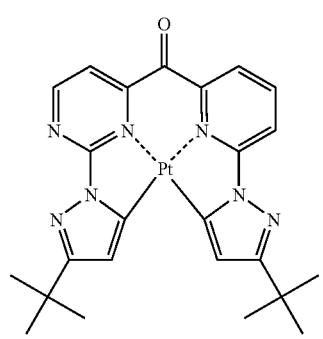
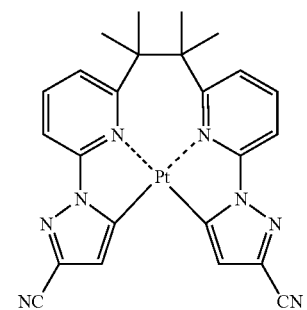
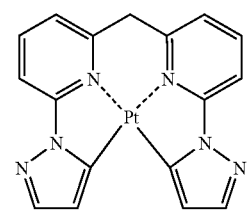
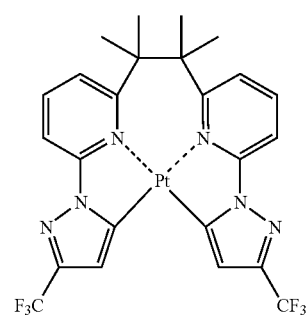
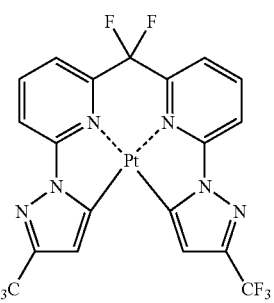
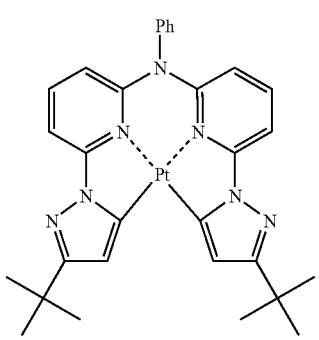
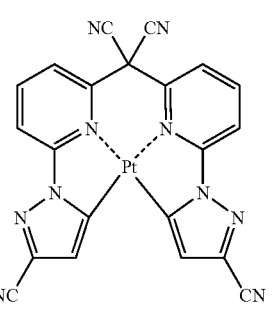
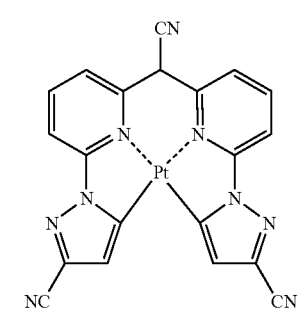
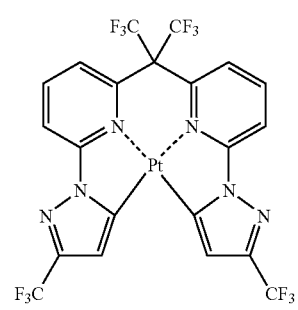

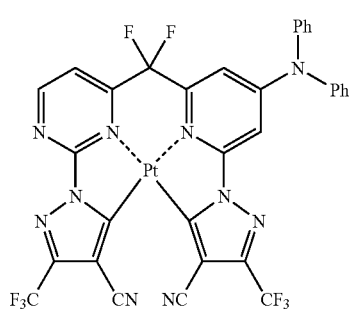
83
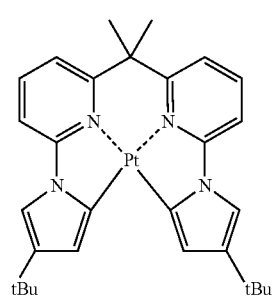
88
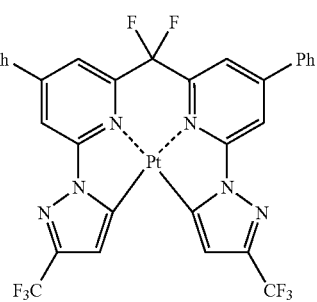
84
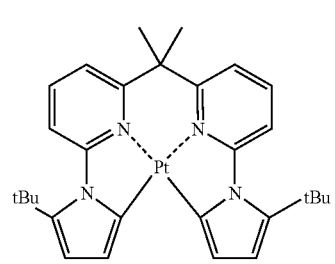
89
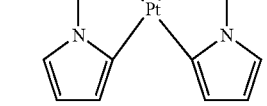
85
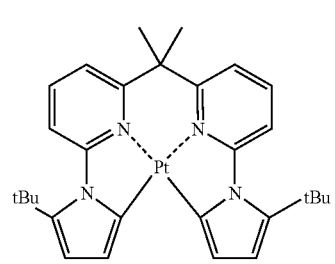
90
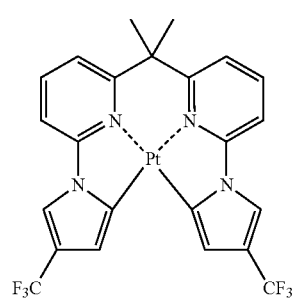
86
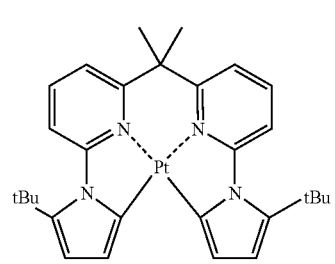
91
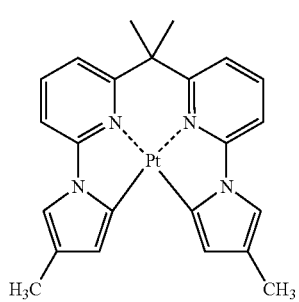
87
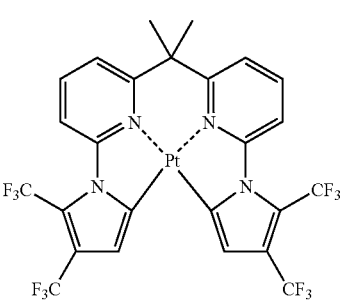
92

93 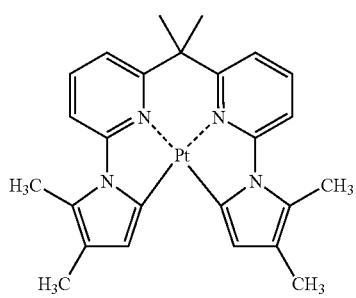
94 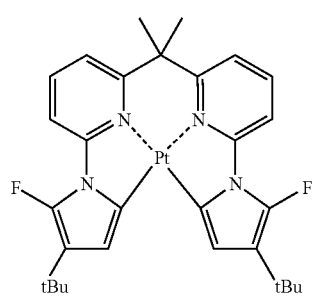
95 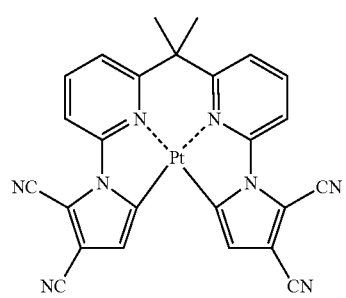
96 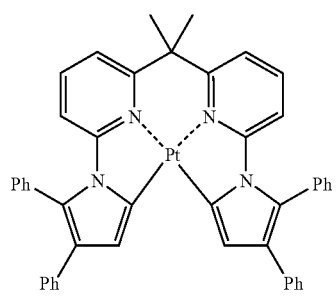
97 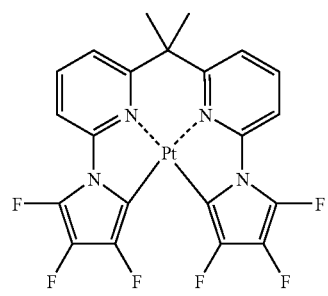
98 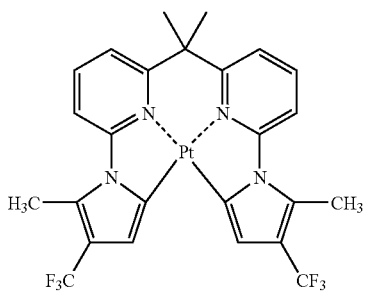
99 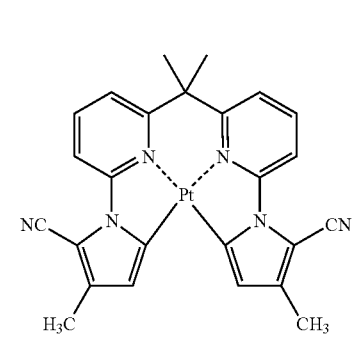
100 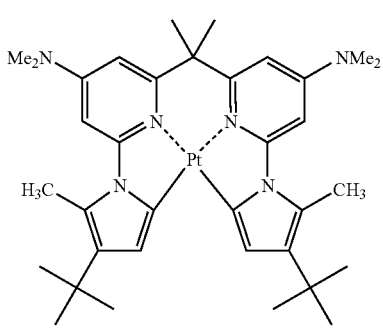
101 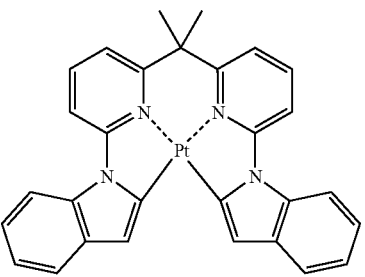
102 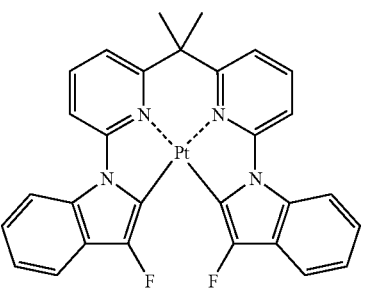

103
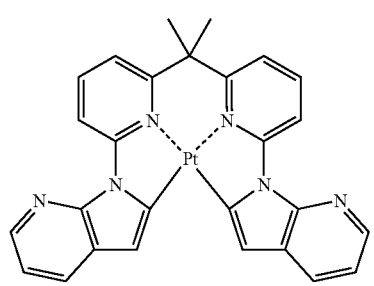
104
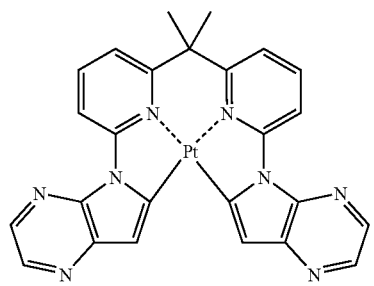
105
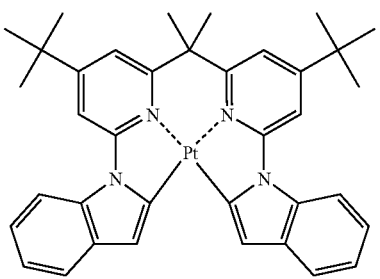
106
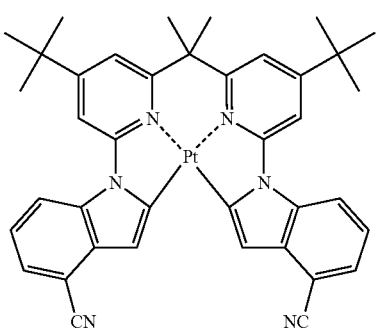
107
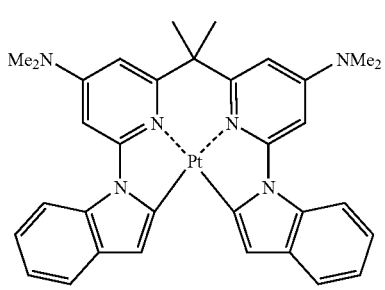
108
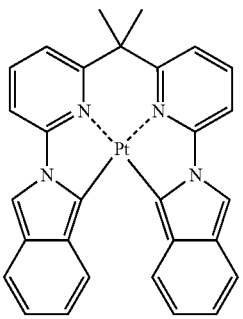
109
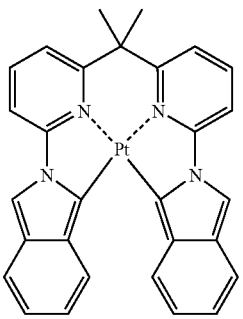
110
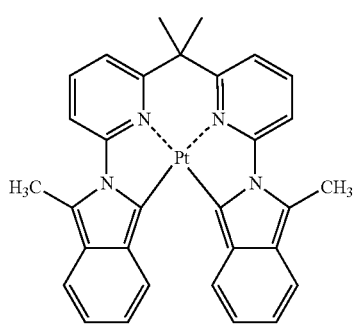
111
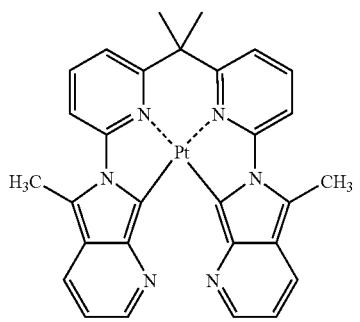
112
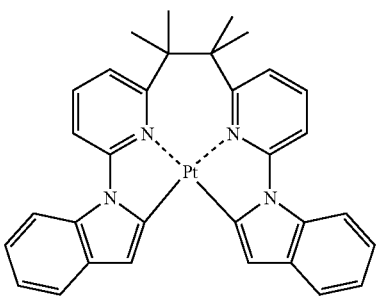

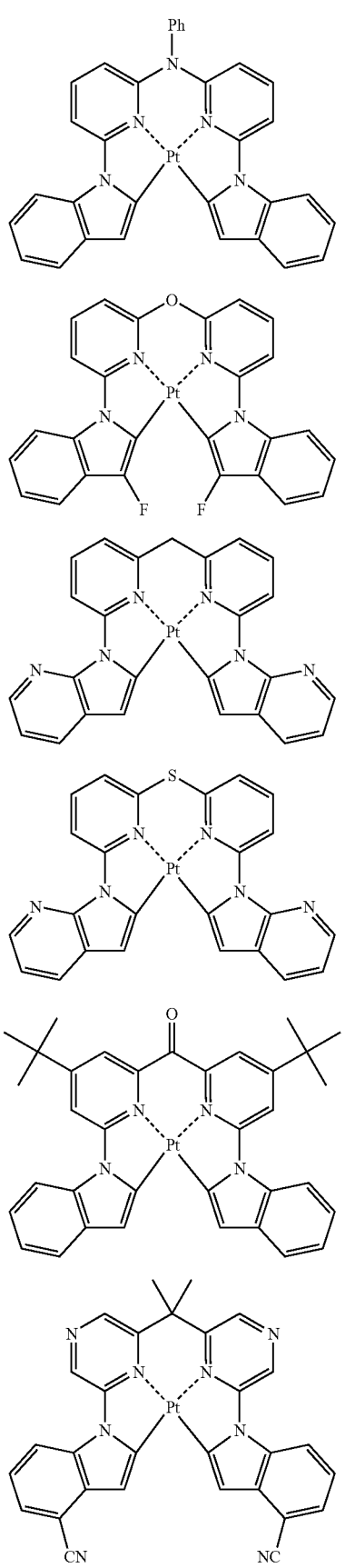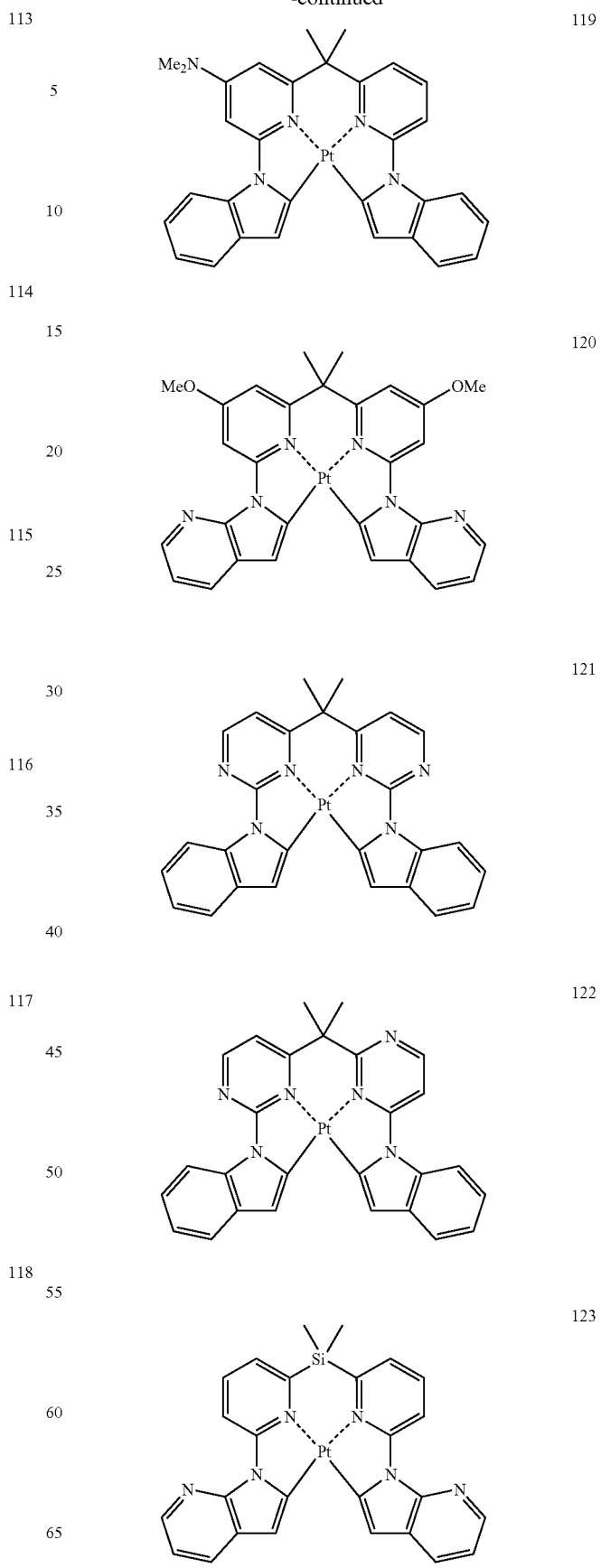

124
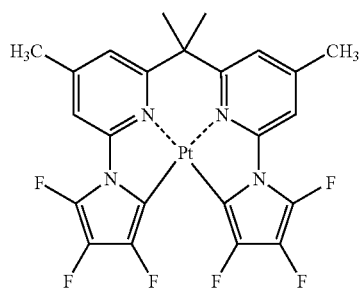
125
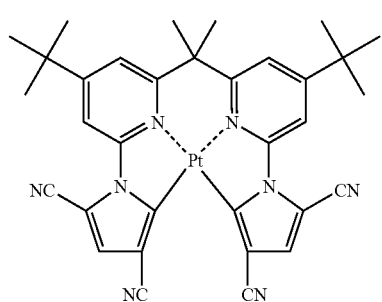
126
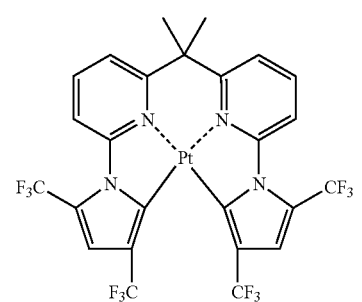
127
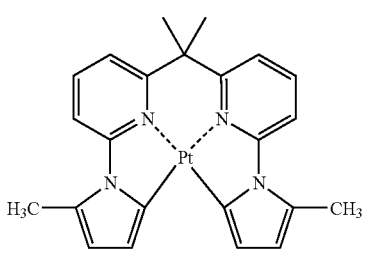
128
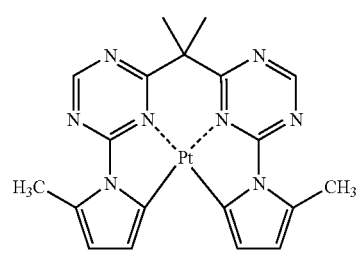
129
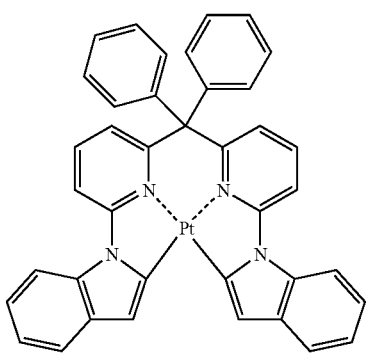
130
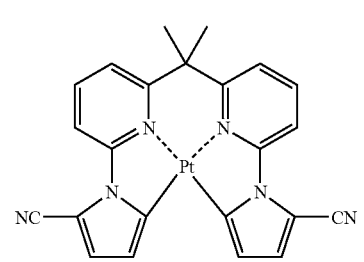
131
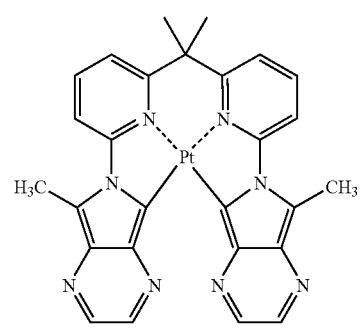
132
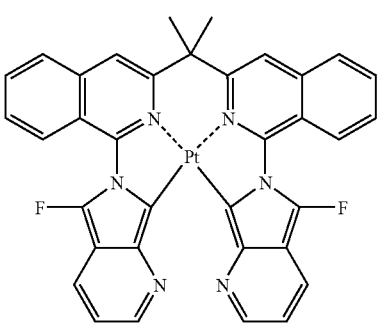
133
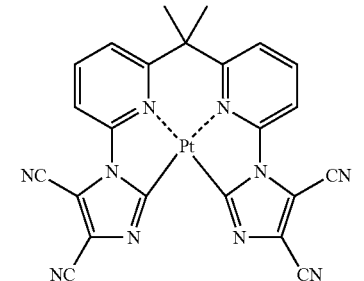

134
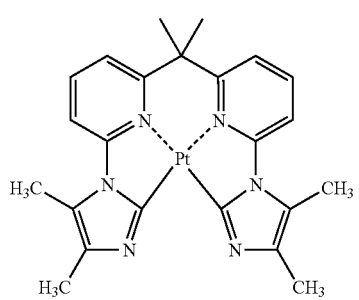
135
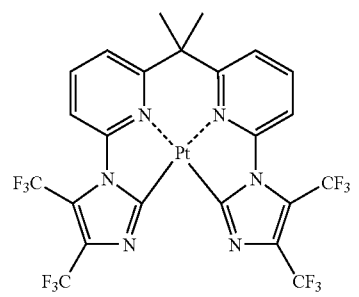
136
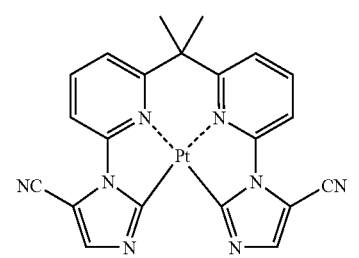
137
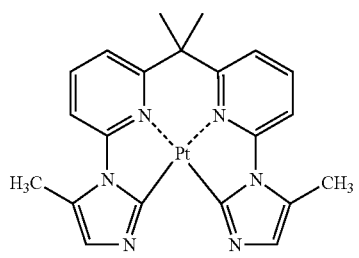
138
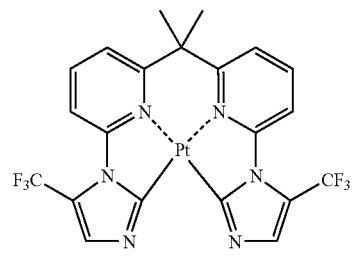
139
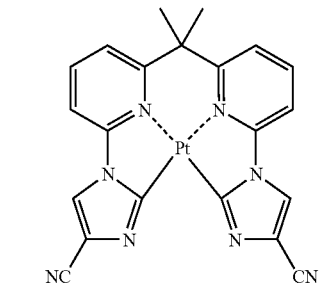
140
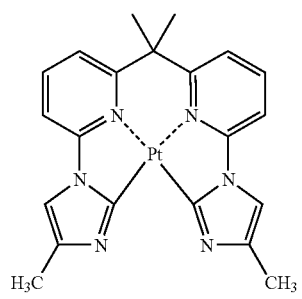
141
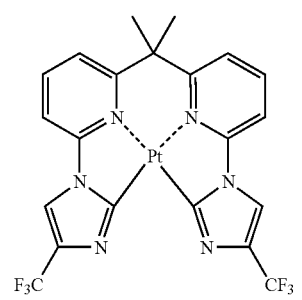
142
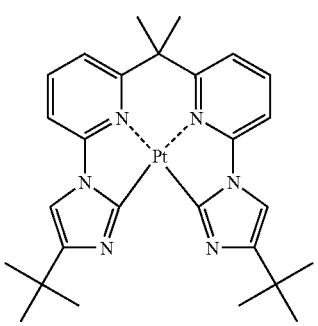
143
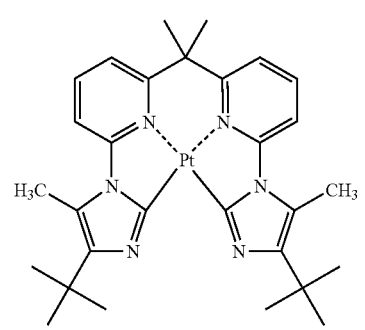
144
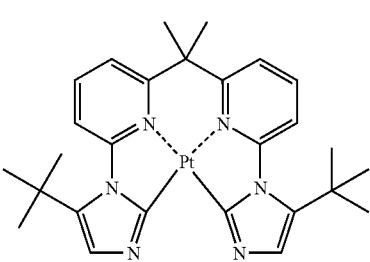

145
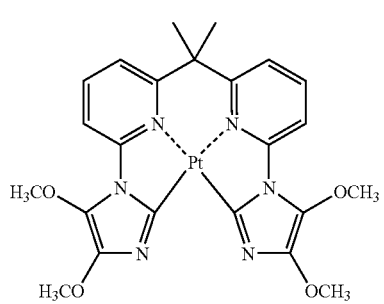
146
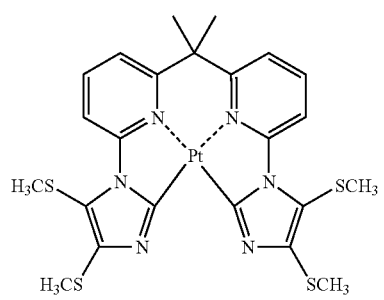
147
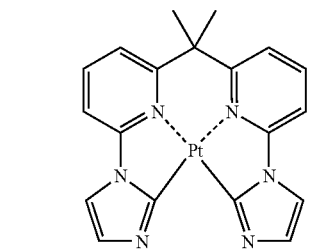
148
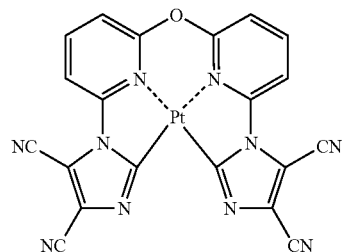
149
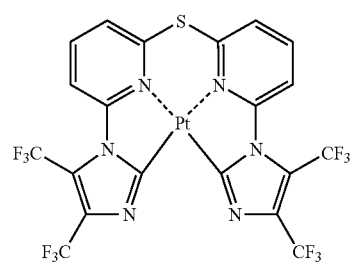
150
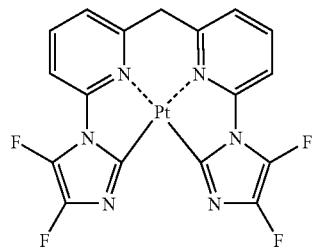
151
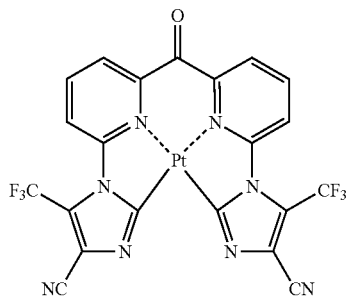
152
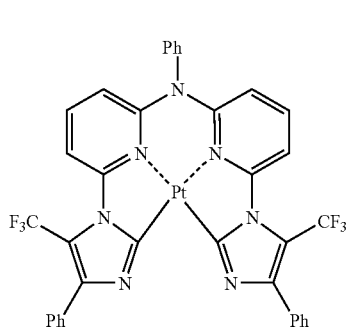
153
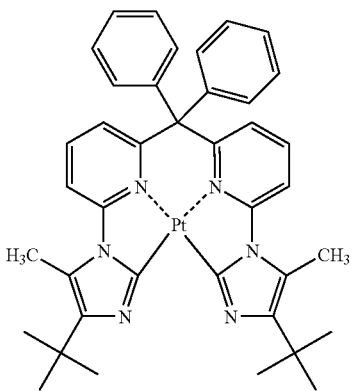
154
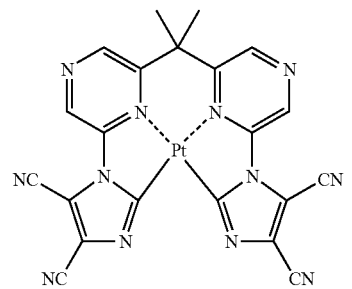
155
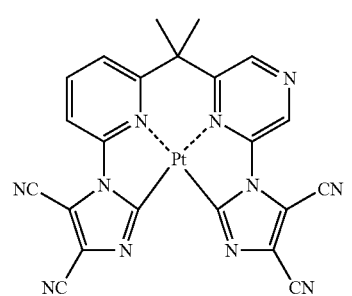

156
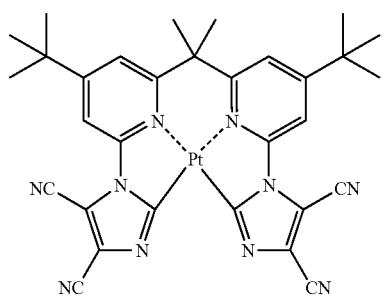
157
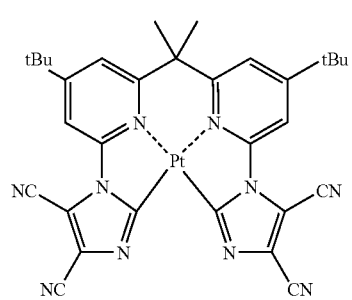
158
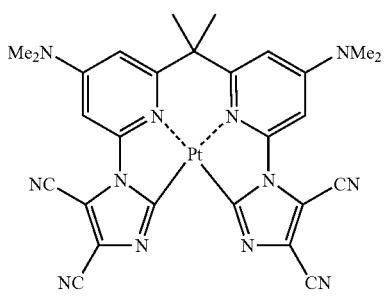
159
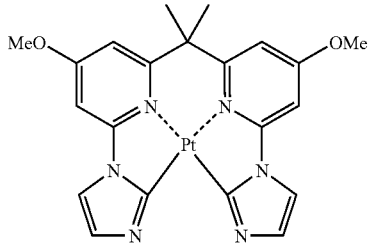
160
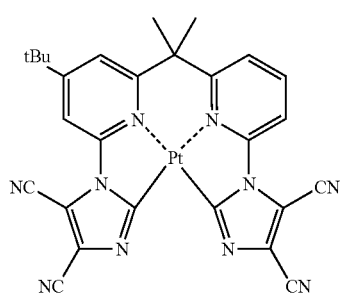
161
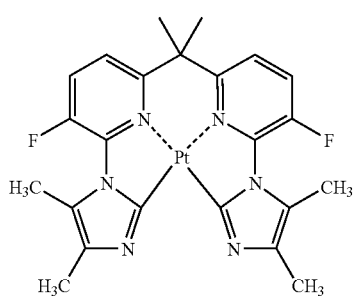
162
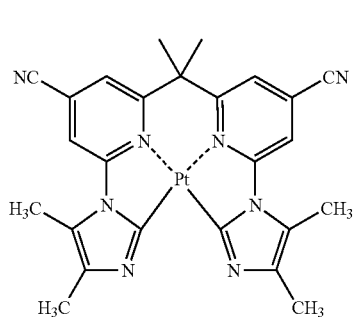
163
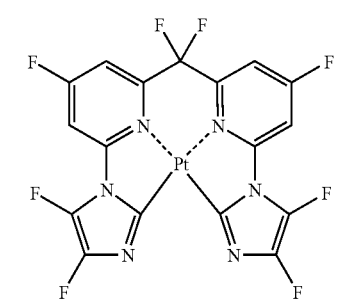
164
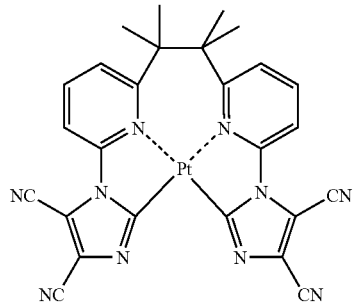
165
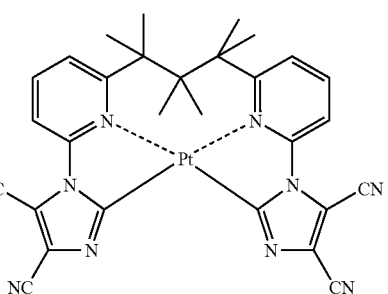

166
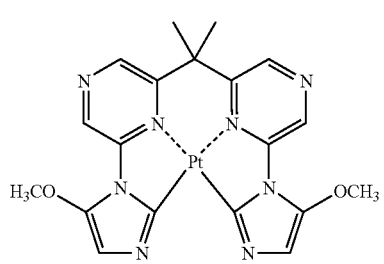
167
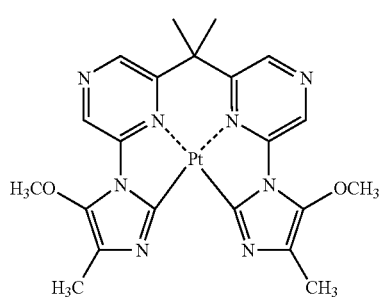
168
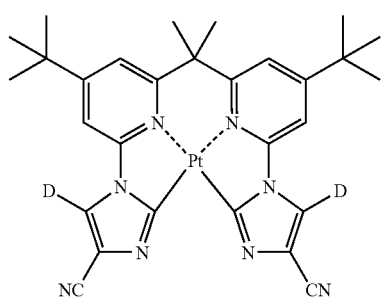
169
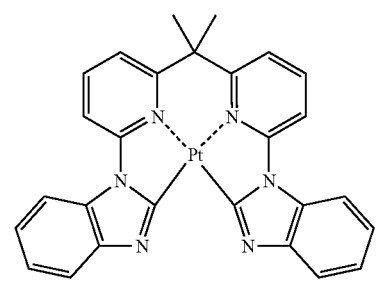
170
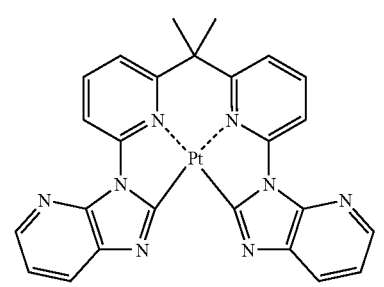
171
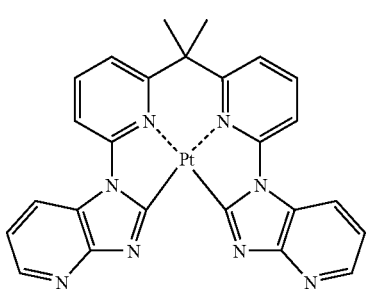
172
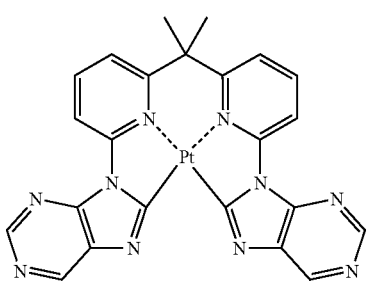
173
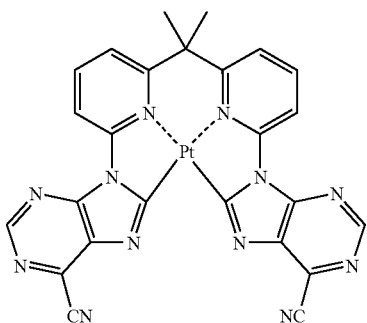
174
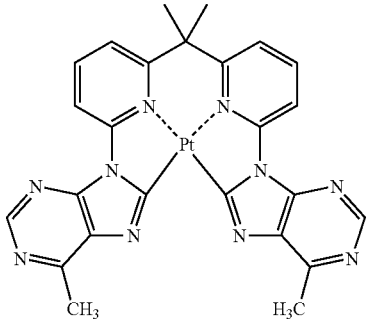
175
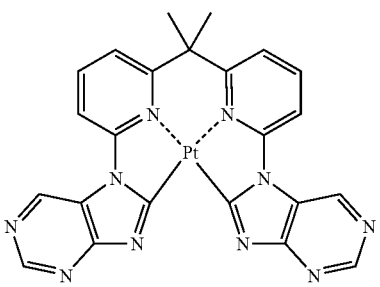

176
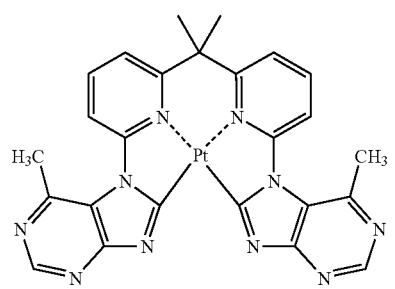
177
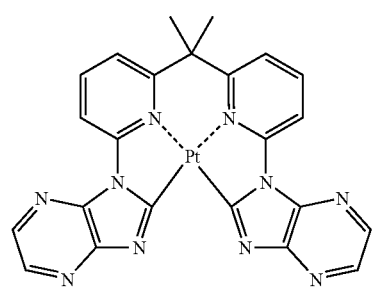
178
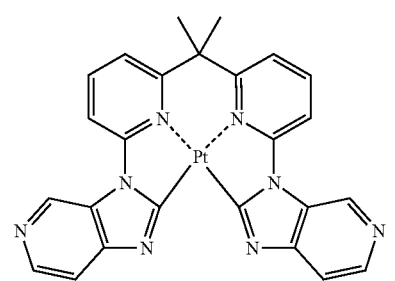
179
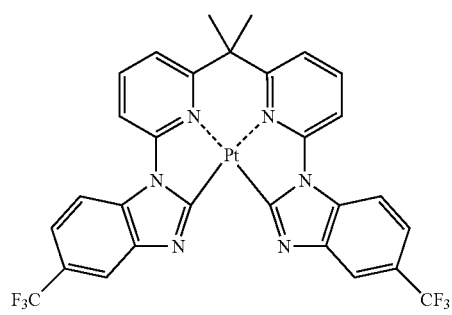
180
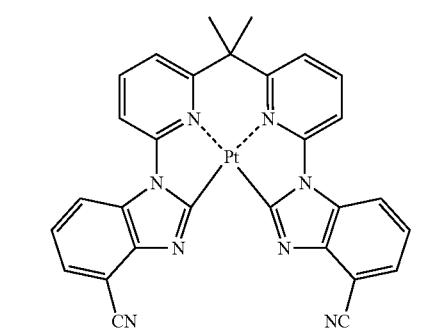
181
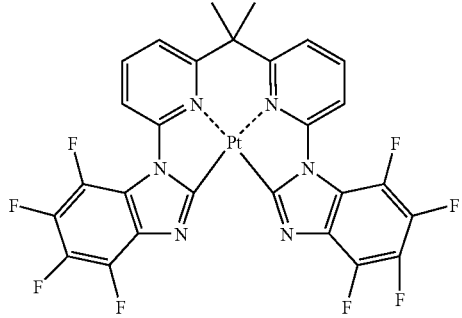
182
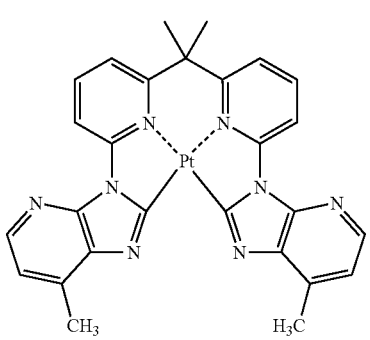
183
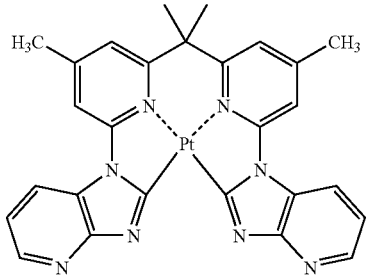
184
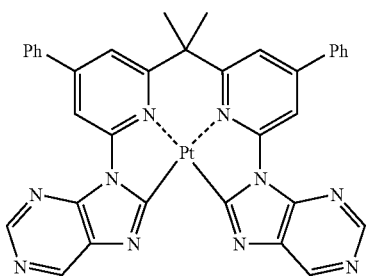
185
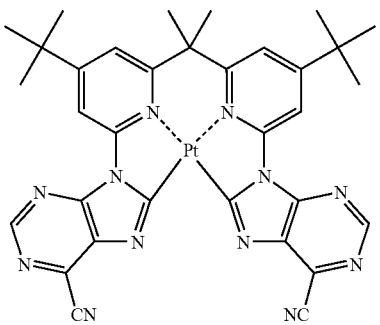

101
-continued
186
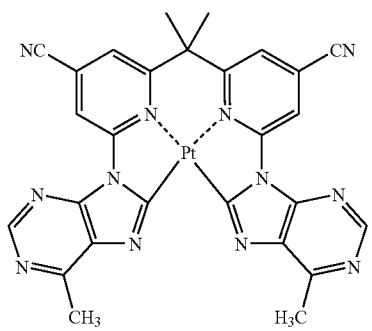
187
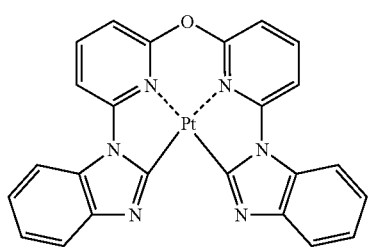
188
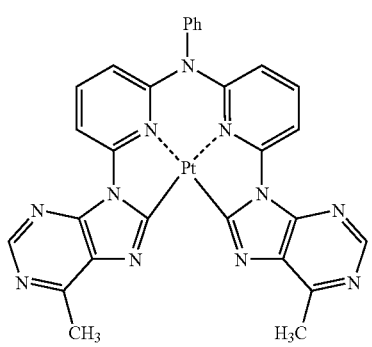
189
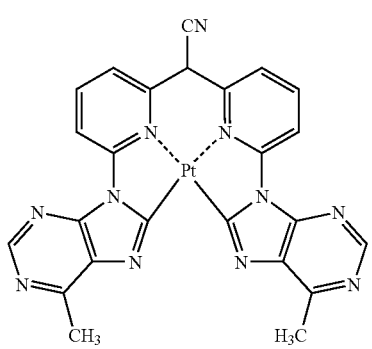
190
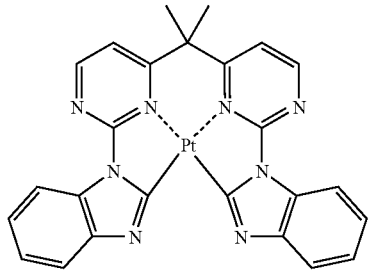
102
-continued
191
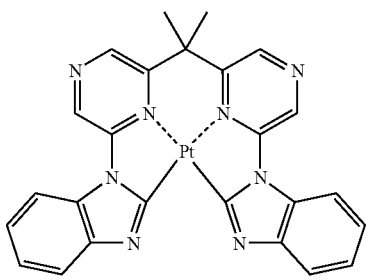
192
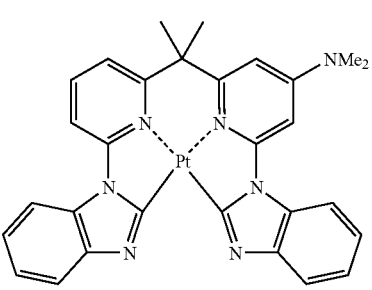
193
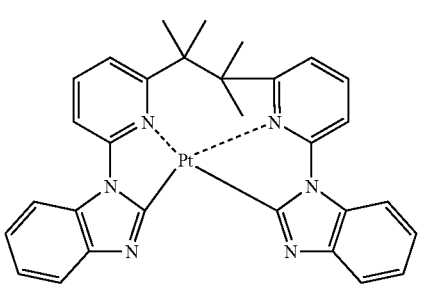
194
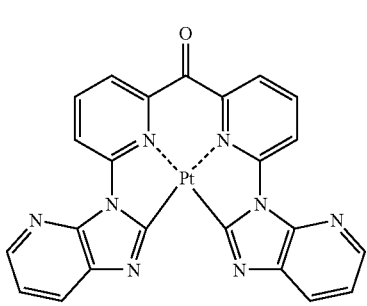
195
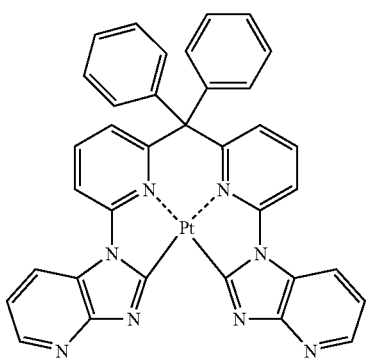

-continued
| | |
|---|---|
| 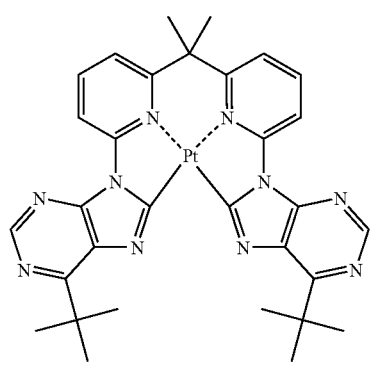 196 | 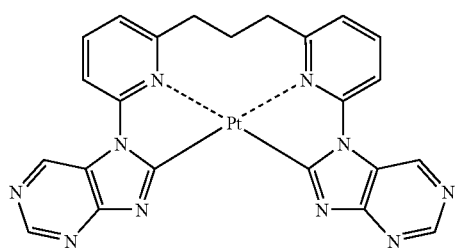 201 |
| 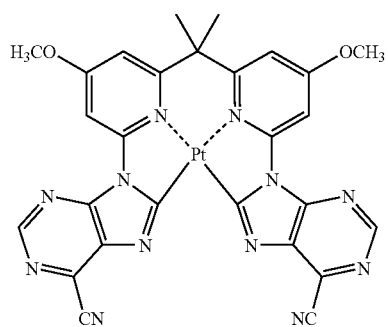 197 | 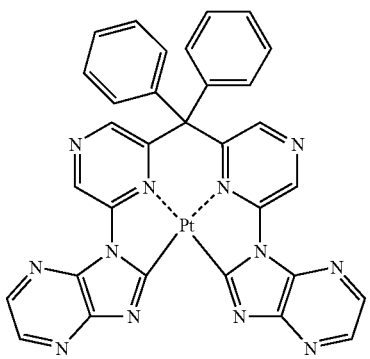 202 |
| 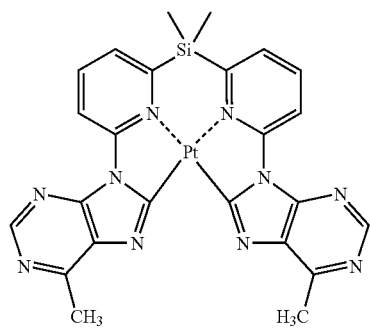 198 | 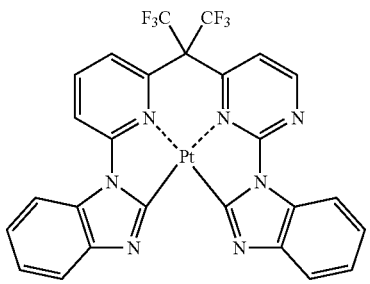 203 |
| 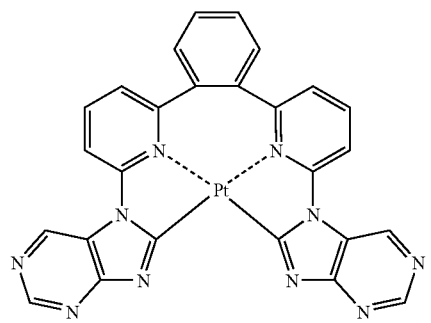 199 | 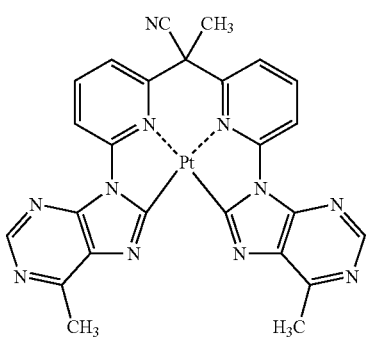 204 |
| 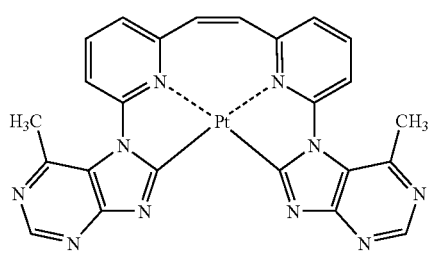 200 | 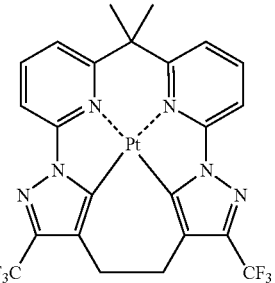 205 |

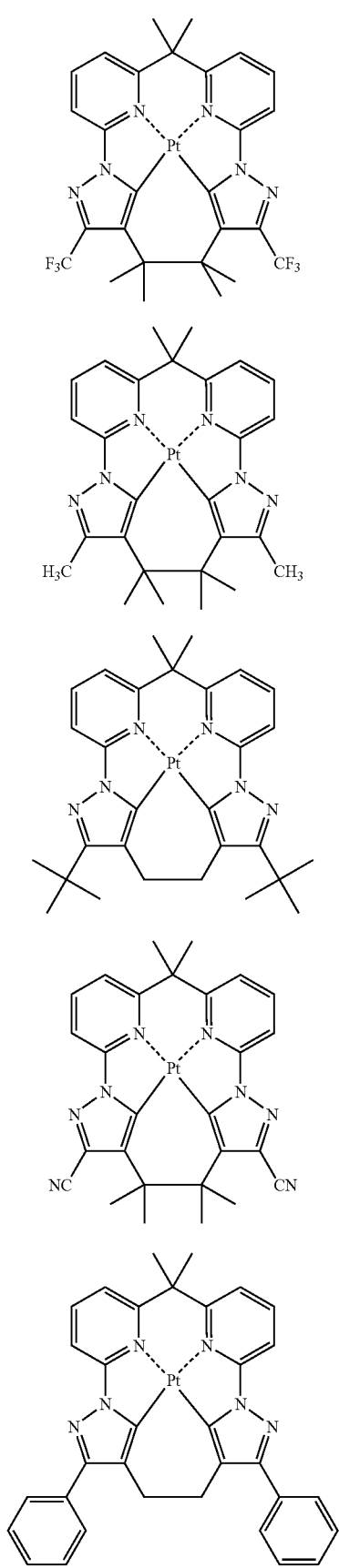
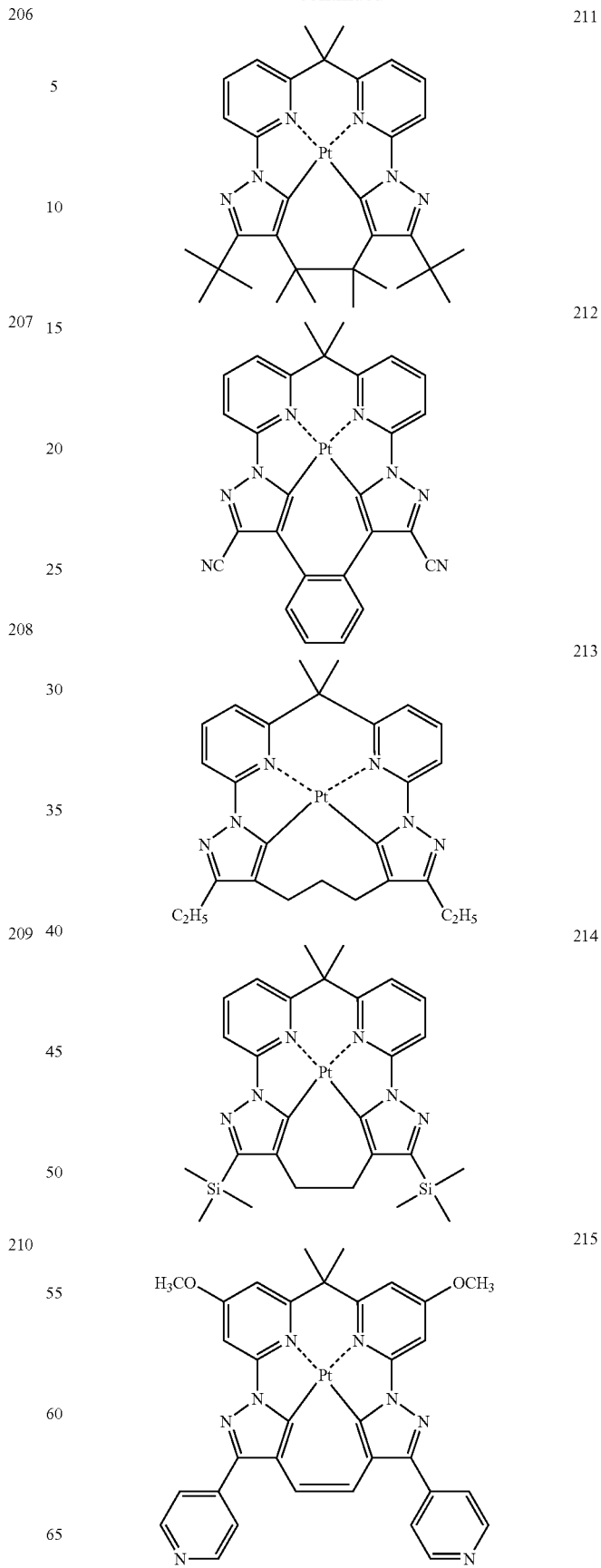

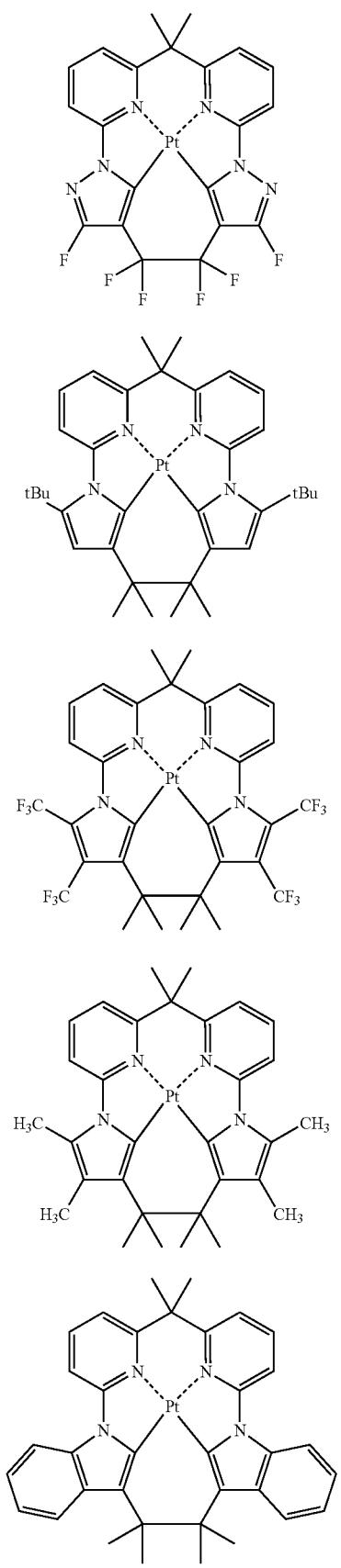
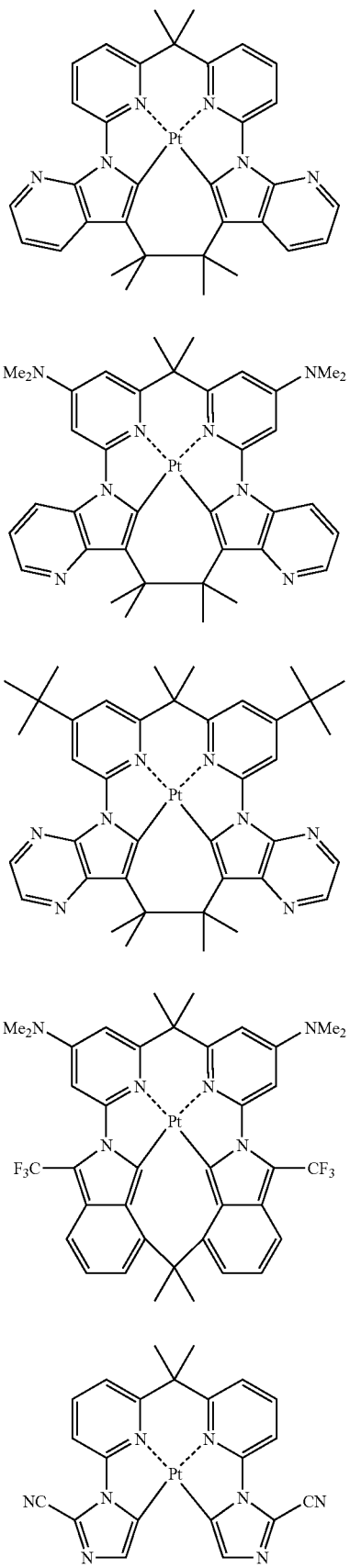

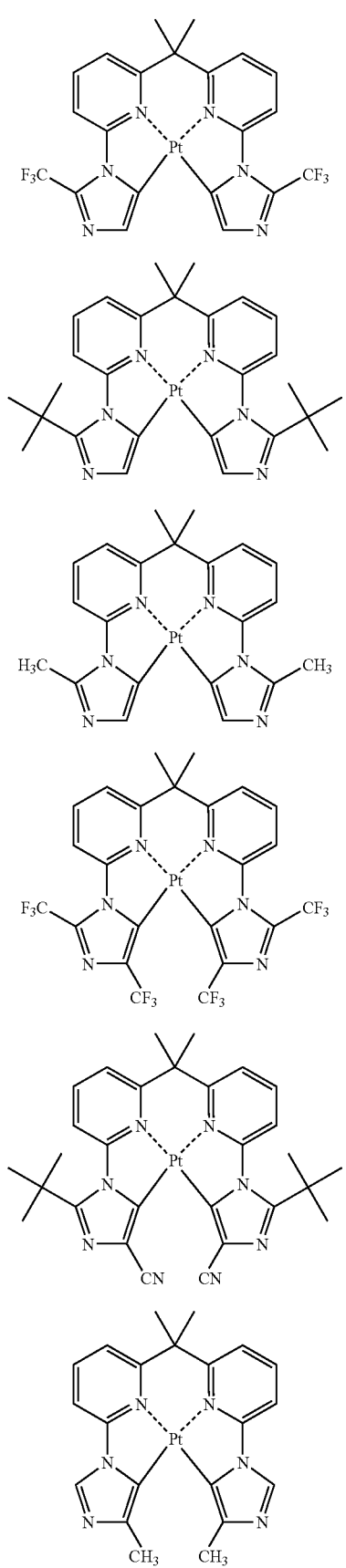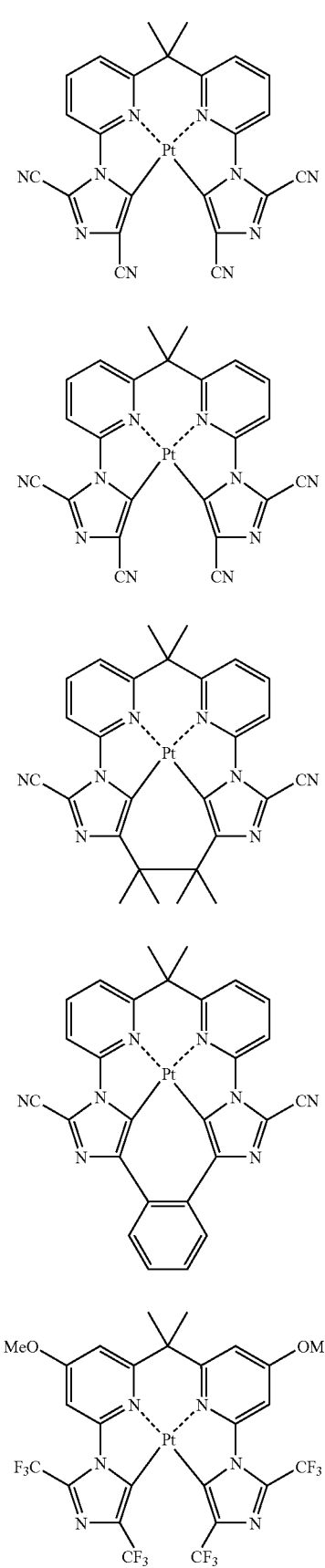

237 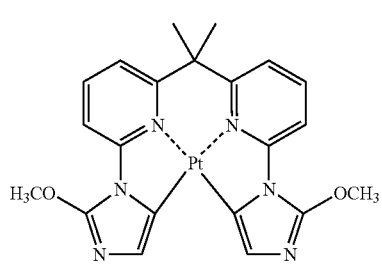
238 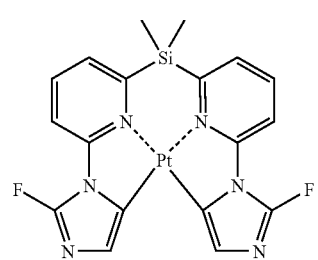
239 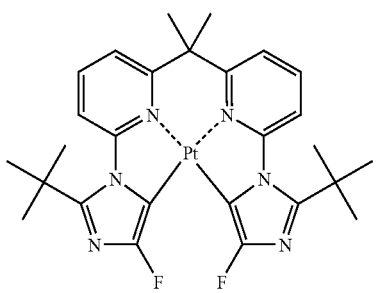
240 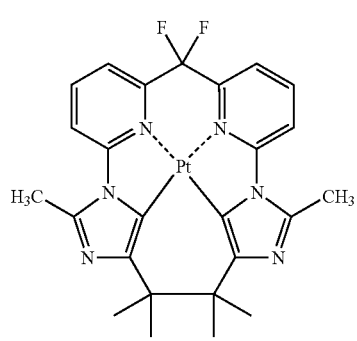
241 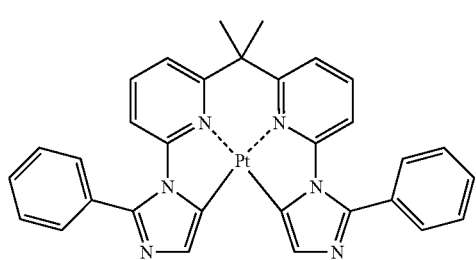
242 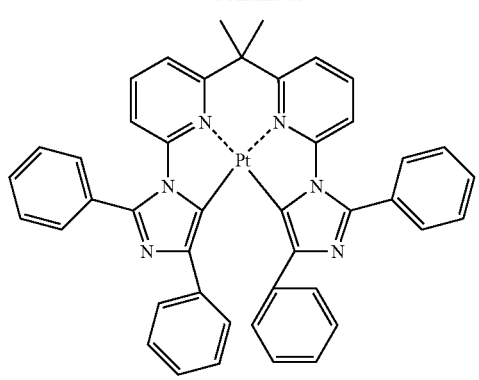
243 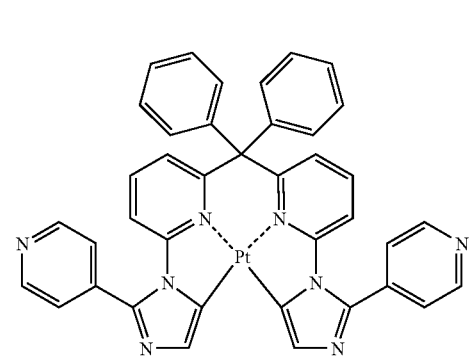
244 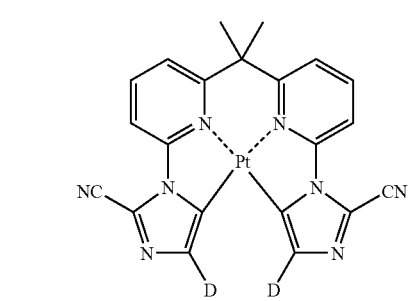
245 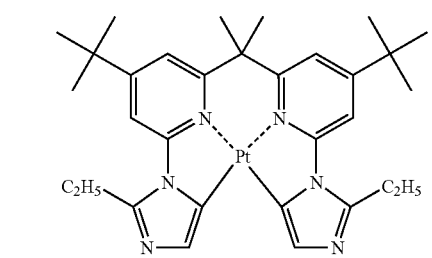
246 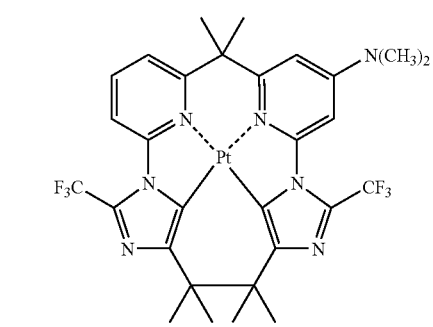

-continued
| 247 | 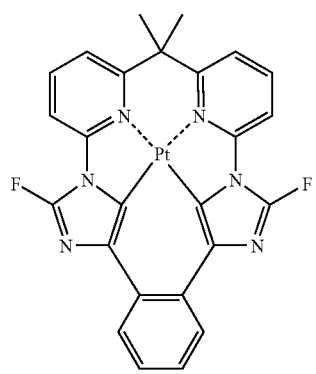 |
| 248 | 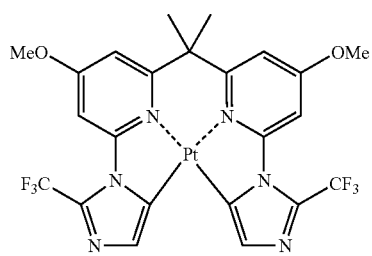 |
| 249 | 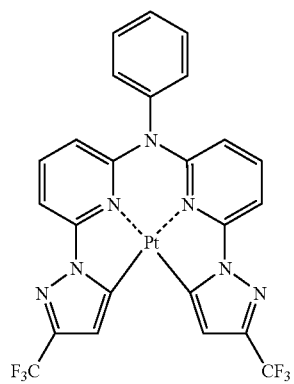 |
| 250 | 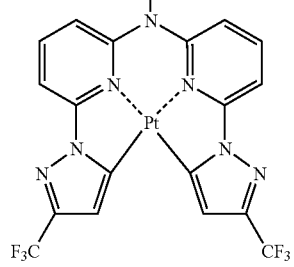 |
-continued
| 251 | 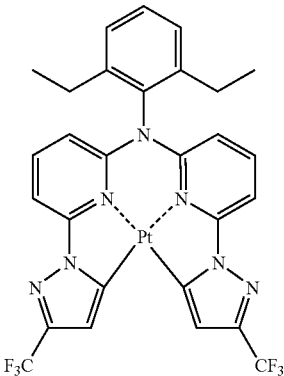 |
| 252 | 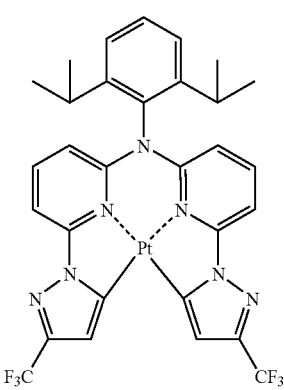 |
| 253 | 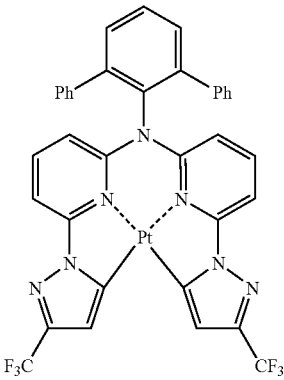 |
| 254 | 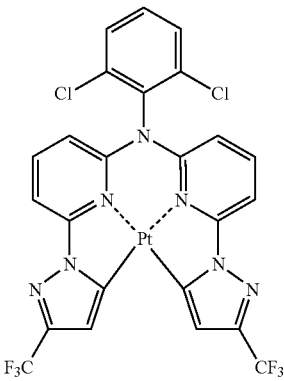 |

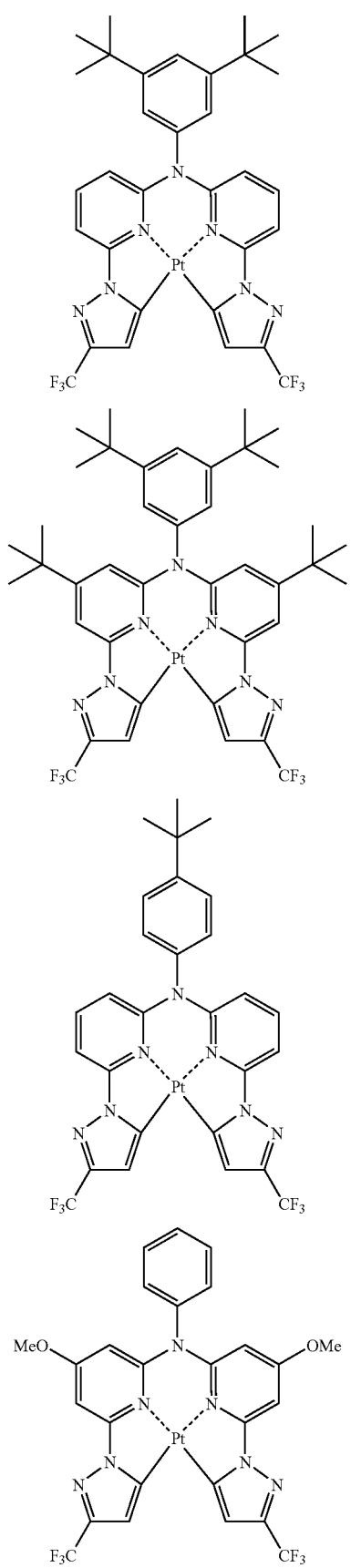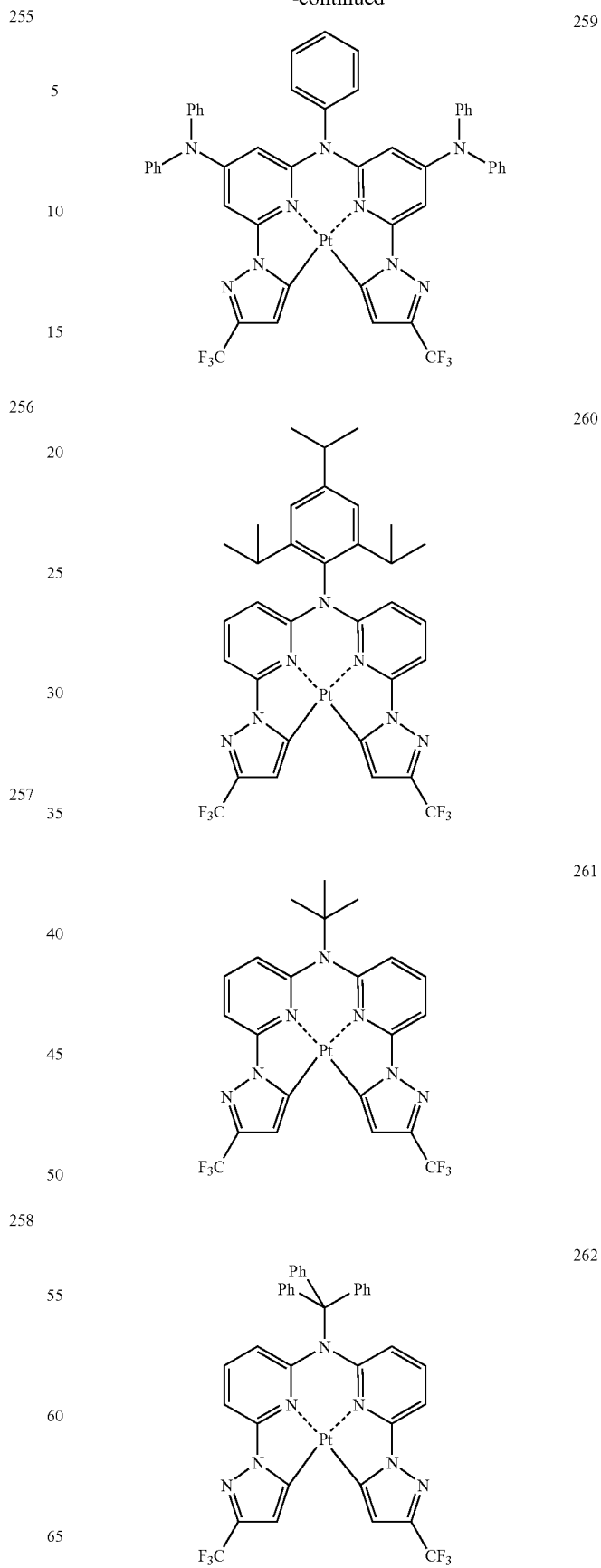

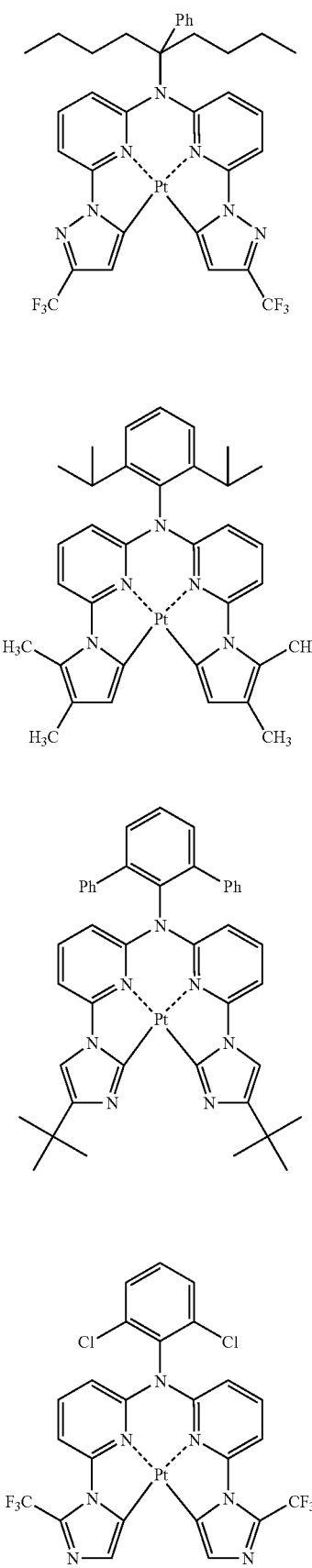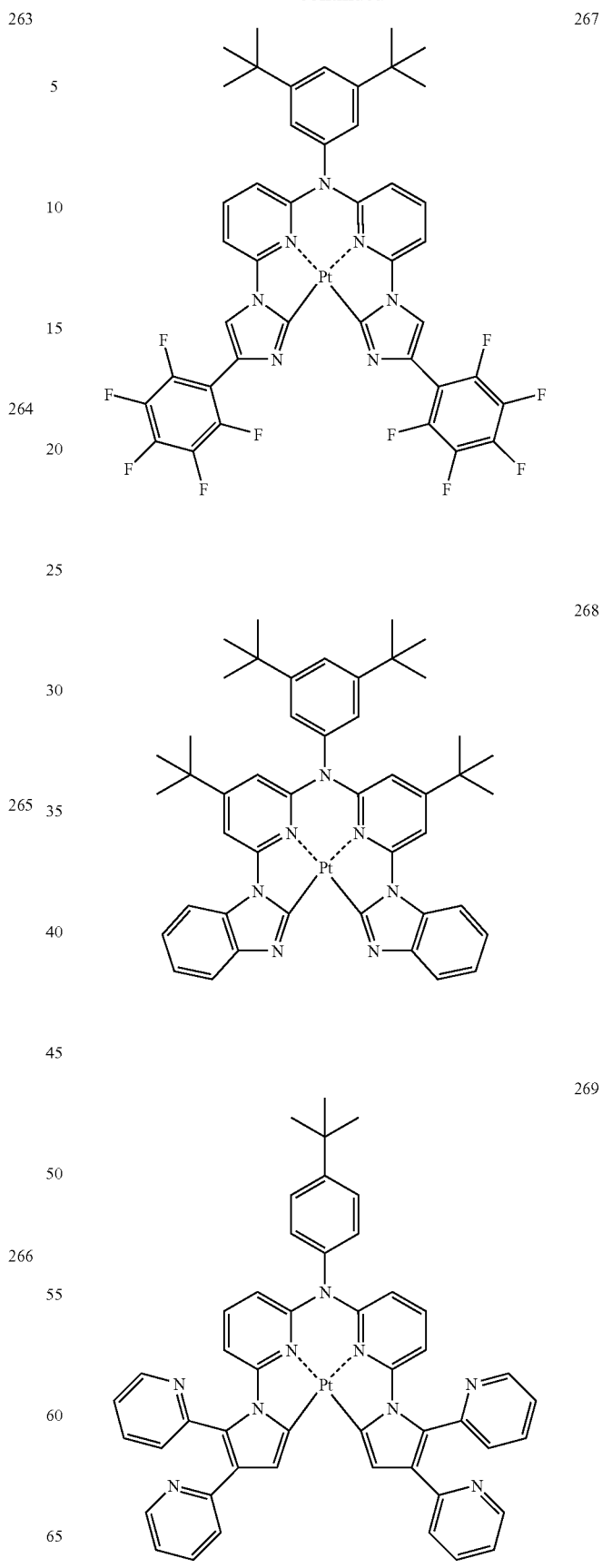

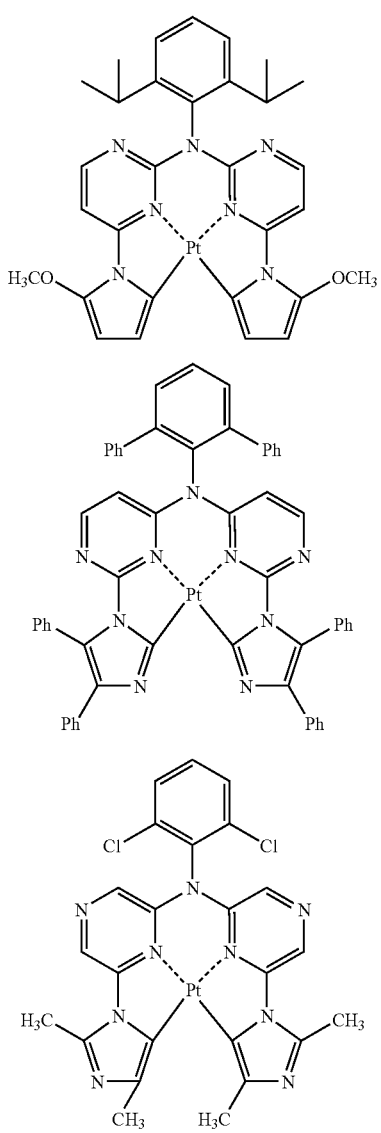

Also, as the platinum complex phosphorescent materials having a tetradentate ligand, the compounds disclosed in U.S. Pat. No. 6,653,654, WO 04/108857, WO 04/081017, WO 05/042444, JP-A-2006-232784, WO 05/042550, JP-A-2005-310733, JP-A-2005-317516, JP-A-2006-261623 and WO 06/098505 can be exemplified.

Organic Electroluminescent Device:

The organic electroluminescent device of the invention will be described in detail below.

The light-emitting device in the invention comprises a substrate having thereon a cathode and an anode, and organic layers (the organic layers may be organic layers comprising an organic compound alone, or may be organic layers containing an inorganic compound) including an organic light-emitting layer (hereinafter sometimes referred to as merely "a light-emitting layer") between the electrodes. From the properties of the light-emitting device, it is preferred that at least one electrode of the cathode and anode is transparent.

As the embodiment of lamination of the organic layers in the invention, lamination is preferably in order of a hole transporting layer, a light-emitting layer, and an electron transporting layer from the anode side. Further, a charge blocking layer may be provided between the hole transporting layer and the light-emitting layer, or between the light-emitting layer and the electron transporting layer. A hole injecting layer may be provided between the anode and the hole transporting layer, and an electron injecting layer may be provided between the cathode and the electron transporting layer. Each layer may be divided into a plurality of secondary layers.

The constituents of the light-emitting material of the invention are described in detail below.

Substrate:

The substrate for use in the invention is preferably a substrate that does not scatter or attenuate the light emitted from the organic layer. The specific examples of the materials of the substrate include inorganic materials, e.g., yttria stabilized zirconia (YSZ), glass, etc., and organic materials, such as polyester, e.g., polyethylene terephthalate, polybutylene phthalate, polyethylene naphthalate, etc., polystyrene, polycarbonate, polyether sulfone, polyallylate, polyimide, polycycloolefin, norbornene resin, poly(chloro-trifluoroethylene), etc.

When glass is used as a substrate, non-alkali glass is preferably used as the material for reducing elution of ions from the glass. Further, when soda lime glass is used, it is preferred to provide a barrier coat such as silica. In the case of organic materials, materials excellent in heat resistance, dimensional stability, solvent resistance, electrical insulating properties and processability are preferably used.

The form, structure and size of a substrate are not especially restricted, and these can be arbitrarily selected in accordance with the intended use and purpose of the light-emitting device. In general, a substrate is preferably in a plate-like form. The structure of a substrate may be a single layer structure or may be a lamination structure, and may consist of a single member or may be formed of two or more members.

A substrate may be colorless and transparent, or may be colored and transparent, but from the point of not scattering or attenuating the light emitted from an organic light-emitting layer, a colorless and transparent substrate is preferably used.

A substrate can be provided with a moisture permeation preventing layer (a gas barrier layer) on the front surface or rear surface.

As the materials of the moisture permeation preventing layer (the gas barrier layer), inorganic materials such as silicon nitride and silicon oxide are preferably used. The moisture permeation preventing layer (the gas barrier layer) can be formed, for example, by a high frequency sputtering method.

When a thermoplastic substrate is used, if necessary, a hard coat layer and an undercoat layer may further be provided.

Anode:

An anode is generally sufficient to have the function of the electrode to supply positive holes to an organic layer. The form, structure and size of an anode are not especially restricted, and these can be arbitrarily selected from known materials of electrode in accordance with the intended use and purpose of the light-emitting device. As described above, an anode is generally provided as a transparent anode.

As the materials of anode, for example, metals, alloys, metal oxides, electrically conductive compounds, and mixtures of these materials are preferably exemplified. The specific examples of the materials of anode include electrically conductive metal oxides, e.g., tin oxide doped with antimony or fluorine (ATO, FTO), tin oxide, zinc oxide, indium oxide, indium tin oxide (ITO), indium zinc oxide (IZO), etc., metals, e.g., gold, silver, chromium, nickel, etc., mixtures or laminates of these metals with electrically conductive metal oxides, inorganic electrically conductive substances, e.g., copper iodide, copper sulfide, etc., organic electrically conductive materials, e.g., polyaniline, polythiophene, polypyrrole, etc., laminates of these materials with ITO, etc. Of these materials, electrically conductive metal oxides are preferred, and ITO is especially preferred in view of productivity, high conductivity, transparency and the like.

An anode can be formed on the substrate in accordance with various methods arbitrarily selected from, for example, wet methods, e.g., a printing method, a coating method, etc., physical methods, e.g., a vacuum deposition method, a sputtering method, an ion plating method, etc., and chemical methods, e.g., a CVD method, a plasma CVD method, etc., taking the suitability with the material to be used in the anode into consideration. For example, in the case of selecting ITO as the material of an anode, the anode can be formed according to a direct current or high frequency sputtering method, a vacuum deposition method, an ion plating method, etc.

In the organic electroluminescent device in the invention, the position of the anode to be formed is not especially restricted and can be formed anywhere. The position can be arbitrarily selected in accordance with the intended use and purpose of the light-emitting device, but preferably provided on the substrate. In this case, the anode may be formed on the entire surface of one side of the substrate, or may be formed at a part.

As patterning in forming an anode, patterning may be performed by chemical etching such as by photo-lithography, may be carried out by physical etching such as by laser, may be performed by vacuum deposition or sputtering on a superposed mask, or a lift-off method and a printing method may be used.

The thickness of an anode can be optionally selected in accordance with the materials of the anode, so that cannot be regulated unconditionally, but the thickness is generally from 10 nm to 50 μm or so, and is preferably from 50 nm to 20 μm.

The value of resistance of an anode is preferably $10^3$ Ω/□ or less, and more preferably $10^2$ Ω/□ or less. In the case where an anode is transparent, the anode may be colorless and transparent, or colored and transparent. For the coupling out of luminescence from the transparent anode side, transmittance is preferably 60% or more, and more preferably 70% or more.

In connection with transparent anodes, description is found in Yutaka Sawada supervised, *Tomei Douden-Maku no Shintenkai* (*New Development in Transparent Conductive Films*), CMC Publishing Co., Ltd. (1999), and the description therein can be referred to. In the case of using a plastic substrate low in heat resistance, a transparent anode film-formed with ITO or IZO at a low temperature of 150° C. or less is preferred.

Cathode:

A cathode is generally sufficient to have the function of the electrode to supply electrons to an organic layer. The form, structure and size of a cathode are not especially restricted, and these can be arbitrarily selected from known materials of electrode in accordance with the intended use and purpose of the light-emitting device.

As the materials of cathode, for example, metals, alloys, metal oxides, electrically conductive compounds, and mixtures of these materials are exemplified. The specific examples of the materials of cathode include alkali metals (e.g., Li, Na, K, Cs, etc.), alkaline earth metals (e.g., Mg, Ca, etc.), gold, silver, lead, aluminum, sodium-potassium alloy, lithium-aluminum alloy, magnesium-silver alloy, indium, rare earth metals, e.g., ytterbium, etc. These materials may be used by one kind alone, but from the viewpoint of the compatibility of stability and an electron injecting property, two or more kinds of materials are preferably used in combination.

As the materials constituting a cathode, alkali metals and alkaline earth metals are preferred of these materials in the point of electron injection, and materials mainly comprising aluminum are preferred for their excellent preservation stability.

The materials mainly comprising aluminum mean aluminum alone, alloys of aluminum with 0.01 to 10 mass % of alkali metal or alkaline earth metal or mixtures of these (e.g., lithium-aluminum alloy, magnesium-aluminum alloy, etc.).

The materials of cathode are disclosed in JP-A-2-15595 and JP-A-5-121172, and the materials described in these patents can also be used in the invention.

A cathode can be formed by known methods with no particular restriction. For example, a cathode can be formed according to wet methods, e.g., a printing method, a coating method, etc., physical methods, e.g., a vacuum deposition method, a sputtering method, an ion plating method, etc., and chemical methods, e.g., a CVD method, a plasma CVD method, etc., taking the suitability with the material constituting the cathode into consideration. For example, in the case of selecting metals as the material of a cathode, the cathode can be formed with one or two or more kinds of materials at the same time or in order by sputtering, etc.

As patterning in forming a cathode, patterning may be performed by chemical etching such as by photo-lithography, may be carried out by physical etching such as by laser, may be performed by vacuum deposition or sputtering on a superposed mask, or a lift-off method and a printing method may be used.

The position of the cathode to be formed is not especially restricted and can be formed anywhere in the invention. The cathode may be formed on the entire surface of the organic layer, or may be formed at a part.

A dielectric layer comprising fluoride or oxide of alkali metal or alkaline earth metal may be inserted between the cathode and the organic layer in a thickness of from 0.1 to 5 nm. The dielectric layer can be regarded as one kind of an electron injecting layer. The dielectric layer can be formed, for example, according to a vacuum deposition method, a sputtering method, an ion plating method, etc.

The thickness of a cathode can be optionally selected in accordance with the materials of the cathode, so that cannot be regulated unconditionally, but the thickness is generally from 10 nm to 5 μm or so, and is preferably from 50 nm to 1 μm.

A cathode may be transparent or opaque. A transparent cathode can be formed by forming a thin film of the materials of the cathode in a thickness of from 1 to 10 nm, and further laminating transparent conductive materials such as ITO and IZO.

Organic Layer:

Organic layers in the invention will be described below.

The organic electroluminescent device of the invention has at least one organic layer including a light-emitting layer. As organic layers other than the light-emitting layer, as described above, a hole transporting layer, an electron transporting layer, a charge blocking layer, a hole injecting layer and an electron injecting layer are exemplified.

Formation of Organic Layers:

In the organic electroluminescent device of the invention, each layer constituting the organic layers can be preferably formed by any of dry film-forming methods such as a vacuum deposition method, a sputtering method, etc., a transfer method, and a printing method.

Organic Light-Emitting Layer:

The organic light-emitting layer is a layer having functions to receive, at the time of electric field application, positive holes from the anode, hole injecting layer or hole transporting layer, and electrons from the cathode, electron injecting layer or electron transporting layer, and offer the field of recombination of positive holes and electrons to emit light.

The light-emitting layer in the invention may consist of light-emitting materials alone, or may comprise a mixed layer of a host material and a light-emitting material. The light-emitting material may be a fluorescent material or may be a phosphorescent material. Dopant may be one or two or more kinds. The host material is preferably a charge transporting material, and one or two or more host materials may be used. For example, the constitution of the mixture of an electron transporting host material and a hole transporting host material is exemplified. Further, a material not having an electron transporting property and not emitting luminescence may be contained in the light-emitting layer.

The light-emitting layer may comprise one layer, or may be two or more layers, and each layer may emit luminescence in different luminescent color.

The examples of fluorescent materials that can be used in the invention include various metal complexes represented by metal complexes of benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, pyraridine derivatives, cyclopentadiene derivatives, bisstyryl-anthracene derivatives, quinacridone derivatives, pyrrolo-pyridine derivatives, thiadiazolopyridine derivatives, cyclopentadiene derivatives, styrylamine derivatives, diketopyrrolopyrrole derivatives, aromatic dimethylidyne compounds, 8-quinolinol derivatives, and pyrromethene derivatives, polymer compounds such as polythiophene, polyphenylene, polyphenylenevinylene, and compounds such as organic silane derivatives.

The examples of phosphorescent materials that can be used in the invention include complexes containing a transition metal atom or a lanthanoid atom.

The transition metal atoms are not especially restricted, but ruthenium, rhodium, palladium, tungsten, rhenium, osmium, iridium and platinum are preferably exemplified, and rhenium, iridium and platinum are more preferred.

As lanthanoid atoms, lanthanum, cerium, praseodymium, neodymium, samarium, europium, gadolinium, terbium, dysprosium, holmium, erbium, thulium, ytterbium, and lutecium are exemplified. Of these lanthanoid atoms, neodymium, europium and gadolinium are preferred.

As the examples of ligands of complexes, the ligands described, for example, in G. Wilkinson et al., *Comprehensive Coordination Chemistry*, Pergamon Press (1987), H. Yersin, *Photochemistry and Photophysics of Coordination Compounds*, Springer-Verlag (1987), and Akio Yamamoto, *Yuki Kinzoku Kagaku—Kiso to Oyo—(Organic Metal Chemistry—Elements and Applications)*, Shokabo Publishing Co. (1982) are exemplified.

As the specific examples of ligands, halogen ligands (preferably a chlorine ligand), nitrogen-containing heterocyclic ligands (e.g., phenylpyridine, benzoquinoline, quinolinol, bipyridyl, phenanthroline, etc.), diketone ligands (e.g., acetylacetone, etc.), carboxylic acid ligands (e.g., acetic acid ligand, etc.), carbon monoxide ligands, isonitrile ligands, and cyano ligands are preferably exemplified, and more preferably nitrogen-containing heterocyclic ligands. These complexes may have one transition metal atom in a compound, or may be the so-called polynuclear complexes having two or more transition metal atoms. They may contain metal atoms of different kinds at the same time.

It is preferred for a phosphorescent material to be contained in the light-emitting layer in an amount of from 0.1 to 40 mass %, and more preferably from 0.5 to 20 mass %.

As host materials to be contained in the light-emitting layer in the invention, e.g., materials having a indole skeleton, having a carbazole skeleton, having a diarylamine skeleton, having a pyridine skeleton, having a pyrazine skeleton, having a triazine skeleton, having an arylsilane skeleton, and those described later in the items of a hole injecting layer, a hole transporting layer, an electron injecting layer, and an electron transporting layer are exemplified. As the host material, a compound having an indole skeleton is preferred, a compound represented by formula (11) is more preferred, and a compound represented by formula (12) is still more preferred.

The thickness of the light-emitting layer is not especially limited, but is generally preferably from 1 to 500 nm, more preferably from 5 to 200 nm, and still more preferably from 10 to 100 nm.

Hole Injecting Layer and Hole Transporting Layer:

The hole injecting layer and the hole transporting layer are layers having a function to receive positive holes from the anode or anode side and transport the positive holes to the cathode side. The hole injecting layer and the hole transporting layer are specifically preferably the layers containing carbazole derivatives, azacarbazole derivatives, indole derivatives, azaindole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, organic silane derivatives, carbon, various kinds of metal complexes represented by Ir complex having phenylazole, or phenylazine as the ligand.

An electron accepting dopant can be contained in the positive hole injecting layer or positive hole transporting layer of the organic EL device of the invention. As the electron accepting dopants to be introduced to the hole injecting layer or hole transporting layer, inorganic compounds and organic compounds can be used so long as they are electron accepting and have a property of capable of oxidizing an organic compound.

Specifically, as the inorganic compounds, halogenated metals, e.g., ferric chloride, aluminum chloride, gallium chloride, indium chloride, antimony pentachloride, etc., and metal oxides, e.g., vanadium pentoxide, molybdenum trioxide, etc., are exemplified.

When dopants are organic compounds, the compounds having as a substituent a nitro group, halogen, a cyano group, or a trifluoromethyl group, quinone compounds, acid anhydride compounds, and fullerene are preferably used.

Besides the above compounds, the compounds disclosed in JP-A-6-212153, JP-A-11-111463, JP-A-11-251067, JP-A-2000-196140, JP-A-2000-286054, JP-A-2000-315580, JP-A-2001-102175, JP-A-2001-160493, JP-A-2002-252085, JP-A-2002-56985, JP-A-2003-157981, JP-A-2003-217862, JP-A-2003-229278, JP-A-2004-342614, JP-A-2005-72012, JP-A-2005-166637 and JP-A-2005-209643 can be preferably used.

Of these compounds, hexacyanobutadiene, hexacyanobenzene, tetracyanoethylene, tetracyanoquinodimethane, tetrafluorotetracyanoquinodimethane, p-fluoranyl, p-chloranyl, p-bromanyl, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthoquinone, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene $C_{60}$ are preferred, hexacyanobutadiene, hexacyanobenzene, tetracyanoethylene, tetracyanoquinodimethane, tetrafluorotetracyanoquinodimethane, p-fluoranyl, p-chloranyl, p-bromanyl, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferred, and tetrafluorotetracyanoquinodimethan is especially preferred.

These electron accepting dopants may be used by one kind alone, or two or more kinds may be used in combination. The amount of the electron accepting dopant to be used differs according to the kind of the material, but the amount is preferably from 0.01 to 50 mass % to the material of the positive hole transporting layer, more preferably from 0.05 to 20 mass %, and still more preferably from 0.1 to 10 mass %.

The thickness of the hole injecting layer and hole transporting layer is preferably 500 nm or less from the viewpoint of lowering driving voltage.

The thickness of the hole transporting layer is preferably from 1 to 500 nm, more preferably from 5 to 200 nm, and still more preferably from 10 to 100 nm. The thickness of the hole injecting layer is preferably from 0.1 to 200 nm, more preferably from 0.5 to 100 nm, and still more preferably from 1 to 100 nm.

The hole injecting layer and the hole transporting layer may be a single layer structure comprising one or two or more of the above materials, or may be a multilayer structure comprising a plurality of layers of the same or different compositions.

Electron Injecting Layer and Electron Transporting Layer:

The electron injecting layer and the electron transporting layer are layers having a function to receive electrons from the cathode or cathode side and transport the electrons to the anode side. The electron injecting layer and the electron transporting layer are specifically preferably layers containing triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, tetracarboxylic anhydride of aromatic rings such as naphthalene, perylene, etc., a phthalocyanine derivative, various metal complexes represented by metal complexes of 8-quinolinol derivatives, metalphthalocyanine, metal complexes having benzoxazole, benzothiazole as the ligand, organic silane derivative, etc.

An electron donating dopant can be contained in the electron injecting layer or electron transporting layer of the organic EL elemental device of the invention. Any compound can be used as the electron donating dopant to be introduced to the electron injecting layer or electron transporting layer, so long as the compound is electron accepting and has a property of capable of reducing an organic compound, and alkali metal salts, e.g., Li, alkaline earth metals, e.g., Mg, transition metals containing a rare earth metal, and reducing organic compounds are preferably used as the electron donating dopant. As the metals, metals having a work function of 4.2 eV or less can be preferably used, and specifically Li, Na, K, Be, Mg, Ca, Sr, Ba, Y, Cs, La, Sm, Gd and Yb are exemplified. As the reducing organic compounds, e.g., nitrogen-containing compounds, sulfur-containing compounds, and phosphorus-containing compounds are exemplified.

Besides the above, the materials disclosed in JP-A-6-212153, JP-A-2000-196140, JP-A-2003-68468, JP-A-2003-229278, and JP-A-2004-342614 can be used.

These electron donating dopants may be used alone, or two or more kinds may be used in combination. The use amount of the electron donating dopants differs according to the kind of the material, but the amount is preferably from 0.1 to 99 mass % to the material of the electron transporting layer, more preferably from 1.0 to 80 mass %, and especially preferably from 2.0 to 70 mass %.

The thickness of each of the electron injecting layer and electron transporting layer is preferably 500 nm or less from the viewpoint of lowering driving voltage.

The thickness of the electron transporting layer is preferably from 1 to 500 nm, more preferably from 5 to 200 nm, and still more preferably from 10 to 100 nm. The thickness of the electron injecting layer is preferably from 0.1 to 200 nm, more preferably from 0.2 to 100 nm, and still more preferably from 0.5 to 50 nm.

The electron injecting layer and the electron transporting layer may be a single layer structure comprising one or two or more of the above materials, or may be a multilayer structure comprising a plurality of layers of the same or different compositions.

Hole Blocking Layer:

A hole blocking layer is a layer having a function of preventing the positive holes transported from the anode side to the light-emitting layer from passing through to the cathode side. In the invention, a hole blocking layer can be provided as the organic layer contiguous to the light-emitting layer on the cathode side.

As the examples of the organic compounds constituting the hole blocking layer, aluminum complexes, e.g., aluminum (III) bis(2-methyl-8-quinolinato)-4-phenylphenolate (abbreviated to BAlq), etc., triazole derivatives, phenanthroline derivatives, e.g., 2,9-dimethyl-4,7-diphenyl-1,10-phenanthroline (abbreviated to BCP), etc., are exemplified.

The thickness of the hole blocking layer is preferably from 1 to 500 nm, more preferably from 5 to 200 nm, and still more preferably from 10 to 100 nm.

The hole blocking layer may be a single layer structure comprising one or two or more of the above materials, or may be a multilayer structure comprising a plurality of layers of the same or different compositions.

Protective Layer:

In the invention the organic EL device may be completely protected with a protective layer.

It is sufficient for the materials to be contained in the protective layer to have a function capable of restraining the substances accelerating deterioration of device, e.g., water, oxygen, etc., from entering the device.

The specific examples of such materials include metals, e.g., In, Sn, Pb, Au, Cu, Ag, Al, Ti, Ni, etc., metal oxides, e.g., MgO, SiO, $SiO_2$, $Al_2O_3$, GeO, NiO, CaO, BaO, $Fe_2O_3$, $Y_2O_3$, $TiO_2$, etc., metal nitrides, e.g., $SiN_x$, $SiN_xO_y$, etc., metal fluorides, e.g., $MgF_2$, LiF, $AlF_3$, $CaF_2$, etc., polyethylene, polypropylene, polymethyl methacrylate, polyimide, polyurea, polytetrafluoroethylene, polychlorotrifluoroethylene, polydichlorodifluoroethylene, copolymers of chlorotrifluoro- ethylene with dichlorodifluoroethylene, copolymers obtained by copolymerization of a monomer mixture containing tetrafluoroethylene and at least one comonomer, fluorine-containing copolymers having a cyclic structure on the main chain of the copolymer, water absorptive substances having a water absorption rate of not lower than 1%, moisture proofing substances having a water absorption rate of not higher than 0.1%.

The forming method of the protective layer is not especially restricted and, for example, a vacuum deposition method, a sputtering method, a reactive sputtering method, an MBE (molecular beam epitaxy) method, a cluster ion beam method, an ion plating method, a plasma polymerization method (a high frequency excitation ion plating method), a plasma CVD method, a laser CVD method, a heat CVD method, a gas source CVD method, a coating method, a printing method, a transfer method, etc., can be applied to the invention.

Sealing:

The organic electroluminescent device of the invention may be completely sealed in a sealing container.

Further, a water absorber or an inert liquid may be filled in the space between the sealing container and the light-emitting device. The water absorber is not especially restricted and, for example, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide, etc., can be exemplified. The inert liquid is not particularly limited and, for example, paraffins, liquid paraffins, fluorine solvents, such as perfluoroalkane, perfluoroamine, perfluoroether, etc., chlorine solvents, and silicone oils are exemplified.

Luminescence can be obtained by the application of DC (if necessary, an alternating current factor may be contained) voltage (generally from 2 to 15 V) or DC electric current between the anode and cathode of the organic electroluminescent device of the invention.

In connection with the driving methods of the organic electroluminescent device of the invention, the driving methods disclosed in JP-A-2-148687, JP-A-6-301355, JP-A-5-29080, JP-A-7-134558, JP-A-8-234685, JP-A-8-241047, Japanese Patent 2784615, and U.S. Pat. Nos. 5,828,429 and 6,023,308 can be used.

EXAMPLES

The invention will be described more specifically with reference to examples, but the invention should not be construed as being restricted thereto.

Comparative Example 1

A cleaned ITO substrate is placed in a vacuum evaporator, copper phthalocyanine is deposited on the substrate in a thickness of 10 nm, and NPD (N,N'-di-α-naphthyl-N,N'-diphenyl-benzidine) is deposited thereon in a thickness of 40 nm. Compound B-1 and compound (1-10) in the ratio of 12/88 (by mass) are deposited on the above deposited film in a thickness of 30 nm, then Aluminum (III) bis(2-methyl-8-quinolinato)-4-phenylphenolate (referred to as BAlq) is deposited thereon in a thickness of 6 nm, and then Alq (tris(8-hydroxyquinoline) aluminum complex) is deposited on the above film in a thickness of 20 nm. Lithium fluoride is deposited thereon in a thickness of 3 nm, and then Al having a thickness of 60 nm is provided as a cathode by patterning with the shadow mask.

Each layer is provided according to resistance heating vacuum deposition.

The manufactured layered product is put in a glove box substituted with nitrogen gas, and sealed in a stainless steel sealing can with a UV-curable type adhesive (XNR5516HV, manufactured by Nagase Ciba).

The obtained EL device is subjected to application of DC constant voltage with a source measure unit Model 2400 (manufactured by Toyo Technica Co., Ltd.) to emit luminescence. It is confirmed that the emission of phosphorescence originating in B-1 is obtained.

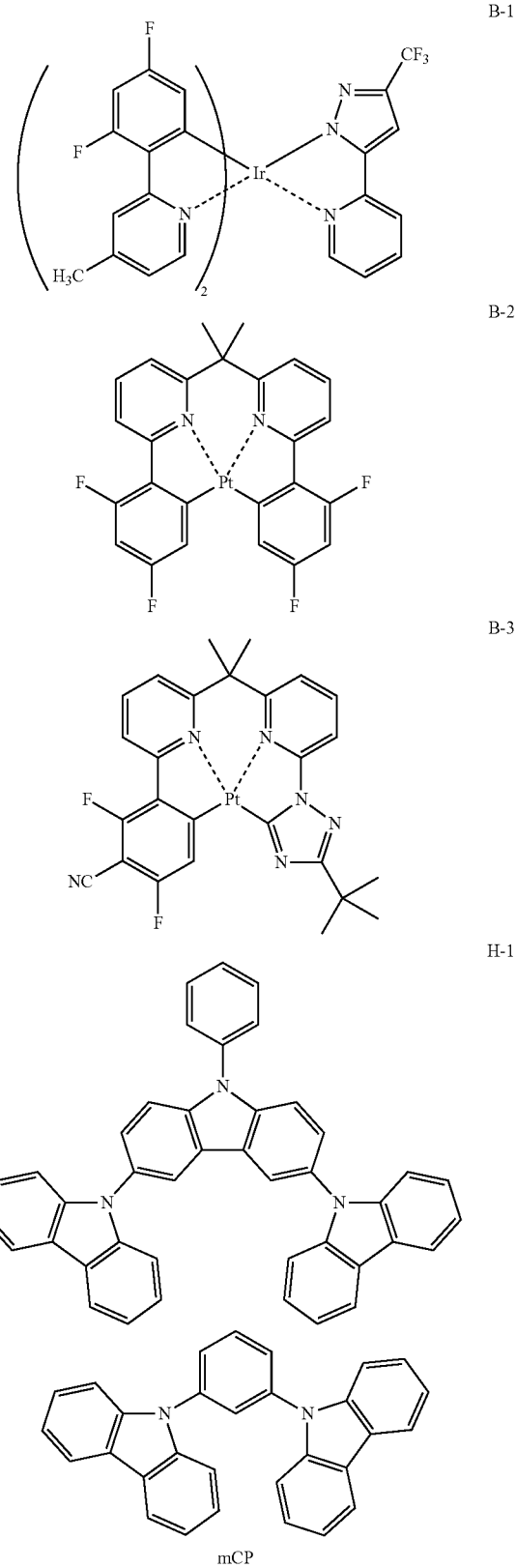

-continued

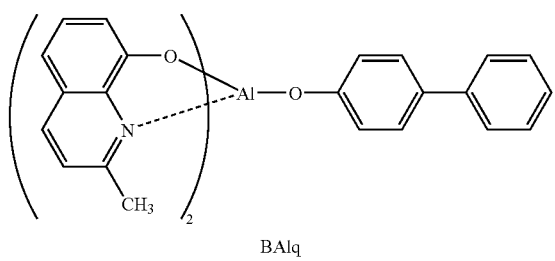

BAlq

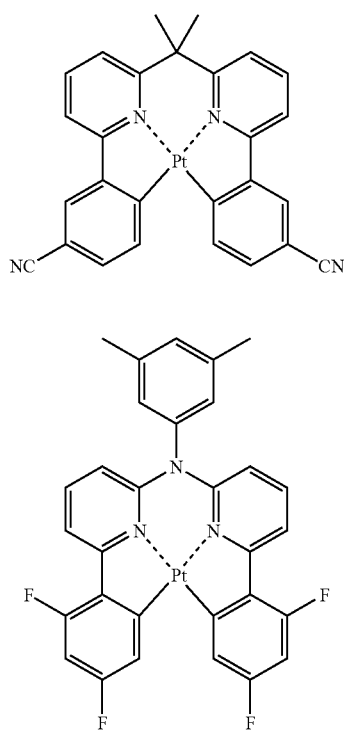

B-4

B-5

B-6

B-7

-continued

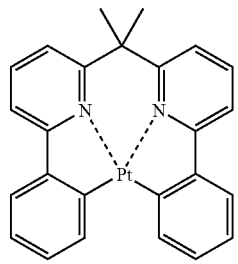

(79)

Comparative Example 2

A cleaned ITO substrate is placed in a vacuum evaporator, copper phthalocyanine is deposited on the substrate in a thickness of 10 nm, and NPD (N,N'-di-α-naphthyl-N,N'-diphenyl-benzidine) is deposited thereon in a thickness of 40 nm. Compound B-2 and mCP in the ratio of 12/88 (by mass) are deposited on the above deposited film in a thickness of 30 nm, then BAlq is deposited thereon in a thickness of 6 nm, and then Alq (tris(8-hydroxyquinoline)aluminum complex) is deposited on the above film in a thickness of 20 nm. Lithium fluoride is deposited thereon in a thickness of 3 nm, followed by deposition of aluminum in a thickness of 60 nm to prepare a device. The obtained EL device is subjected to application of DC constant voltage with a source measure unit Model 2400 (manufactured by Toyo Technica Co., Ltd.) to emit luminescence. It is confirmed that the emission of phosphorescence originating in B-2 is obtained.

Example 1

Evaluation of a device is performed in the same manner as in Comparative Example 1 except for using compound B-2 in place of B-1. It is confirmed that the emission of phosphorescence originating in B-2 is obtained.

Example 2

Evaluation of a device is performed in the same manner as in Example 1 except for using compound (1-1) in place of (1-10). It is confirmed that the emission of phosphorescence originating in B-2 is obtained.

Example 3

Evaluation of a device is performed in the same manner as in Example 2 except for using compound B-3 in place of B-2. It is confirmed that the emission of phosphorescence originating in B-3 is obtained.

Example 4

A device is prepared and evaluated in the same manner as in Example 3 except for inserting a layer containing compound H-1 having a thickness of 5 nm between the NPD layer and the light-emitting layer. It is confirmed that the emission of phosphorescence originating in B-3 is obtained.

Comparative Example 3

Evaluation of a device is performed in the same manner as in Comparative Example 2 except for using compound B-4 in place of B-2. It is confirmed that the emission of phosphorescence originating in B-4 is obtained.

Example 5

Evaluation of a device is performed in the same manner as in Example 1 except for using compound (1-7) in place of (1-10). It is confirmed that the emission of phosphorescence originating in B-2 is obtained.

Example 6

Evaluation of a device is performed in the same manner as in Comparative Example 3 except for using compound (1-217) in place of mCP. It is confirmed that the emission of phosphorescence originating in B-4 is obtained.

Example 7

Evaluation of a device is performed in the same manner as in Example 1 except for using compound B-5 in place of B-2. It is confirmed that the emission of phosphorescence originating in B-5 is obtained.

Example 8

Evaluation of a device is performed in the same manner as in Example 1 except for using compound (79) in place of B-2 and using compound (1-103) in place of (1-10). It is confirmed that the emission of phosphorescence originating in compound (79) is obtained.

Example 9

Evaluation of a device is performed in the same manner as in Example 1 except for using compound B-7 in place of B-2. It is confirmed that the emission of phosphorescence originating in B-7 is obtained.

Example 10

Evaluation of a device is performed in the same manner as in Example 1 except for using compound B-6 in place of B-2. It is confirmed that the emission of phosphorescence originating in B-6 is obtained.

Example 11

Evaluation of a device is performed in the same manner as in Example 1 except for using compound (1-206) in place of (1-10). It is confirmed that the emission of phosphorescence originating in B-2 is obtained.

Example 12

Evaluation of a device is performed in the same manner as in Example 1 except for using compound (1-8) in place of (1-10). It is confirmed that the emission of phosphorescence originating in B-2 is obtained.

TABLE 1

Results of evaluation of devices prepared in Comparative Examples 1 to 3 and Examples 1 to 12

| Example No. | External Quantum Efficiency (relative value) | Half Life Time of Luminance (relative value) | Variation in Chromaticity at Half Life Time of Luminance (rate of change of CIE y value in relative value) | Used Compounds |
|---|---|---|---|---|
| Comparative Example 1 | 1.0 | 1.0 | 1.0 | B-1/(1-10) |
| Comparative Example 2 | 0.9 | 1.5 | 0.8 | B-2/mCP |
| Example 1 | 1.2 | 4.2 | 0.5 | B-2/(1-10) |
| Example 2 | 1.2 | 5.4 | 0.4 | B-2/(1-1) |
| Example 3 | 1.2 | 6.5 | 0.4 | B-3/(1-1) |
| Example 4 | 1.3 | 8.0 | 0.3 | B-3/(1-1) |
| Comparative Example 3 | 1.0 | 1.4 | 1.2 | B-4/mCP |
| Example 5 | 1.1 | 3.1 | 0.7 | B-2/(1-7) |
| Example 6 | 1.1 | 7.1 | 0.5 | B-4/(1-217) |
| Example 7 | 1.2 | 3.4 | 0.5 | B-5/(1-10) |
| Example 8 | 1.5 | 13.1 | 0.4 | (79)/(1-103) |
| Example 9 | 1.2 | 4.3 | 0.7 | B-7/(1-10) |
| Example 10 | 1.1 | 5.8 | 0.6 | B-6/(1-1) |
| Example 11 | 1.2 | 7.2 | 0.5 | B-2/(1-206) |
| Example 12 | 1.1 | 3.4 | 0.6 | B-2/(1-8) |

* The evaluation value in each example is a relative value to the evaluation value of Comparative Example 1 as the reference value.

Evaluation of Light-Emitting Device:

Each of the obtained light-emitting devices is driven at 20° C. by the application of constant electric current. Luminance is measured with a luminance meter BM-8 (trade name, manufactured by Topcon Co.). Emission spectrum is measured with an emission spectrum measuring system ELS1500, manufactured by Shimadzu Corporation). The half life time of luminance is found by measuring the time required to reach the half life of luminance from the initial luminance of 360 cd/m². CIE Y value is found from the emission spectrum measured at 20° C. with an emission spectrum measuring system (ELS1500, manufactured by Shimadzu Corporation), and the variation in chromaticity is computed from the CIE Y value. The light-emitting device is driven at 20° C. and luminance of 360 cd/m² by the application of constant current, and the external quantum efficiency is computed from the obtained emission spectrum and front luminance by a luminance conversion method.

In Example 1, the maximum wavelength of luminescence in emission of luminescence at 20° C. and 100 cd/m² is 490 nm. In Example 3, the maximum wavelength of luminescence in emission of luminescence at 20° C. and 100 cd/m² is 480 nm.

From the results in Table 1, it can be seen that the light-emitting devices in the invention are excellent in efficiency and durability, and little in chromaticity variation.

The same effects can be obtained with light-emitting devices using other compounds according to the invention.

It will be apparent to those skilled in the art that various modifications and variations can be made to the described embodiments of the invention without departing from the spirit or scope of the invention. Thus, it is intended that the invention cover all modifications and variations of this invention consistent with the scope of the appended claims and their equivalents.

The present application claims foreign priority based on Japanese Patent Application No. JP2006-318771 filed Nov. 27, 2006, the contents of which are incorporated herein by reference.

The invention claimed is:

1. An organic electroluminescent device comprising:
a pair of electrodes; and
at least one organic layer between the pair of electrodes, the at least one organic layer including a light-emitting layer,
wherein the at least one organic layer includes at least one layer containing an indole derivative represented by formula (12), and the light-emitting layer includes a platinum complex phosphorescent material having a tetradentate ligand:

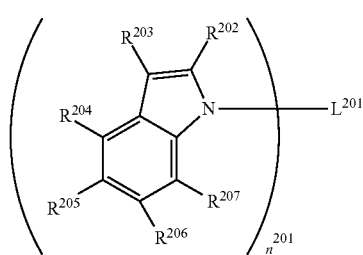

wherein $R^{202}$ and $R^{203}$ each independently represents a hydrogen atom or an alkyl group, $R^{204}$, $R^{205}$, $R^{206}$ and $R^{207}$ each represents a hydrogen atom, provided that $R^{202}$ and $R^{203}$ are not bonded to each other to form an aromatic condensed ring; $L^{201}$ represents a linking group having one of the following two structures which may have at least one substituent selected from the group consisting of an alkyl group and an aryl group and wherein * indicates a portion binding to the indole ring of the indole derivative:

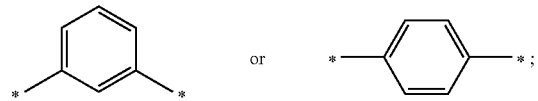

and $n^{201}$ represents 2,
wherein the platinum complex phosphorescent material is a compound represented by formula (2):

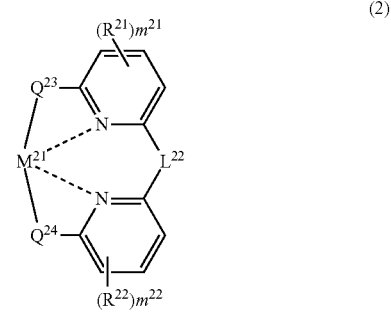

wherein $M^{21}$ represents a platinum ion; $Q^{23}$ and $Q^{24}$ each independently represents an atomic group to coordinate to $M^{21}$, wherein either $Q^{23}$ or $Q^{24}$ represents an aryl group substituted with an electron attractive group or a 5-membered nitrogen-containing heterocyclic group; $L^{22}$ represents a single bond, an alkylene group, an oxygen linking group, or a nitrogen linking group; $R^{21}$ and $R^{22}$ each independently represents a substituent; and $m^{21}$ and $m^{22}$ each represents 0,
wherein the aryl of said aryl group substituted with an electron attractive group is a phenyl group,
wherein the electron attractive group is a fluorine atom, a cyano group, a fluorine-substituted alkyl group, or a fluorine-substituted aryl group, and
wherein the 5-membered nitrogen-containing heterocyclic group is pyrrole, imidazole, pyrazole or triazole.

2. The organic electroluminescent device according to claim 1, wherein $L^{201}$ represents a linking group having an aryl group as a substituent.

3. The organic electroluminescent device according to claim 1, wherein $L^{201}$ represents a linking group having an alkyl group as a substituent.

4. The organic electroluminescent device according to claim 1, wherein $L^{201}$ represents a linking group having an aryl group and alkyl group as substituents.

5. The organic electroluminescent device according to claim 1, wherein $L^{201}$ represents a linking group having a methyl group as a substituent.

6. The organic electroluminescent according to claim 1, wherein the platinum complex phosphorescent material has a maximum emission wavelength of 500 nm or less.

7. The organic electroluminescent device according to claim 1, wherein the indole derivative represented by formula (12) is included the light-emitting layer.

8. The organic electroluminescent device according to claim 1, wherein the indole derivative represented by formula (12) is included in a layer contiguous to the light-emitting layer.

9. The organic electroluminescent device according to claim 1, wherein a layer contiguous to the light-emitting layer includes a carbazole derivative.

10. The organic electroluminescent device according to claim 1, wherein a layer contiguous to the light-emitting layer includes a metal complex.

11. The organic electroluminescent device according to claim 1, wherein the platinum complex phosphorescent material represented by formula (2) is compound (B-4):

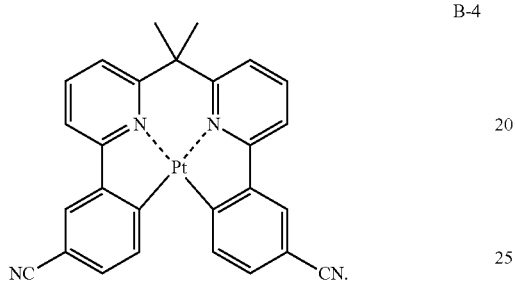

B-4

* * * * *